(12) United States Patent
Ohsawa

(10) Patent No.: US 8,076,676 B2
(45) Date of Patent: Dec. 13, 2011

(54) LIGHT-EMITTING ELEMENT, LIGHT-EMITTING DEVICE AND AN ELECTRONIC DEVICE WHICH INCLUDE TWO LAYERS INCLUDING THE SAME LIGHT-EMITTING ORGANIC COMPOUND

(75) Inventor: Nobuharu Ohsawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/686,612

(22) Filed: Jan. 13, 2010

(65) Prior Publication Data
US 2010/0171112 A1    Jul. 8, 2010

Related U.S. Application Data

(63) Continuation of application No. 11/807,267, filed on May 25, 2007, now Pat. No. 7,649,211.

(30) Foreign Application Priority Data

Jun. 1, 2006 (JP) ................................. 2006-154077
Jan. 23, 2007 (JP) ................................. 2007-012700

(51) Int. Cl.
| | |
|---|---|
| H01L 27/15 | (2006.01) |
| H01L 29/26 | (2006.01) |
| H01L 31/12 | (2006.01) |
| H01L 33/00 | (2006.01) |
| H01L 29/22 | (2006.01) |
| H01L 29/06 | (2006.01) |
| H01L 31/0328 | (2006.01) |
| H01L 31/0336 | (2006.01) |
| H01L 31/109 | (2006.01) |
| H01L 29/08 | (2006.01) |
| H01L 35/24 | (2006.01) |
| H01L 51/00 | (2006.01) |

(52) U.S. Cl. ................ 257/79; 257/13; 257/40; 257/94; 257/E33.001; 257/E33.054

(58) Field of Classification Search ................ 257/13, 257/40, 79, 94, E33.001, E33.054
See application file for complete search history.

(56) References Cited

U.S. PATENT DOCUMENTS
6,603,150 B2    8/2003 Liao et al.
(Continued)

FOREIGN PATENT DOCUMENTS
CN    1482691 A    3/2004
(Continued)

OTHER PUBLICATIONS

Goldsmith, C.R. et al, "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

(Continued)

Primary Examiner — Ida M Soward
(74) Attorney, Agent, or Firm — Husch Blackwell LLP

(57) ABSTRACT

The present invention provides a light-emitting element including an electron-transporting layer and a hole-transporting layer between a first electrode and a second electrode; and a first layer and a second layer between the electron-transporting layer and the hole-transporting layer, wherein the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, and a voltage is applied to the first electrode and the second electrode, so that both of the first organic compound and the second organic compound emit light.

22 Claims, 32 Drawing Sheets

U.S. PATENT DOCUMENTS

| | | | |
|---|---|---|---|
| 6,723,445 B2 * | 4/2004 | Li et al. | 428/490 |
| 6,991,859 B2 * | 1/2006 | Klubek et al. | 428/690 |
| 6,998,487 B2 | 2/2006 | Kim et al. | |
| 7,163,831 B2 | 1/2007 | Hasegawa et al. | |
| 7,169,482 B2 | 1/2007 | Aziz et al. | |
| 7,173,370 B2 | 2/2007 | Seo et al. | |
| 7,192,659 B2 | 3/2007 | Ricks et al. | |
| 7,196,360 B2 | 3/2007 | Seo et al. | |
| 7,268,484 B2 | 9/2007 | Nakamura | |
| 7,291,969 B2 | 11/2007 | Tsutsui | |
| 7,365,360 B2 | 4/2008 | Kang et al. | |
| 7,521,113 B2 * | 4/2009 | Lu et al. | 428/212 |
| 7,632,578 B2 * | 12/2009 | Lee et al. | 428/690 |
| 7,733,009 B2 * | 6/2010 | Kondakov et al. | 313/504 |
| 7,821,001 B2 | 10/2010 | Kang et al. | |
| 2002/0086180 A1 | 7/2002 | Seo et al. | |
| 2002/0093283 A1 | 7/2002 | Seo et al. | |
| 2002/0109136 A1 | 8/2002 | Seo et al. | |
| 2002/0113546 A1 | 8/2002 | Seo et al. | |
| 2002/0121860 A1 | 9/2002 | Seo et al. | |
| 2002/0139303 A1 | 10/2002 | Yamazaki et al. | |
| 2002/0155632 A1 | 10/2002 | Yamazaki et al. | |
| 2003/0010288 A1 | 1/2003 | Yamazaki et al. | |
| 2004/0018380 A1 | 1/2004 | Aziz et al. | |
| 2004/0154542 A1 | 8/2004 | Yamazaki et al. | |
| 2005/0110005 A1 * | 5/2005 | Forrest et al. | 257/40 |
| 2005/0179378 A1 | 8/2005 | Oooka et al. | |
| 2005/0221121 A1 | 10/2005 | Ishihara et al. | |
| 2005/0255334 A1 * | 11/2005 | Kang et al. | 428/690 |
| 2005/0260440 A1 | 11/2005 | Seo et al. | |
| 2005/0271899 A1 * | 12/2005 | Brown et al. | 428/690 |
| 2006/0024525 A1 * | 2/2006 | Jeong et al. | 428/690 |
| 2006/0029725 A1 * | 2/2006 | Kwong et al. | 427/66 |
| 2006/0032528 A1 * | 2/2006 | Wang | 136/263 |
| 2006/0088730 A1 * | 4/2006 | Begley et al. | 428/690 |
| 2006/0091794 A1 * | 5/2006 | Agostinelli et al. | 313/506 |
| 2006/0188745 A1 * | 8/2006 | Liao et al. | 428/690 |
| 2006/0210828 A1 | 9/2006 | Nakayama et al. | |
| 2006/0214553 A1 * | 9/2006 | Nagara et al. | 313/483 |
| 2006/0243967 A1 | 11/2006 | Nomura et al. | |
| 2006/0243970 A1 | 11/2006 | Seo et al. | |
| 2007/0001587 A1 * | 1/2007 | Hatwar et al. | 313/504 |
| 2007/0001588 A1 * | 1/2007 | Boroson et al. | 313/504 |
| 2007/0020483 A1 | 1/2007 | Park et al. | |
| 2007/0020484 A1 | 1/2007 | Kim et al. | |
| 2007/0046189 A1 * | 3/2007 | Hatwar et al. | 313/506 |
| 2007/0075631 A1 * | 4/2007 | Tung et al. | 313/504 |
| 2007/0077349 A1 * | 4/2007 | Newman et al. | 427/66 |
| 2007/0159083 A1 | 7/2007 | Matsuura et al. | |
| 2007/0216292 A1 | 9/2007 | Seo et al. | |
| 2007/0247061 A1 * | 10/2007 | Adamovich et al. | 313/504 |
| 2007/0252517 A1 * | 11/2007 | Owczarczyk et al. | 313/504 |
| 2007/0267968 A1 * | 11/2007 | Lecloux et al. | 313/503 |
| 2008/0006821 A1 | 1/2008 | Suzuki et al. | |
| 2008/0142794 A1 | 6/2008 | Shitagaki et al. | |
| 2008/0150420 A1 | 6/2008 | Tsutsui | |
| 2008/0231177 A1 | 9/2008 | Nomura et al. | |
| 2008/0261075 A1 | 10/2008 | Seo et al. | |
| 2009/0140634 A1 | 6/2009 | Nomura et al. | |
| 2009/0309093 A1 * | 12/2009 | Iwaki et al. | 257/40 |

FOREIGN PATENT DOCUMENTS

| | | |
|---|---|---|
| EP | 1 385 221 A2 | 1/2004 |
| EP | 1 388 904 A2 | 2/2004 |
| EP | 2 065 950 A2 | 2/2004 |
| EP | 1 718 122 A1 | 11/2006 |
| JP | 6-158038 | 6/1994 |
| JP | 2001-319779 | 11/2001 |
| JP | 2004-95546 | 3/2004 |
| JP | 2004-356033 | 12/2004 |
| JP | 2005-11734 | 1/2005 |
| JP | 2005-11735 | 1/2005 |
| JP | 2005-235403 | 9/2005 |
| JP | 2006-49057 | 2/2006 |
| WO | WO 2004/096946 A1 | 11/2004 |
| WO | WO 2005/079118 A1 | 8/2005 |
| WO | WO 2005/109542 A1 | 11/2005 |

OTHER PUBLICATIONS

Onishi, T. et al., "A Method of Measuring an Energy Level," *High Molecular EL Materials-Development of Light-Emitting High Molecular Compounds*, Kyoritsu Shuppan, Dec. 25, 2004, pp. 64-67 (with English translation, pp. 1-3).

International Search Report re application No. PCT/JP2007/060940, dated Aug. 21, 2007.

Written Opinion re application No. PCT/JP2007/060940, dated Aug. 21, 2007.

Office Action re Korean application No. KR 10-2009-7026023, dated Feb. 9, 2011 (with English translation).

Office Action re Chinese application No. CN 200780020298.0, dated May 25, 2011 (with English translation).

* cited by examiner

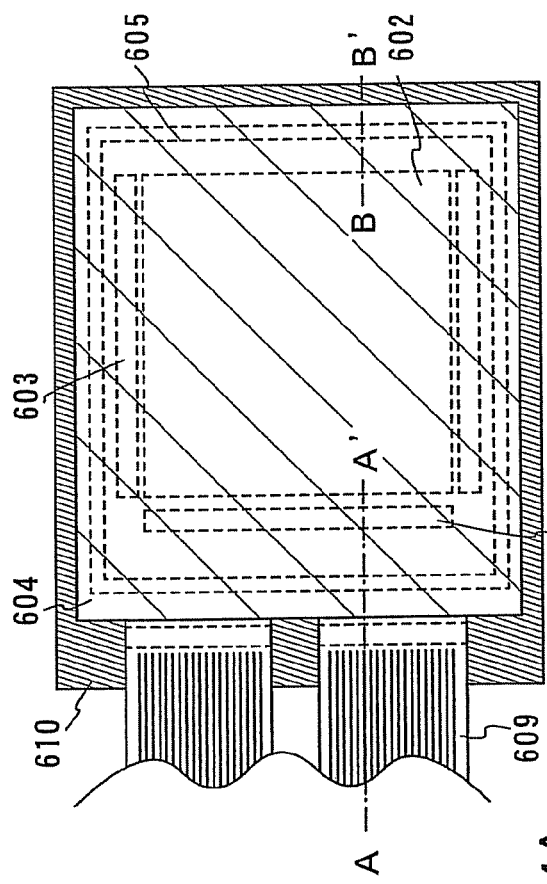
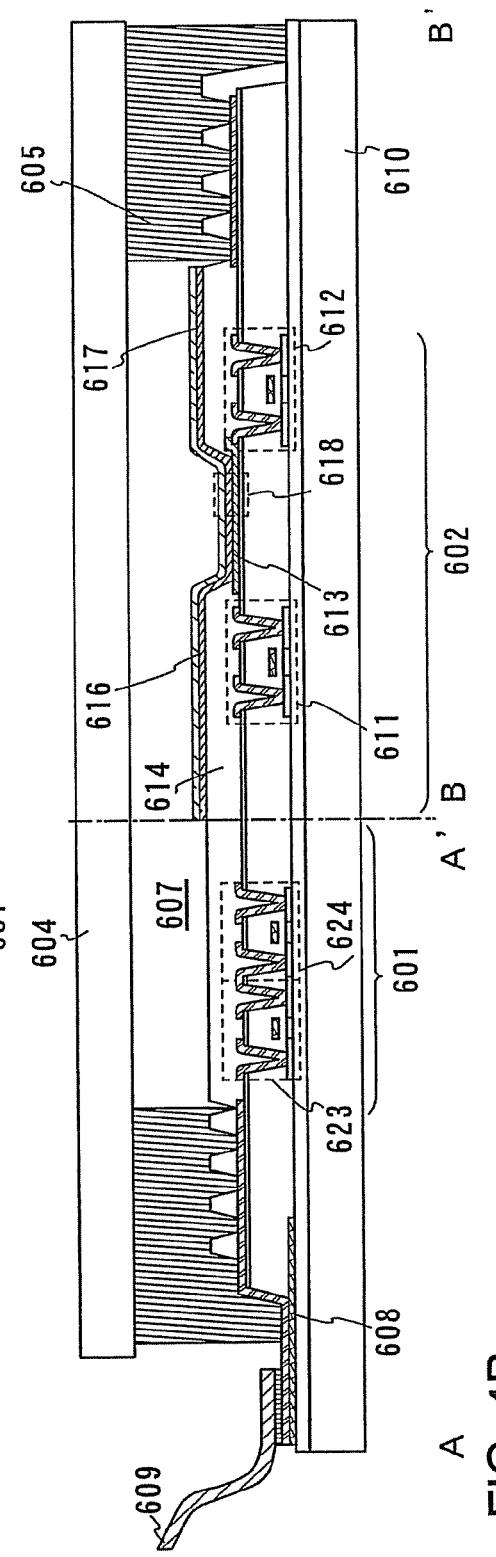
FIG. 4A
FIG. 4B

LIGHT-EMITTING ELEMENT, LIGHT-EMITTING DEVICE AND AN ELECTRONIC DEVICE WHICH INCLUDE TWO LAYERS INCLUDING THE SAME LIGHT-EMITTING ORGANIC COMPOUND

This application is a continuation of application Ser. No. 11/807,267 filed on May 25, 2007 now U.S. Pat. No. 7,649,211.

TECHNICAL FIELD

The present invention relates to current excitation type light-emitting elements. Further, the present invention relates to light-emitting devices and electronic devices having the light-emitting element.

BACKGROUND OF THE INVENTION

In recent years, research and development have been extensively conducted on light-emitting elements using electroluminescence. In a basic structure of such a light-emitting element, a substance having a light-emitting property is interposed between a pair of electrodes. By voltage application to this element, light emission can be obtained from the substance having a light-emitting property.

Since such a light-emitting element is of self-light-emitting type, it is considered that the light-emitting element has advantages over a liquid crystal display in that visibility of pixels is high, backlight is not required, and so on and is therefore suitable as flat panel display elements. In addition, other advantages of such a light-emitting element are that the element can be manufactured to be thin and lightweight and the response speed is very high.

Since the light-emitting element can be formed into a film shape, surface light emission can be easily obtained by forming a large-area element. This is a feature which is difficult to be obtained by point light sources typified by an incandescent lamp and an LED or linear light sources typified by a fluorescent lamp. Accordingly, the light-emitting element is extremely effective for use as a surface light source applicable to illumination and the like.

Light-emitting elements using electroluminescence are classified broadly according to whether they use an organic compound or an inorganic compound as a substance having a light-emitting property.

When an organic compound is used as a light-emitting substance, electrons and holes are injected into a layer including a light-emitting organic compound from a pair of electrodes by voltage application to a light-emitting element, so that a current flows therethrough. The electrons and holes (i.e., carriers) are recombined, and thus, the light-emitting organic compound is excited. The light-emitting organic compound returns to a ground state from the excited state, thereby emitting light. Based on this mechanism, such a light-emitting element is called current excitation type light-emitting element.

It is to be noted that the excited state generated by an organic compound can be a singlet excited state or a triplet excited state, and luminescence from the singlet excited state is referred to as fluorescence, and luminescence from the triplet excited state is referred to as phosphorescence.

In improving element characteristics of such a light-emitting element, there are a lot of problems which depend on a material used, and in order to solve the problems, improvement of an element structure, development of a material, and the like have been carried out.

For example, Reference 1 describes a light-emitting element in which a guest substance is dispersed in the whole organic function layer between electrodes to enhance the possibility of injection and recombination for electrons and holes. However, Reference 1 does not refer to a lifetime of the light-emitting element.

Such a light-emitting element including a light-emitting organic compound can be driven at lower voltage than a light-emitting element using an inorganic compound; however, such a light-emitting element including a light-emitting organic compound has a problem in that its lifetime is short. Thus, it is desirable that such a light-emitting element has a longer lifetime (Reference 1: Japanese Published Patent Application No. H 6-158038).

SUMMARY OF THE INVENTION

In view of the above problems, it is an object of the present invention to provide light-emitting elements having long lifetimes. Further, it is another object of the present invention to provide light-emitting elements and electronic devices having long lifetimes.

In accordance with the present invention, a substantial light-emitting region of a light-emitting layer in a light-emitting element is set in the vicinity of the center of the light-emitting layer. In other words, a light-emitting layer is constituted by combination of layers having different carrier transport properties so that the light-emitting region is set in the vicinity of the center of the light-emitting layer, instead of at the interface between the light-emitting layer and a hole-transporting layer or at the interface between the light-emitting layer and an electron-transporting layer.

Accordingly, an aspect of the present invention is a light-emitting element comprising an electron-transporting layer and a hole-transporting layer between a first electrode and a second electrode; and a first layer and a second layer between the electron-transporting layer and the hole-transporting layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising an electron-transporting layer and a hole-transporting layer between a first electrode and a second electrode; and a first layer and a second layer between the electron-transporting layer and the hole-transporting layer. In the light-emitting element, the first layer includes a first organic compound and an organic compound having a hole-transporting property, the highest occupied molecular orbital level (HOMO level) of the organic compound having the hole-transporting property is greater than or equal to −6.0 eV and less than or equal to −5.0 eV, and the lowest unoccupied molecular orbital level (LUMO level) of the organic compound having the hole-transporting property is greater than or equal to −3.0 eV and less than or equal to −2.0 eV, the second layer includes a second organic compound and an organic compound having an electron-transporting property, the highest occupied molecular orbital level (HOMO level) of the organic compound having the electron-transporting property is greater than or equal to −6.0 eV and less than or equal to −5.0 eV, and the lowest unoccupied molecular orbital level (LUMO level) of the organic compound having the electron-transporting property is greater than or equal to −3.0 eV and less than or equal to −2.0 eV, the first layer is formed in contact with the first electrode side of the second layer, the first organic compound and the second organic compound are the same compound, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising an electron-transporting layer and a hole-transporting layer between a first electrode and a second electrode; and a first layer and a second layer between the electron-transporting layer and the hole-transporting layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, the organic compound having the hole-transporting property and the compound having the electron-transporting property comprises at least one of a tricyclic condensed aromatic compound, a tetracyclic condensed aromatic compound, a pentacyclic condensed aromatic compound, and a hexacyclic condensed aromatic compounds, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising an electron-transporting layer and a hole-transporting layer between a first electrode and a second electrode; and a first layer and a second layer between the electron-transporting layer and the hole-transporting layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, the organic compound having the hole-transporting property and the compound having the electron-transporting property are reversible to an oxidative reaction and a reductive reaction, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising an electron-transporting layer and a hole-transporting layer between a first electrode and a second electrode; and a first layer and a second layer between the electron-transporting layer and the hole-transporting layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, the organic compound having the hole-transporting property and the compound having the electron-transporting property are anthracene derivatives, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising an electron-transporting layer and a hole-transporting layer between a first electrode and a second electrode; and a first layer and a second layer between the electron-transporting layer and the hole-transporting layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, a difference between the highest occupied molecular orbital level of the organic compound having a hole-transporting property and the highest occupied molecular orbital level of the organic compound having an electron-transporting property is 0.3 eV or less, a difference between the lowest unoccupied molecular orbital level of the organic compound having a hole-transporting property and the lowest unoccupied molecular orbital level of the organic compound having an electron-transporting property is 0.3 eV or less, a voltage is applied to the first electrode and the second electrode such that a potential of the first electrode is higher than that of the second electrode, so that both of the first organic compound included in the first layer and the second organic compound included in the second layer emit light.

More preferably in the above structure, the difference between the highest occupied molecular orbital level of the organic compound having a hole-transporting property and the highest occupied molecular orbital level of the organic compound having an electron-transporting property is 0.1 eV or less, a difference between the lowest unoccupied molecular orbital level of the organic compound having a hole-transporting property and the lowest unoccupied molecular orbital level of the organic compound having an electron-transporting property is 0.1 eV or less.

Another aspect of the present invention is a light-emitting element comprising a light-emitting layer between a first electrode and a second electrode, and the light-emitting layer includes a first layer and a second layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising a light-emitting layer between a first electrode and a second electrode, and the light-emitting layer includes a first layer and a second layer. In the light-emitting element, the first layer includes a first organic compound and an organic compound having a hole-transporting property, the highest occupied molecular orbital level (HOMO level) of the organic compound having the hole-transporting property is greater than or equal to −6.0 eV and less than or equal to −5.0 eV, and the lowest unoccupied molecular orbital level (LUMO level) of the organic compound having the hole-transporting property is greater than or equal to −3.0 eV and less than or equal to −2.0 eV, the second layer includes a second organic compound and an organic compound having an electron-transporting property, the highest occupied molecular orbital level (HOMO level) of the organic compound having the electron-transporting property is greater than or equal to −6.0 eV and less than or equal to −5.0 eV, and the lowest unoccupied molecular orbital level (LUMO level) of the organic compound having the electron-transporting property is greater than or equal to −3.0 eV and less than or equal to −2.0 eV, the first layer is formed in contact with the first electrode side of the second layer, the first organic compound and the second organic compound are the same compound, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising a light-emitting layer between a first electrode and a second electrode, and the light-emitting layer includes a first layer and a second layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, the organic compound having the hole-transporting property and the compound having the electron-transporting property comprises at least one of a tricyclic condensed aromatic compound, a tetracyclic condensed aromatic compound, a pentacyclic condensed aromatic compound, and a hexacyclic condensed aromatic compounds, a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising a light-emitting layer between a first electrode and a second electrode, and the light-emitting layer includes a first layer and a second layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, the organic compound having the hole-transporting property and the compound having the electron-transporting property are reversible to an oxidative reaction and a reductive reaction, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising a light-emitting layer between a first electrode and a second electrode, and the light-emitting layer includes a first layer and a second layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, the organic compound having the hole-transporting property and the compound having the electron-transporting property are anthracene derivatives, and a voltage is applied to the first electrode and the second electrode such that a potential of the first electrode is higher than that of the second electrode, so that both of the first organic compound included in the first layer and the second organic compound included in the second layer emit light.

Another aspect of the present invention is a light-emitting element comprising a light-emitting layer between a first electrode and a second electrode, and the light-emitting layer includes a first layer and a second layer. In the light-emitting element, the first layer includes a first organic compound and an organic compound having a hole-transporting property, the second layer includes a second organic compound and an organic compound having an electron-transporting property, the first layer is formed in contact with the first electrode side of the second layer, the first organic compound and the second organic compound are the same compound, a difference between the highest occupied molecular orbital level of the organic compound having a hole-transporting property and the highest occupied molecular orbital level of the organic compound having an electron-transporting property is 0.3 eV or less, a difference between the lowest unoccupied molecular orbital level of the organic compound having a hole-transporting property and the lowest unoccupied molecular orbital level of the organic compound having an electron-transporting property is 0.3 eV or less, and a voltage is applied to the first electrode and the second electrode such that a potential of the first electrode is higher than that of the second electrode, so that both of the first organic compound included in the first layer and the second organic compound included in the second layer emit light.

More preferably in the above structure, the difference between the highest occupied molecular orbital level of the organic compound having a hole-transporting property and the highest occupied molecular orbital level of the organic compound having an electron-transporting property is 0.1 eV or less, a difference between the lowest unoccupied molecular orbital level of the organic compound having a hole-transporting property and the lowest unoccupied molecular orbital level of the organic compound having an electron-transporting property is 0.1 eV or less.

In addition, the light-emitting device in this specification includes image display devices, light-emitting devices, and light sources (including illumination devices). Further, the light-emitting device includes all of the following modules: modules in which a connector such as an FPC (Flexible Printed Circuit), a TAB (Tape Automated Bonding) tape, or a TCP (Tape Carrier Package) is attached to a panel in which a light-emitting element is formed; modules having a TAB tape or a TCP provided with a printed wiring board at the end thereof; and modules having an IC (Integrated Circuit) directly mounted on a light-emitting device by a COG (Chip On Glass) method.

An electronic device using the light-emitting element of the present invention in its display portion is also included in the category of the present invention. Therefore, the electronic device of the present invention is equipped with the aforementioned light-emitting element and a controller for controlling light emission of the light-emitting element in its display portion.

In a light-emitting element of the present invention, a light-emitting region is formed in the vicinity of the center of a light-emitting layer, instead of at the interface between the light-emitting layer and a hole-transporting layer or at the interface between the light-emitting layer and an electron-transporting layer, and thus, the light-emitting element deteriorates less due to the light-emitting region adjacent to the hole-transporting layer or the electron-transporting layer. In other words, the change with time of luminance is small and a light-emitting element having a long lifetime can be provided.

Further, a light-emitting element of the present invention is applied to light-emitting devices and electronic devices, so that the light-emitting devices and the electronic devices can have longer lifetimes.

BRIEF DESCRIPTION OF DRAWINGS

In the accompanying drawings:

FIGS. 4A and 4B illustrate a light-emitting device according to the present invention;

DETAILED DESCRIPTION OF PRESENTLY PREFERRED EMBODIMENTS

Figure 1A:
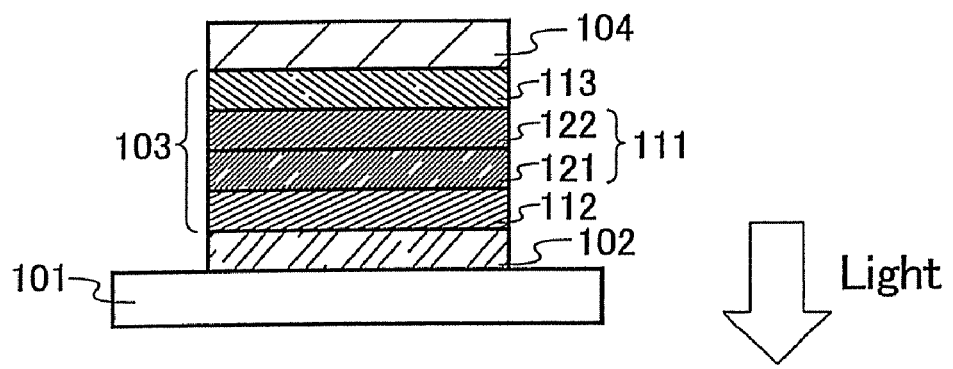
FIGS. 1A to 1C illustrate light-emitting elements according to the present invention.

Hereinafter, Embodiment Modes of the present invention will be described with reference to the drawings. Note that the present invention can be carried out in many different modes. It is easily understood by those skilled in the art that modes and details disclosed herein can be modified in various ways without departing from the spirit and the scope of the present invention. Therefore, it is noted that the present invention should not be interpreted as being limited to the description of the embodiment modes given below.

It is to be noted that, in this specification, the word "composite" means not only a state in which two materials are simply mixed but also a state in which a plurality of materials are mixed and charges are transferred between the materials.

Embodiment Mode 1

One mode of a light-emitting element of the present invention will be described hereinafter with reference to FIG. 1A.

The light-emitting element of the present invention includes a plurality of layers between a pair of electrodes. In this specification, the plurality of layers formed between the pair of electrodes is collectively referred to as an EL layer.

In this embodiment mode, the light-emitting element includes a first electrode 102, a second electrode 104 and an EL layer 103 formed between the first electrode 102 and the second electrode 104. In addition, in this embodiment mode, the first electrode 102 serves as an anode and the second electrode 104 serves as a cathode. In other words, when a voltage is applied to the first electrode 102 and the second electrode 104 such that a potential of the first electrode 102 is higher than that of the second electrode 104, light emission can be obtained. Such a case will be described below.

The substrate 101 is used as a support of the light-emitting element. As the substrate 101, glass, plastic or the like can be used, for example. Note that materials other than glass or plastic can be used as long as they can function as a support of a light-emitting element.

The first electrode 102 is preferably formed of a metal, an alloy, an electrically conductive compound, a mixture of these, or the like each having a high work function (specifically, a work function of 4.0 eV or higher is preferable). Specifically, for example, indium oxide-tin oxide (ITO: Indium Tin Oxide), indium oxide-tin oxide including silicon or silicon oxide, indium oxide-zinc oxide (IZO: Indium Zinc Oxide), indium oxide including tungsten oxide and zinc oxide (IWZO), and the like are given. Films of these conductive metal oxides are usually formed by sputtering; however, a sol-gel method or the like may also be used. For example, indium oxide-zinc oxide (IZO) can be formed by a sputtering method using a target in which 1 to 20 wt % of zinc oxide with respect to indium oxide is included. Moreover, indium oxide (IWZO) including tungsten oxide and zinc oxide can be formed by a sputtering method using a target in which 0.5 to 5 wt % of tungsten oxide and 0.1 to 1 wt % of zinc oxide with respect to indium oxide are included. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride (TiN)), or the like can be used.

There is no particular limitation on the stacked structure of the EL layer 103, and layers formed of substances with high electron-transporting properties, a substance with a high hole-transporting property, a substance with a high electron-injecting property, a substance with a high hole-injecting property, a bipolar substance (a substance with high electron-transporting and hole-transporting properties) and/or the like may be combined as appropriate. For example, a hole-injecting layer, a hole-transporting layer, a hole-blocking layer, a light-emitting layer, an electron-transporting layer, an electron-injecting layer, and/or the like can be combined as appropriate to constitute the EL layer 103. Specific materials to form each of the layers will be given below. FIGS. 1A to 1C show examples in which the first electrode 102, a hole-transporting layer 112, a light-emitting layer 111, an electron-transporting layer 113, and the second electrode 104 are sequentially stacked.

A hole-injecting layer may be formed between the first electrode 102 and the hole-transporting layer 112. The hole-injecting layer is a layer having a high hole-injecting property. As the material with a high hole-injecting property, molybdenum oxide ($MoO_x$), vanadium oxide ($VO_x$), ruthenium oxide ($RuO_x$), tungsten oxide ($WO_x$), manganese oxide ($MnO_x$), or the like may be used. In addition, it is possible to use a phthalocyanine-based compound such as phthalocyanine ($H_2Pc$) or copper phthalocyanine (CuPc), a high molecule such as Poly(3,4-ethylenedioxythiophene)/poly(styrenesulfonate) (PEDOT/PSS), or the like to form the hole-injecting layer.

Alternatively, as the hole-injecting layer, a composite material of a substance with a high hole-transporting property containing an acceptor substance can be used. It is to be noted that, by using such a substance with a high hole-transporting property containing an acceptor substance, a material used to form an electrode may be selected regardless of its work function. In other words, besides a material with a high work function, a material with a low work function may also be used as the first electrode 102. As the acceptor substance, 7,7,8,8-tetracyano-2,3,5,6-tetrafluoroquinodimethane (abbreviation: $F_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable since their electron-accepting property is high. Among these, molybdenum oxide is especially preferable since it is stable in the air and its hygroscopic property is low and is easily treated.

As the organic compound for the composite material, various compounds such as an aromatic amine compound, carbazole derivatives, aromatic hydrocarbon, and a high molecular compound (such as oligomer, dendrimer, or polymer) can be used. The organic compound used for the composite material is preferably an organic compound having a high hole-transporting property. Specifically, a substance having a hole mobility of $10^{-6}$ $cm^2$/Vs or higher is preferably used. However, other substances than the above described materials may also be used as long as the substances have higher hole-transporting properties than electron-transporting properties. The organic compounds which can be used for the composite material will be specifically shown below.

For example, the followings can be given as the aromatic amine compound: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); 4,4'-bis[N-(3-methylphenyl)-N-phenylamino]biphenyl (abbreviation: DNTPD); 1,3,5-tris[N-(4-diphenylaminophenyl)-N-phenylamino]benzene (abbreviation: DPA3B); and the like.

As carbazole derivatives which can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Moreover, as carbazole derivatives which can be used for the composite material, 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthracenyl)phenyl]-9H-carbazole (abbreviation: CzPA); 1,4-bis[4-(N-carbazolyl)phenyl]-2,3,5,6-tetraphenylbenzene; or the like can also be used.

As aromatic hydrocarbon which can be used for the composite material, the following can be given for example: 2-tert-butyl-9,10-di(2-naphthyl)anthracene (abbreviation: t-BuDNA); 2-tert-butyl-9,10-di(1-naphthyl)anthracene, 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. In particular, the aromatic hydrocarbon which has a hole mobility of $1 \times 10^{-6}$ cm$^2$/Vs or higher and which has 14 to 42 carbon atoms is particularly preferable.

The aromatic hydrocarbon which can be used for the composite material may have a vinyl skeleton. As the aromatic hydrocarbon having a vinyl group, the following are given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

Moreover, a high molecular compound such as poly(N-vinylcarbazole) (abbreviation: PVK) or poly(4-vinyltriphenylamine) (abbreviation: PVTPA) can also be used.

The hole-transporting layer 112 is a layer that contains a substance with a high hole-transporting property. As the substance with a high hole-transporting property, for example, an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), or 4,4'-bis[N-(spiro-9,9'-bifluoren-2-yl)-N-phenylamino]biphenyl (abbreviation: BSPB) can be used. These substances mainly are substances each having a hole mobility of $10^{-6}$ cm$^2$/Vs or higher. However, other materials than these substances may also be used as long as the materials have hole-transporting properties higher than the electron-transporting properties. The layer containing a substance with a high hole-transporting property is not limited to a single layer, and two or more layers containing the aforementioned substances may be stacked.

The light-emitting layer 111 is a layer including a substance having a high light-emitting property. In the light-emitting element of the present invention, the light-emitting layer includes a first layer 121 and a second layer 122. The first layer 121 includes a first organic compound and an organic compound having a hole-transporting property, and the second layer 122 includes the first organic compound and an organic compound having an electron-transporting property. The first layer is provided on the first electrode side of the second layer, in other words, on the anode side of the second layer.

The first organic compound is a substance having a high light-emitting property, and various materials can be used. Specifically, materials can be used, such as N,N'-dimethylquinacridone (abbreviation: DMQd), N,N'-diphenylquinacridone (abbreviation: DPQd), coumarin 6, coumarin 545T, (2-{2-[4-(dimethylamino)phenyl]ethenyl}-6-methyl-4H-pyran-4-ylidene)propanedinitrile (abbreviation: DCM1), {2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), {2-(1,1-dimethylethyl)-6-[2-(2,3,6,7-tetrahydro-1,1,7,7-tetramethyl-1H,5H-benzo[ij]quinolizin-9-yl)ethenyl]-4H-pyran-4-ylidene}propanedinitrile (abbreviation: DCJTB), 5,12-diphenyltetracene (abbreviation: DPT), 4-(9H-carbazol-9-yl)-4'-(10-phenyl-9-anthryl)triphenylamine (abbreviation: YGAPA), 4,4'-(2-tent-butylanthracen-9,10-diyl)bis{N-[4-(9H-carbazol-9-yl)phenyl]-N-phenylaniline} (abbreviation: YGABPA), N,9-diphenyl-N-[4-(10-phenyl-9-anthryl)phenyl]-9H-carbazol-3-amine (abbreviation: PCAPA), N,N''-(2-tert-butylanthracene-9,10-diyldi-4,1-phenylene)bis[N,N',N'-triphenyl-1,4-phen ylenediamine] (abbreviation: DPABPA), N,N'-bis[4-(9H-carbazol-9-yl)phenyl]-N,N'-diphenylstilbene-4,4'diamine (abbreviation: YGA2S), N-[4-(9H-carbazol-9-yl)phenyl]-N-phenylstilbene-4-amine (abbreviation: YGAS), N,N'-diphenyl-N,N'-bis(9-phenylcarbazol-3-yl)stilbene-4,4'-diamine (abbreviation: PCA2S), 4,4'-bis(2,2-diphenylvinyl)biphenyl (abbreviation: DPVBi), 2,5,8,11-tetra(tert-butyl)perylene (abbreviation: TBP), perylene, rubrene, 1,3,6,8-tetraphenylpyrene or the like.

The organic compound having a hole-transporting property included in the first layer 121 is a substance which exhibits a hole-transporting property higher than an electron-transporting property. The organic compound having an electron-transporting property included in the second layer 122 is a substance which exhibits an electron-transporting property higher than a hole-transporting property.

Figure 1B:
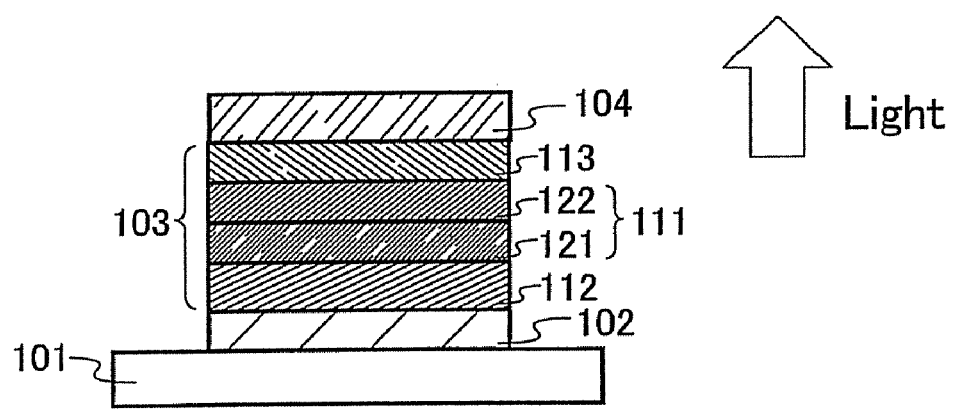
Figure 1C:
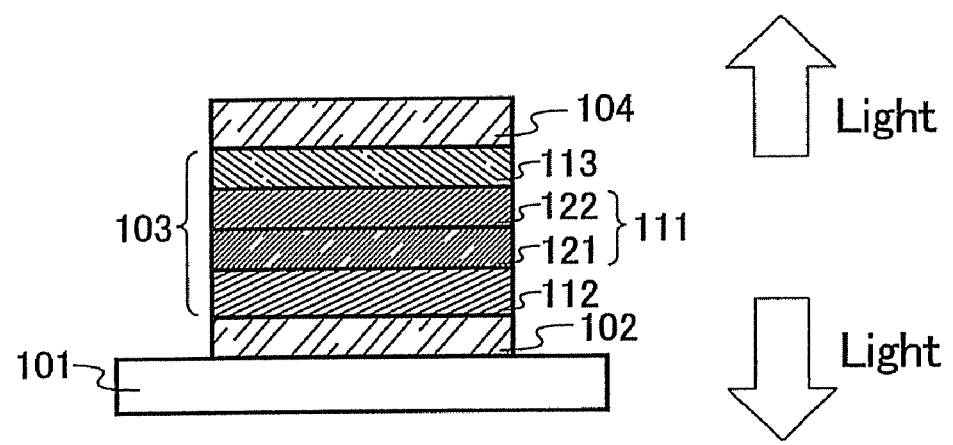
Figure 20:
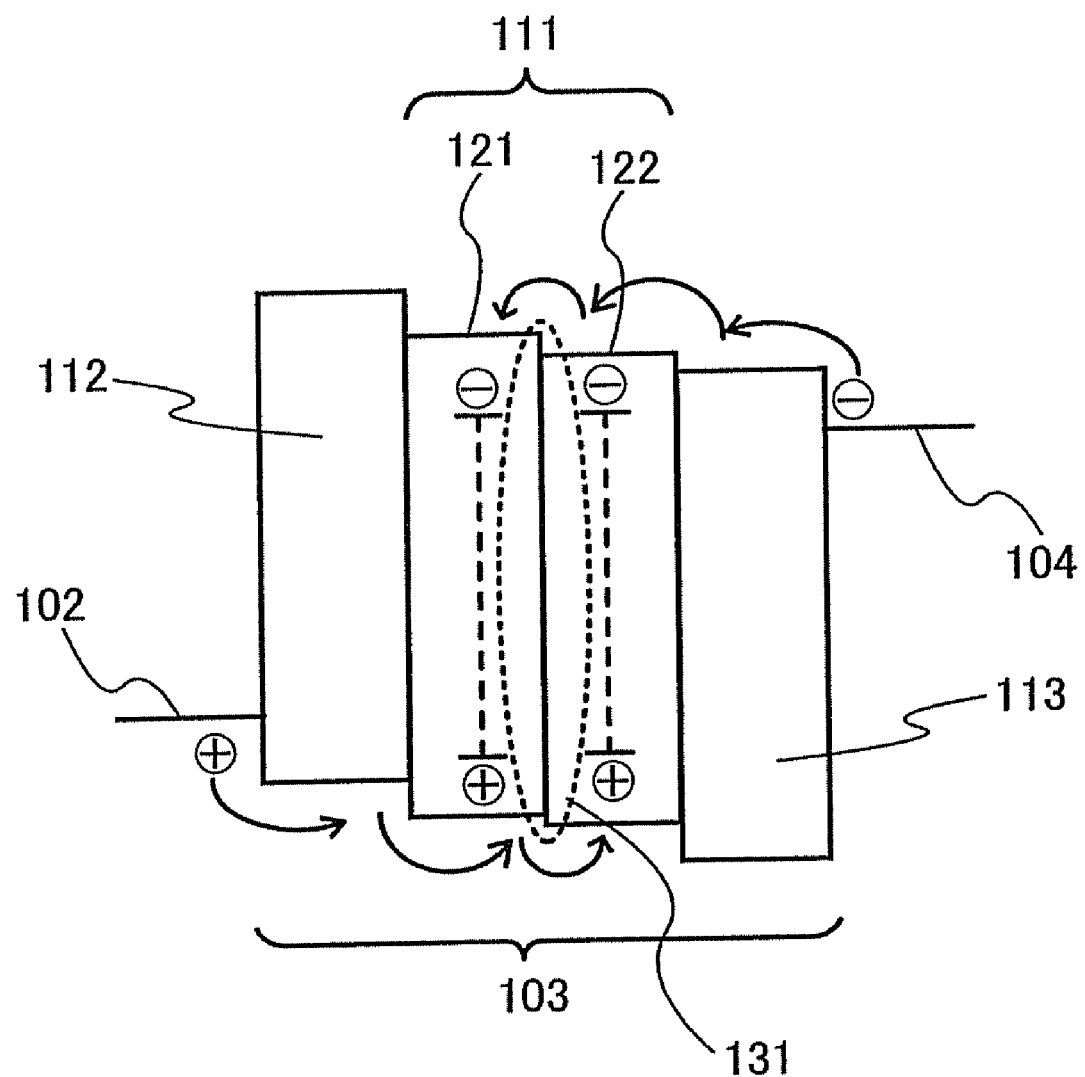
FIG. 20 is a view illustrating energy level of a light-emitting element according to the preset invention.

Here, FIG. 20 shows an example of a band diagram of a light-emitting element of the present invention illustrated in FIGS. 1A and 1B. In FIG. 20, holes injected from the first electrode 102 are injected into the first layer 121. The holes injected into the first layer 121 are transported through the first layer 121 and further, into the second layer 122. Here, the organic compound having an electron-transporting property included in the second layer 122 is a substance which exhibits an electron-transporting property higher than a hole-transporting property, and thus, the holes injected into the second layer 122 are difficult to move. Consequently, a large number of holes are present near the interface between the first layer 121 and the second layer 122. In addition, occurrence of a phenomenon in which holes and electrons reach the electron-transporting layer 113 without being recombined can be suppressed.

On the other hand, electrons injected from the second electrode 104 are injected into the second layer 122. The electrons injected into the second layer 122 are transported through the second layer 122, and further, injected into the first layer 121. Here, the organic compound having a hole-transporting property included in the first layer 121 is a substance which exhibits a hole-transporting property higher than an electron-transporting property, and thus, the electrons injected into the first layer 121 are difficult to move. Consequently, a large number of electrons are present near the interface between the first layer 121 and the second layer 122. In addition, occurrence of a phenomenon in which holes and electrons reach the hole-transporting layer 112 without being recombined can be suppressed.

As described above, a large number of holes and electrons are present in a region 131 in the vicinity of the interface between the first layer 121 and the second layer 122, so that the degree of recombination can be increased in the region 131 in the vicinity of the interface. In other words, the light-emitting region is formed in the vicinity of the center of the light-emitting layer 111. As a result, occurrence of a phenomenon in which holes reaches the electron-transporting layer 113 and electrons reach the hole-transporting layer 112 without being recombined can be suppressed, so that reduction in the degree of recombination can be prevented. Thus, the reduction of carrier balance with time can be prevented, which leads to increase of reliability.

In order that holes and electrons are injected into the first layer 121, it is necessary that the organic compound having a hole-transporting property is an organic compound which can be oxidized and reduced. Thus, the highest occupied molecular orbital level (HOMO level) of the organic compound having a hole-transporting property is preferably greater than or equal to −6.0 eV and less than or equal to −5.0 eV. In addition, the lowest unoccupied molecular orbital level (LUMO level) of the organic compound having a hole-transporting property is preferably greater than or equal to −3.0 eV and less than or equal to −2.0 eV.

Similarly, in order that holes and electrons are injected into the second layer 122, it is necessary that the organic compound having an electron-transporting property is an organic compound which can be oxidized and reduced. Thus, the highest occupied molecular orbital level (HOMO level) of the organic compound having an electron-transporting property is preferably greater than or equal to −6.0 eV and less than or equal to −5.0 eV. In addition, the lowest unoccupied molecular orbital level (LUMO level) of the organic compound having an electron-transporting property is preferably greater than or equal to −3.0 eV and less than or equal to −2.0 eV.

As the measuring method of the highest occupied molecular orbital level (HOMO level) and the lowest unoccupied molecular orbital level (LUMO level), there is a calculation method using the cyclic voltammetry (CV) measurement. Alternatively, the ionization potential in a thin film state is measured with a photoelectron spectroscopy device and the HOMO level can be calculated. Then, the LUMO level can be calculated from the result and an energy gap obtained from an absorption spectrum in a thin film state.

As such an organic compound which can be oxidized and reduced, a tricyclic condensed aromatic compound, a tetracyclic condensed aromatic compound, a pentacyclic condensed aromatic compound, and a hexacyclic condensed aromatic compounds are given. Specifically, an anthracene derivative, a phenanthrene derivative, a pyrene derivative, a chrysene derivative, a dibenzo[g,p]chrysene derivative, and the like are given. For example, as a compound having a hole-transporting property which can be used for the first layer, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), 6,12-dimethoxy-5,11-diphenylchrysene, N,N,N',N',N'',N'',N''',N'''-octaphenyldibenzo[g,p]chrysene-2,7,10,15-tetraamine, and the like are given. As an compound having an electron-transporting property which can be used for the second layer, 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilben-3,3'-diyl)diphenanthrene (abbreviation: DPNS), 9,9'-(stilben-4,4'-diyl)diphenanthrene (abbreviation: DPNS2), 3,3',3''-(benzene-1,3,5-triyl)tripyrene (abbreviation: TPB3) and the like can be given.

As described above with reference to FIG. 20, the light-emitting element of the present invention is structured such that holes are injected into the second layer 122 from the first layer 121. Thus, the difference between the highest occupied molecular orbital level (HOMO level) of the organic compound having a hole-transporting property and the highest occupied molecular orbital level (HOMO level) of the organic compound having an electron-transporting property is preferably small. Further, the light-emitting element of the present invention is structured such that electrons are injected into the first layer 121 from the second layer 122. Thus, the difference between the lowest unoccupied molecular orbital level (LUMO level) of the organic compound having a hole-transporting property and the lowest unoccupied molecular orbital level (LUMO level) of the organic compound having an electron-transporting property is preferably small. If the difference between the highest occupied molecular orbital level (HOMO level) of the organic compound having a hole-transporting property and the highest occupied molecular orbital level (HOMO level) of the organic compound having an electron-transporting property is large, the light-emitting region comes to the first layer side or the second layer side. Similarly, if the difference between the LUMO level of the organic compound having a hole-transporting property and the LUMO level of the organic compound having an electron-transporting property is large, the light-emitting region comes to the first layer side or the second layer side. Accordingly, the difference between the highest occupied molecular orbital level (HOMO level) of the organic compound having a hole-transporting property and the highest occupied molecular orbital level (HOMO level) of the organic compound having an electron-transporting property is preferably 0.3 eV or less, more preferably, 0.1 eV. In addition, the difference between the LUMO level of the organic compound having a hole-transporting property and the LUMO level of the organic compound having an electron-transporting property is 0.3 eV or less, more preferably, 0.1 eV or less.

Further, the light-emitting element provides light emission by recombination of electrons and holes, and thus, the organic compound used in the light-emitting layer 111 is preferably stable even when an oxidative reaction and a reductive reaction are repeated. In other words, the organic compound is preferably reversible to the oxidative reaction and the reductive reaction. In particular, the organic compound having a hole-transporting property and the organic compound having an electron-transporting property are preferably stable even when an oxidative reaction and a reductive reaction are repeated. It can be confirmed by employing the cyclic voltammetry (CV) measurement whether the organic compounds are stable or not when an oxidative reaction and a reductive reaction are repeated.

Specifically, when an oxidative reaction and a reductive reaction are repeated in the CV measurement, changes of an oxidation peak potential (Epa) in the oxidative reaction of the organic compound or a reduction peak potential (Epc) in the reductive reaction are observed, thereby confirming whether the organic compounds are stable or not when the oxidative reaction and the reductive reaction are repeated. The number of repetition of the oxidative reaction and the reductive reaction is preferably large; however, when the reactions are repeated 50 to 200 times, substantial stability can be estimated. In the measurement like this, in the organic compound having a hole-transporting property and the organic compound having an electron-transporting property used for the light-emitting layer 111, the changes in the intensity of the oxidation peak potential and the intensity of the reduction peak potential are preferably smaller than 50%, more preferably less than 30%. In other words, for example, the peak intensity of 50% or higher is preferably kept even when the oxidation peak potential decreases. More preferably, a peak intensity of 70% or higher is kept. In addition, the changes of the values of the oxidation peak potential and the reduction peak potential are preferably 0.05 V or lower. More preferably, the changes are 0.02 V or lower.

As an organic compound which can be stable even when an oxidative reaction and a reductive reaction are repeated, in other words, an organic compound which is reversible to the oxidative reaction and the reductive reaction, an anthracene derivative, is preferable, in particular. As an example of the organic compound having a hole-transporting property included in the first layer 121, specifically, 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9- anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), and the like can be given. As an example of the organic compound having an electron-transporting property included in the second layer 122, specifically, 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), and the like are given. Such anthracene derivatives are preferable, since such anthracene derivatives are stable even when the oxidative reaction and the reductive reaction are repeated.

The same substance is used for the substance having a high light-emitting property included in the first layer and the substance having a high light-emitting property included in the second layer, thereby making it possible to emit light in the vicinity of the center of the light-emitting layer. On the other hand, if different substances having high light-emitting properties are used for the first layer and the second layer, there is a possibility that light is emitted from only one of the first layer and the second layer. When light is emitted from only one layer, it is difficult to emit light in the vicinity of the center of the light-emitting layer. Further, when the first layer and the second layer are formed using different substances having high light-emitting properties, the substances having high light-emitting properties both emit light, and thus, light emission having an excellent color purity cannot be obtained. In addition, there is a possibility that the color of the light emission is changed. Therefore, the substance having a light-emitting property included in the first layer and the substance having a light-emitting property included in the second layer are preferably the same.

The materials of the first layer and the second layer which serve as a light-emitting layer can be selected and combined as appropriate in view of the above perspective.

The electron-transporting layer 113 is a layer that contains a substance with a high electron-transporting property. For example, a layer containing a metal complex having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]-quinolinato)beryllium (abbreviation: BeBq$_2$), or bis(2-methyl-8-quinolinolato)(4-phenylphenolato)aluminum (abbreviation: BAlq), or the like can be used. Alternatively, a metal complex having an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), or the like can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenyl)-1)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The materials mentioned here mainly are materials each having an electron mobility of $10^{-6}$ cm$^2$/Vs or higher. The electron-transporting layer may be formed of other materials than those described above as long as the materials have electron-transporting properties higher than hole-transporting properties. Furthermore, the electron-transporting layer is not limited to a single layer, and two or more layers made of the aforementioned substances may be stacked.

In addition, an electron-injecting layer which is a layer including a high electron-injecting property may be provided between the first electron-transporting layer 113 and the second electrode 104. As the electron-injecting layer, an alkali metal, an alkaline earth metal, or a compound thereof such as lithium fluoride (LiF), cesium fluoride (CsF), or calcium fluoride (CaF$_2$) may be used. For example, a layer of a material having an electron-transporting property containing an alkali metal, an alkaline earth metal, or a compound thereof, such as Alq which contains magnesium (Mg), may be used. By using a layer of a substance having an electron-transporting property containing an alkali metal or an alkaline earth metal as the electron-injecting layer, electron injection from the second electrode 104 is performed efficiently, which is preferable.

The second electrode 104 can be formed of a metal, an alloy, an electrically conductive compound, or a mixture of these, having a low work function (specifically, a work function of 3.8 eV or lower is preferable). As a typical example of such a cathode material, an element belonging to Group 1 or 2 in the periodic table, i.e., an alkali metal such as lithium (Li) or cesium (Cs), or an alkaline earth metal such as magnesium (Mg), calcium (Ca), or strontium (Sr); an alloy containing any of these (such as MgAg or AlLi); a rare earth metal such as europium (Er) or ytterbium (Yb); an alloy containing such a rare earth metal; or the like can be used. However, when an electron-injecting layer is provided between the second electrode 104 and the electron-transporting layer, the second electrode 104 can be formed of various conductive materials such as Al, Ag, ITO, or indium tin oxide including silicon or silicon oxide regardless of its work function.

As a formation method of the EL layer 103, various methods can be employed, and either a wet method or a dry method can be used. For example, a vacuum evaporation method, an ink-jet method, a spin coating method or the like may be used. A different formation method may be employed for each electrode or each layer.

In the light-emitting element of the present invention having the above structure, a current flows due to a potential difference between the first electrode 102 and the second electrode 104 and holes and electrons are recombined in the EL layer 103 so that light is emitted. More specifically, in the light-emitting layer 111 in the EL layer 103, a light-emitting region is formed in the vicinity of the center of the first layer 121 and the second layer 122.

The emitted light is extracted out through one or both of the first electrode 102 and the second electrode 104. Accordingly, one or both of the first electrode 102 and the second electrode 104 is/are an electrode having a light transmitting property. When only the first electrode 102 is an electrode having a light transmitting property, light is extracted from the substrate side through the first electrode 102 as illustrated in FIG. 1A. In addition, when only the second electrode 104 is an electrode having a light transmitting property, light is extracted from the opposite side to the substrate side through the second electrode 104 as illustrated in FIG. 1B. Further, when the first electrode 102 and the second electrode 104 are both electrodes having light transmitting properties, light is extracted to opposite sides, i.e., the substrate side and the opposite side, through the first electrode 102 and the second electrode 104 as illustrated in FIG. 1C.

The structure of layers provided between the first electrode 102 and the second electrode 104 are not limited to the above example. Besides the above described structures, any structure can be employed, in which a light-emitting region for recombination of holes and electrons is provided in a portion apart from the first electrode 102 and the second electrode 104, and a light-emitting region includes the first layer 121 and the second layer 122 such that light extinction caused by adjacency of the light-emitting region and a metal can be prevented.

In other words, there are no particular limitations on the stacked structure of the layers, and layers formed of a substance with a high electron-transporting property, a material with a high hole-transporting property, a substance with a high electron-injecting property, a substance with a high hole-injecting property, a bipolar substance (a material with high electron-transporting and hole-transporting properties), a hole block material and the like may be freely combined.

Figure 2:
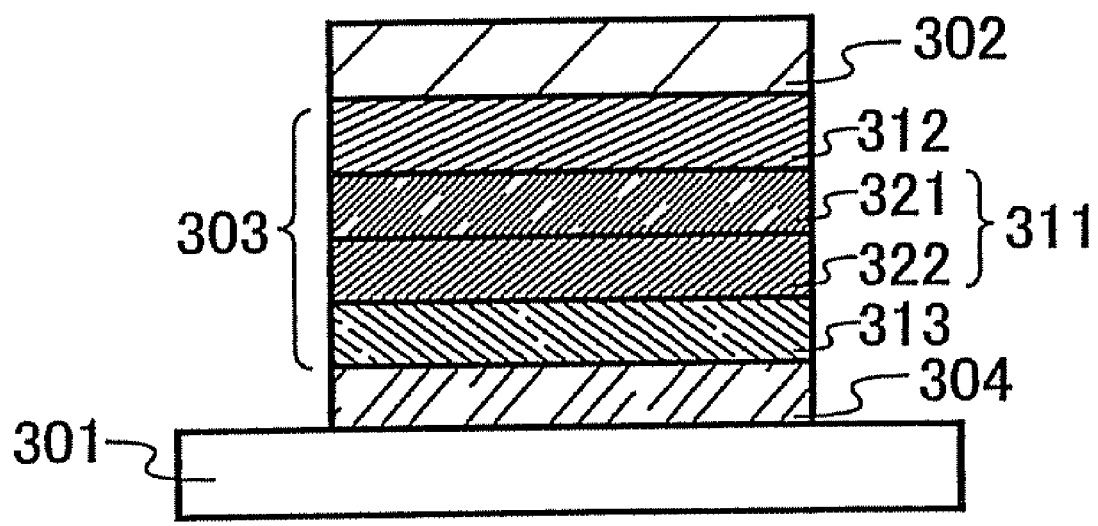
FIG. 2 illustrates a light-emitting element according to the present invention.

The light-emitting element illustrated in FIG. 2 has a structure in which a second electrode 304 serving as a cathode, an EL layer 303, and a first electrode 302 serving as an anode are sequentially stacked over a substrate 301. The EL layer 303 includes a hole-transporting layer 312, a light-emitting layer 311, and an electron-transporting layer 313, and the light-emitting layer 311 includes a first layer 321 and a second layer 322. The first layer 321 is provided on the first electrode side, not on the second layer 322 side, and the first electrode serves as an anode.

In this embodiment mode, the light-emitting element is formed over a substrate made of glass, plastic or the like. A plurality of such light-emitting elements are formed over one substrate, thereby forming a passive light-emitting device can be manufactured. In addition, a thin film transistor (TFT) may be formed over a substrate of glass, plastic, or the like and a light-emitting element may be manufactured over an electrode that is electrically connected to the TFT. In this way, an active matrix light-emitting device in which the TFT controls the drive of the light-emitting element can be manufactured. It is to be noted that there is no particular limitation on the structure of the TFT. A staggered TFT or an inversely staggered TFT may be employed. In addition, a driver circuit formed over a TFT substrate may be formed using N-channel and P-channel TFTs, or using either N-channel or P-channel TFTs. There is no particular limitation on crystallinity of a semiconductor film used for the TFT, either. An amorphous semiconductor film may be used, or a crystalline semiconductor film may be used.

In the light-emitting element of the present invention, a light-emitting region is formed in the vicinity of the center of the light-emitting layer, without being formed at the interface between the light-emitting layer and the hole-transporting layer or at the interface between the light-emitting layer and the electron-transporting layer. Thus, there are almost no influences which would be caused when the light-emitting region is adjacent to the hole-transporting layer or the electron-transporting layer. Therefore, a light-emitting element having a longer lifetime which deteriorates less, can be obtained. In addition, the light-emitting layer of the light-emitting element in the present invention is formed using a compound which is stable even when an oxidative reaction and a reductive reaction are repeated, and thus, is difficult to deteriorate even when light emission by recombination of electrons and holes is repeated. Accordingly, a light-emitting element having a longer lifetime can be obtained.

Note that this embodiment mode can be freely combined with the other embodiment modes and examples.

Embodiment Mode 2

Embodiment Mode 2 will describe a mode of a light-emitting element in which a plurality of light-emitting units in accordance with the present invention are stacked (hereinafter, also referred to as a stacked type light-emitting element) with reference to FIG. 3. This light-emitting element is a light-emitting element including a plurality of light-emitting units between a first electrode and a second electrode. As the light-emitting units, a structure similar to that of the EL layer shown in Embodiment Mode 1 can be used. In other words, the light-emitting element shown in Embodiment Mode 1 is a light-emitting element having one light-emitting unit, and Embodiment Mode 2 will describe a light-emitting element having a plurality of light-emitting units.

Figure 3:
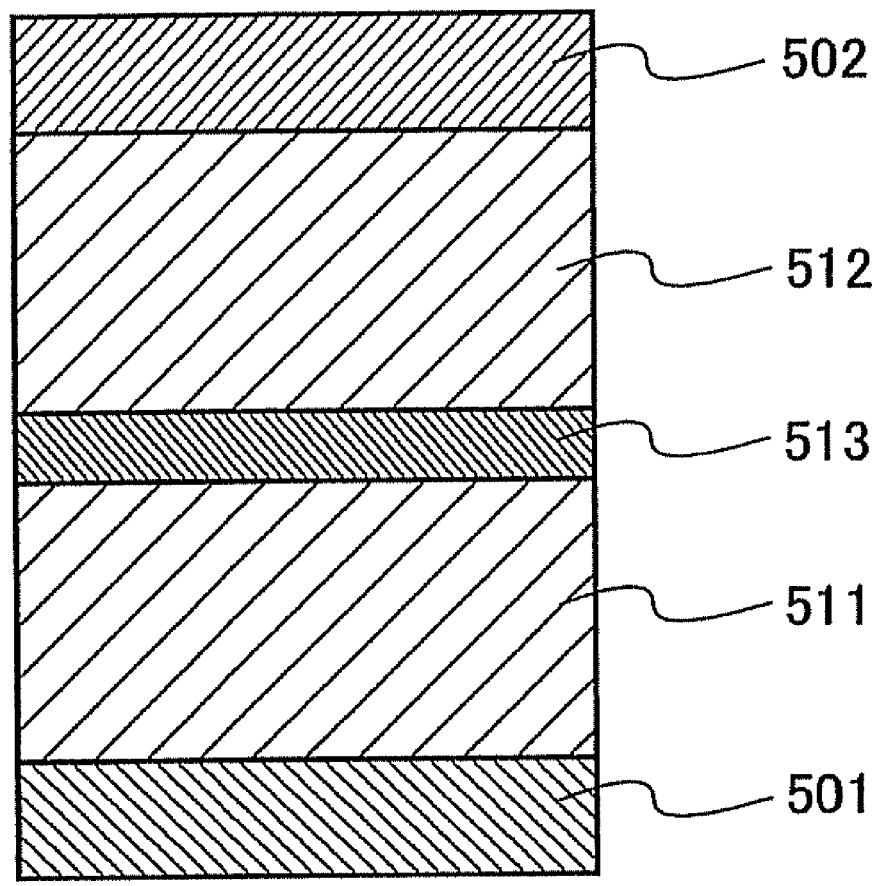
FIG. 3 illustrates a light-emitting element according to the present invention.

In FIG. 3, a first light-emitting unit 511 and a second light-emitting unit 512 are stacked between a first electrode 501 and a second electrode 502. To the first electrode 501 and the second electrode 502, similar electrodes to those shown in Embodiment Mode 1 can be applied. The first light-emitting unit 511 and the second light-emitting unit 512 may have the same structure or different structures, and as the structures, a similar structure to that shown in Embodiment Mode 1 can be employed.

A charge generation layer 513 includes a composite material of an organic compound and a metal oxide. The composite material of an organic compound and a metal oxide is the composite material shown in Embodiment Mode 1, and includes an organic compound and a metal oxide such as vanadium oxide, molybdenum oxide or tungsten oxide. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transporting property and has a hole mobility of $10^{-6}$ cm$^2$/Vs or higher. However, other substances than the materials described above may also be used as long as the substances have hole-transporting properties higher than the electron-transporting properties. The composite material of the organic compound and the metal oxide can achieve low-voltage driving and low-current driving because of the superior carrier-injecting property and carrier-transporting property.

Note that the charge generation layer 513 may be formed by combination of a composite material of the organic compound and the metal oxide with another material. For example, a layer containing a composite material of the organic compound and the metal oxide may be combined with a layer containing a compound of a substance selected from substances with an electron-donating property and a compound with a high electron-transporting property. Moreover, a layer containing a composite material of the organic compound and the metal oxide may be combined with a transparent conductive film.

In any case, it is acceptable as long as the charge generation layer 513 interposed between the first light-emitting unit 511 and the second light-emitting unit 512 injects electrons to one of these light-emitting units and holes to the other when voltage is applied to the first electrode 501 and the second electrode 502.

Although this embodiment mode describes the light-emitting element having two light-emitting units, the present invention can be similarly applied to a light-emitting element in which three or more light-emitting units are stacked. When the charge generation layer is provided between the pair of electrodes so as to partition the plural light-emitting units like the light-emitting element of this embodiment mode, the element can have long lifetime with high luminance while keeping low current density. When the light-emitting element is applied for illumination, voltage drop due to resistance of an electrode material can be reduced, thereby achieving homogeneous light emission in a large area. Moreover, a light-emitting device of low power consumption, which can be driven at low voltage, can be achieved.

The light-emitting units emit light having different colors from each other, thereby obtaining light emission of a desired color in the whole light-emitting element. For example, in a light-emitting element having two light-emitting units, the emission colors of the first light-emitting unit and the second light-emitting unit are made complementary, so that the light-emitting element which emits white light as the whole element can be obtained. Note that the word "complementary" means color relationship in which an achromatic color is obtained when colors are mixed. In other words, when light obtained from substances which emit complementary colors are mixed, white emission can be obtained. In addition, the same can be applied to a light-emitting element having three light-emitting units. For example, when the first light-emitting unit emits red light, the second light-emitting unit emits green light and the third light-emitting unit emits blue light, white light can be emitted from the whole light-emitting element.

Note that this embodiment mode can be freely combined with the other embodiment modes and examples.

Embodiment Mode 3

Embodiment Mode 3 will describe a light-emitting device having a light-emitting element of the present invention.

This embodiment mode will describe a light-emitting device having a light-emitting element of the present invention in a pixel portion, with reference to FIGS. 4A and 4B. FIG. 4A is a top view illustrating a light-emitting device while FIG. 4B is a cross-sectional view along lines A-A' and B-B' of FIG. 4A. A reference numeral 601 shown with a dotted line denotes a driver circuit portion (source side driver circuit); 602, a pixel portion; and, a driver circuit portion (gate side driver circuit). Moreover, a reference numeral 604 denotes a sealing substrate; 605, a sealing material; and 607, a space surrounded by the sealing material 605.

A leading wire 608 is to transmit a signal to be inputted to the source side driver circuit 601 and the gate side driver circuit 603, and receive a video signal, a clock signal, a start signal, a reset signal, and the like from an FPC (Flexible Printed Circuit) 609, which serves as an external input terminal. Although only the FPC is shown here, this FPC may be provided with a printed wiring board (PWB). The light-emitting device in this specification not only includes a light-emitting device itself but also a state where the light-emitting device has an FPC or a PWB attached thereto.

Next, a cross-sectional structure is described with reference to FIG. 4B. Over an element substrate 610 are formed the driver circuit portion and the pixel portion. Here, the source side driver circuit 601, which is the driver circuit portion, and one pixel in the pixel portion 602 are shown.

In the source side driver circuit 601, a CMOS circuit in which an n-channel TFT 623 and a p-channel TFT 624 are combined is formed. Such a driver circuit may be formed by using various circuits such as a CMOS circuit, a PMOS circuit, or an NMOS circuit. Although this embodiment mode illustrates a driver-integrated type where the driver circuit is formed over the substrate, the present invention is not restricted to this, and the driver circuit may be formed outside the substrate, not over the substrate.

The pixel portion 602 is formed by a plurality of pixels each including a switching TFT 611, a current control TFT 612, and a first electrode 613 electrically connected to a drain of the current control TFT 612. An insulator 614 is formed so as to cover an end portion of the first electrode 613. Here, the insulator 614 is formed by using a positive photosensitive acrylic resin film.

In order to improve coverage, an upper end portion or a lower end portion of the insulator 614 is formed so as to have a curved surface with curvature. For example, in the case of using a positive photosensitive acrylic for the insulator 614, only the upper end portion of the insulator 614 preferably has a curved surface with curvature (a radius of curvature of 0.2 to 3 μm). As the insulator 614, either a negative type which becomes insoluble in etchant by irradiation with light or a positive type which becomes soluble in etchant by irradiation with light can be used.

Over the first electrode 613, an EL layer 616 and a second electrode 617 are formed. Here, the first electrode 613 functioning as an anode can be formed with various metals, alloys, electrically conductive compounds, or mixture thereof. If the first electrode is used as an anode, it is preferable to use, among those materials, a material having a high work function (work function of 4.0 eV or higher), or the like. For example, a single layer of indium tin oxide containing silicon, indium zinc oxide (IZO) in which zinc oxide (ZnO) is mixed by 2 to 20 wt % into indium oxide, a titanium nitride film, a chromium film, a tungsten film, a Zn film, a Pt film, or the like can be used. Moreover, a multilayer including a film containing titanium nitride and a film containing aluminum as its main component; a three-layer structure including a titanium nitride film, a film containing aluminum as its main component, and a titanium nitride film; or the like can be used. The multilayer structure achieves to have low wiring resistance, favorable ohmic contact, and a function as an anode.

The EL layer 616 is formed by various methods such as an evaporation method using an evaporation mask, an inkjet method, a spin coating method, or the like. The EL layer 616 has the light-emitting layer described in Embodiment Mode 1 or Embodiment Mode 2. As another material that constitutes a part of the EL layer 616, a low molecular material, a medium molecular material (including oligomer and dendrimer), or a high molecular material may be used. As the material for the EL layer, not only an organic compound but also an inorganic compound may be used.

As the material for the second electrode 617, various types of metals, alloys, electrically conductive compounds, mixtures of these, or the like can be used. Among them, a metal, alloy, electrically conductive compound, mixture of these, or the like each having a low work function (work function of 3.8 eV or lower) is preferable. As an example, an element belonging to Group 1 or Group 2 in the periodic table, i.e., an alkali metal such as lithium (Li) or cesium (Cs), an alkaline earth metal such as magnesium (Mg), calcium (Ca), or strontium (Sr), or an alloy containing any of these (such as Mg:Ag or Al:Li); an the like can be given. In the case where light generated in the EL layer 616 is transmitted through the second electrode 617, the second electrode 617 is preferably formed by using a multilayer of a metal thin film whose thickness is made thin, and a transparent conductive film (indium tin oxide (ITO), indium tin oxide including silicon or silicon oxide, indium zinc oxide (IZO), indium oxide containing tungsten oxide and zinc oxide (IWZO), or the like).

When the sealing substrate 604 and the element substrate 610 are attached to each other by the sealing material 605, the light-emitting element 618 is provided in the space 607 surrounded by the element substrate 610, the sealing substrate 604, and the sealing material 605. The space 607 may be filled with filler, and may be filled with an inert gas (such as nitrogen or argon), the sealing material 605, or the like.

An epoxy-based resin is preferable for the sealing material 605. The material preferably allows as little moisture and oxygen as possible to penetrate. As a material for the sealing substrate 604, a plastic substrate made of FRP (Fiberglass-Reinforced Plastics), PVF (polyvinyl fluoride), polyester, acrylic, or the like can be used besides a glass substrate or a quartz substrate.

In this way, the light-emitting device having the light-emitting element of the present invention can be obtained.

The light-emitting device of the present invention has the light-emitting element shown in Embodiment Mode 1 or Embodiment Mode 2. Thus, the light-emitting device can have a long lifetime.

Figure 5:
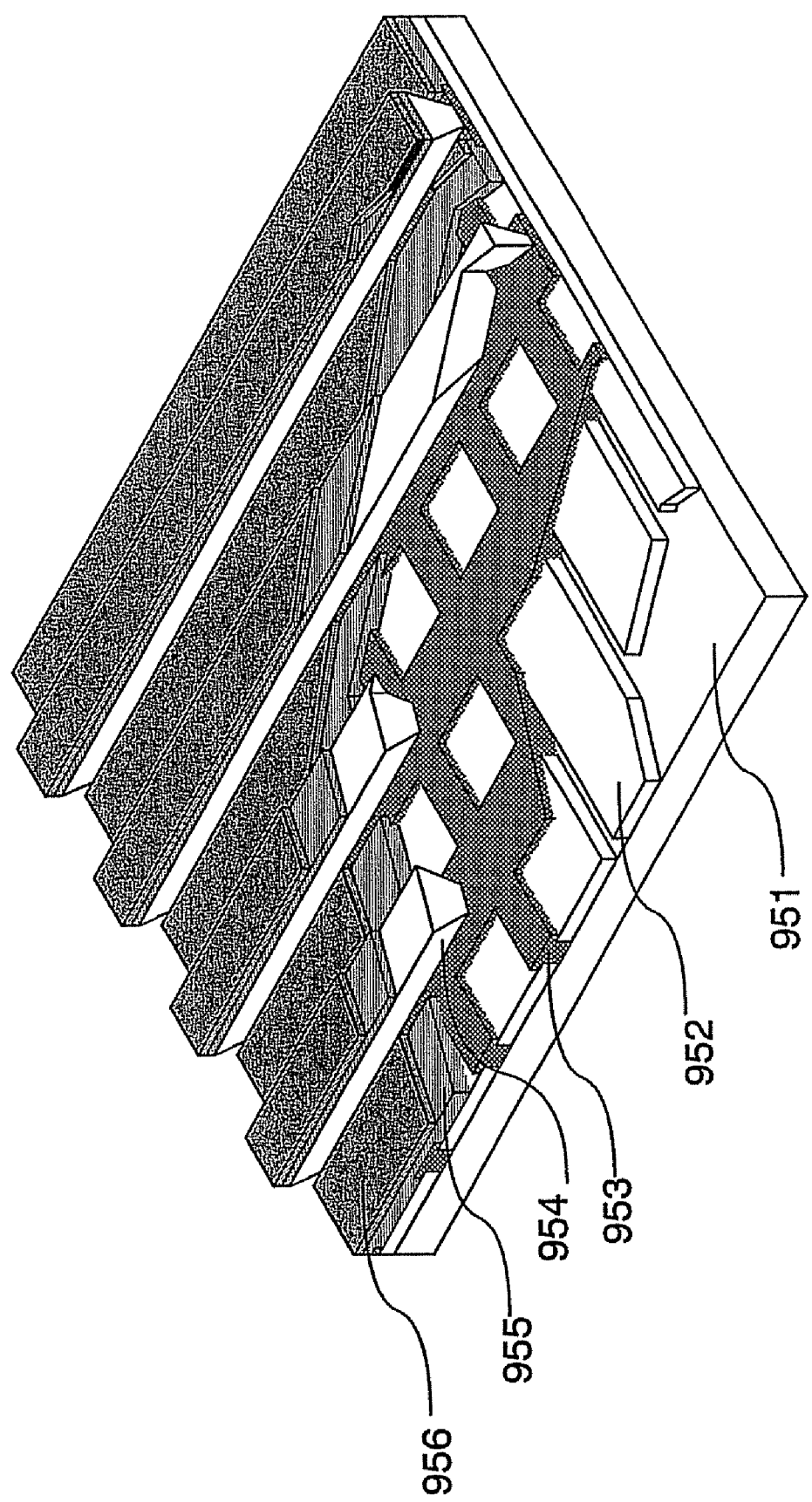
FIG. 5 illustrates a light-emitting device according to the preset invention.

Although this embodiment mode has described the active matrix type light-emitting device in which the driving of the light-emitting element is controlled by a transistor, the light-emitting device may be of a passive type in which the light-emitting element is driven without particularly providing the element for driving, such as the transistor. FIG. 5 is a perspective view of a passive type light-emitting device manufactured by applying the present invention. In FIG. 5, an EL layer 955 is provided between an electrode 952 and an electrode 956 over a substrate 951. An end portion of the electrode 952 is covered with an insulating layer 953. Then, over the insulating layer 953 is provided a partition layer 954. A side wall of the partition layer 954 has such a gradient that the distance between one side wall and the other side wall becomes shorter as approaching the substrate surface. That is to say, a cross section of the partition layer 954 in a short-side direction is trapezoid-like, in which a bottom side (a side in a similar direction to a surface direction of the insulating layer 953, which is in contact with the insulating layer 953) is shorter than an upper side (a side in a similar direction to the surface direction of the insulating layer 953, which is not in contact with the insulating layer 953). In this way, by providing the partition layer 954, a problem of defects in a light-emitting element due to electrostatic and the like can be prevented. Also, a passive type light-emitting device having a long lifetime can be obtained by including a light-emitting element of the present invention that has a long lifetime.

Embodiment Mode 4

Embodiment Mode 4 will describe electronic devices of the present invention, which include the light-emitting device described in Embodiment Mode 3 as a part thereof. The electronic devices of the present invention each have the light-emitting element described in Embodiment Mode 1 or Embodiment Mode 2, and a display portion having a long lifetime.

As the electronic device manufactured by using the light-emitting device of the present invention, cameras such as video cameras or digital cameras, goggle-type displays, navigation systems, audio reproducing devices (such as car audio components or an audio components), computers, game machines, mobile information terminals (mobile computers, cellular phones, mobile game machines, or electronic books), image reproducing devices equipped with a recording medium (specifically, devices equipped with a display device for reproducing a recording medium such as digital versatile disk (DVD) and displaying the image), and the like are given. Specific examples of these electronic devices are shown in FIGS. 6A to 6D.

Figure 6A:
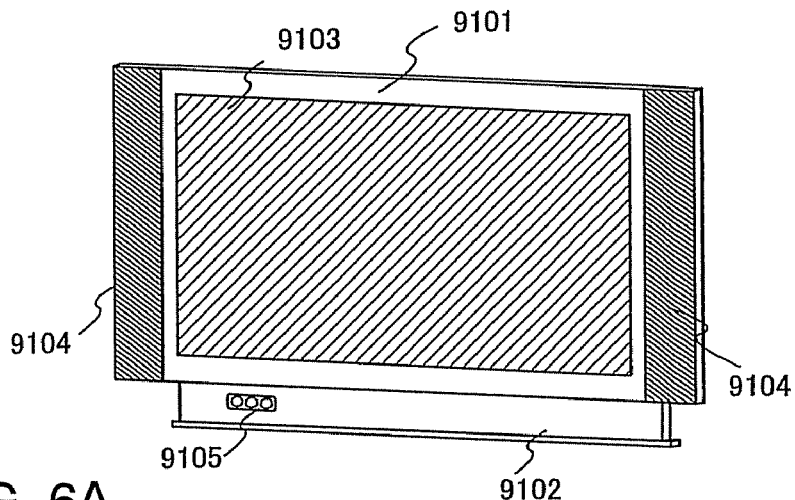
FIGS. 6A to 6D illustrates electronic devices according to the present invention.

FIG. 6A shows a television device according to the present invention, which includes a housing 9101, a support 9102, a display portion 9103, a speaker portion 9104, a video input terminal 9105, and the like. In this television device, the display portion 9103 is formed by arranging similar light-emitting elements to those described in Embodiment Modes 1 and 2 in a matrix form. The light-emitting elements have an advantage of long lifetime. Since the display portion formed using the light-emitting element also has the similar advantage, this television device has a long lifetime. In other words, the television device which can stand long use can be provided.

Figure 6B:
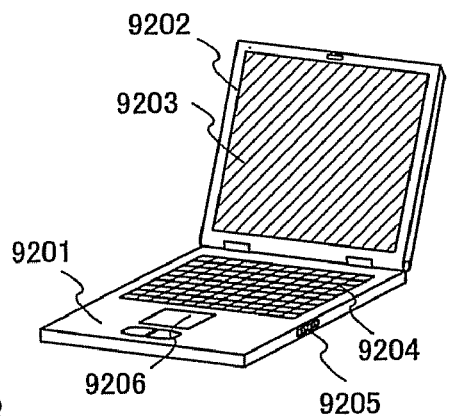

FIG. 6B shows a computer according to the present invention, which includes a main body 9201, a housing 9202, a display portion 9203, a keyboard 9204, an external connection port 9205, a pointing device 9206, and the like. In this computer, the display portion 9203 is formed by arranging similar light-emitting elements to those described in Embodiment Modes 1 and 2 in a matrix form. The light-emitting elements have an advantage of long lifetime. Since the display portion formed using the light-emitting element also has the similar advantage, this computer has a long lifetime. In other words, the computer which can stand long use can be provided.

Figure 6C:
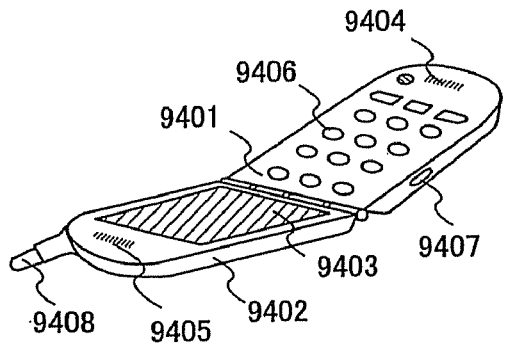

FIG. 6C shows a cellular phone according to the present invention, which includes a main body 9401, a housing 9402, a display portion 9403, an audio input portion 9404, an audio output portion 9405, an operation key 9406, an external connection port 9407, an antenna 9408, and the like. This display portion 9403 is formed by arranging similar light-emitting elements to those described in Embodiment Modes 1 and 2 in a matrix form. The light-emitting elements have an advantage of long lifetime. Since the display portion 9403 formed using the light-emitting element also has the similar advantage, this cellular phone has a long lifetime. In other words, the cellular phone which can stand long use can be provided.

Figure 6D:
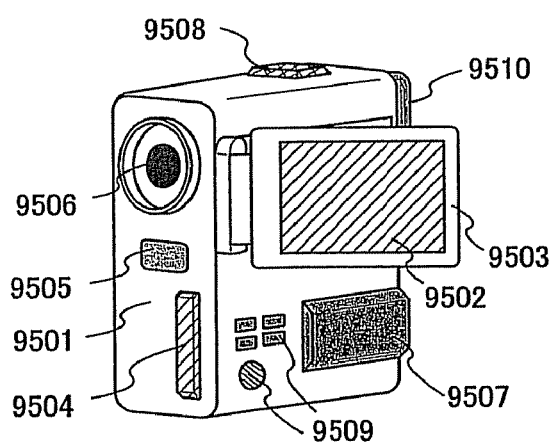

FIG. 6D shows a camera according to the present invention, which includes a main body 9501, a display portion 9502, a housing 9503, an external connection port 9504, a remote control receiving portion 9505, an image receiving portion 9506, a battery 9507, an audio input portion 9508, an operation key 9509, an eyepiece portion 9510, and the like. In this camera, the display portion 9502 is formed by arranging similar light-emitting elements to those described in Embodiment Modes 1 and 2 in a matrix form. The light-emitting elements have an advantage of long lifetime. Since the display portion 9502 formed using the light-emitting element also has the similar advantage, this camera has a long lifetime. In other words, the camera which can stand long use can be provided.

As thus described, application range of the light-emitting device of the present invention is quite wide, and this light-emitting device can be applied to electronic devices of every field. By using the light-emitting device of the present invention, an electronic device having a display portion having a long lifetime which can stand long use can be provided.

Moreover, the light-emitting device of the present invention can be used as an illumination device. An example of using the light-emitting element of the present invention as an illumination device will be described with reference to FIG. 7.

Figure 7:
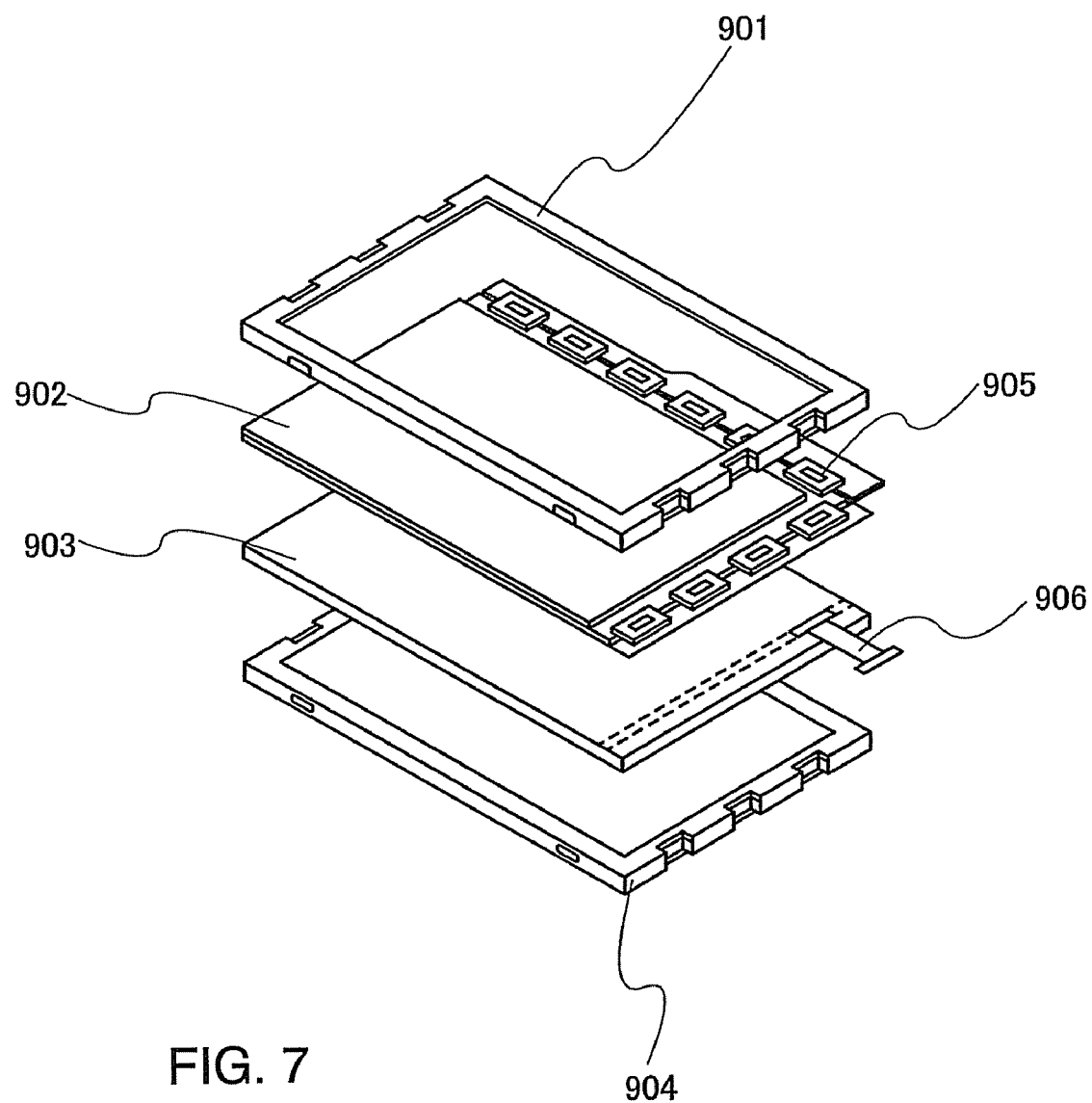
FIG. 7 illustrates an electronic device according to the present invention.

FIG. 7 shows an example of a liquid crystal display device in which the light-emitting device of the present invention is used as a backlight. The liquid crystal display device shown in FIG. 7 includes a housing 901, a liquid crystal layer 902, a backlight 903, and a housing 904, in which the liquid crystal layer 902 is connected to a driver IC 905. The backlight 903 uses the light-emitting device of the present invention, and current is supplied to the backlight 903 through a terminal 906.

When the light-emitting device of the present invention is used as the backlight of the liquid crystal display device, the backlight having a long lifetime can be obtained. Moreover, since the light-emitting device of the present invention is an illumination device of surface light emission and the enlargement of the light-emitting device is possible, the backlight can be made larger and the liquid crystal display device can also have a larger area. Moreover, since the light-emitting device is thin and consumes less electric power, reduction in thickness and power consumption of the display device is possible.

Figure 8:
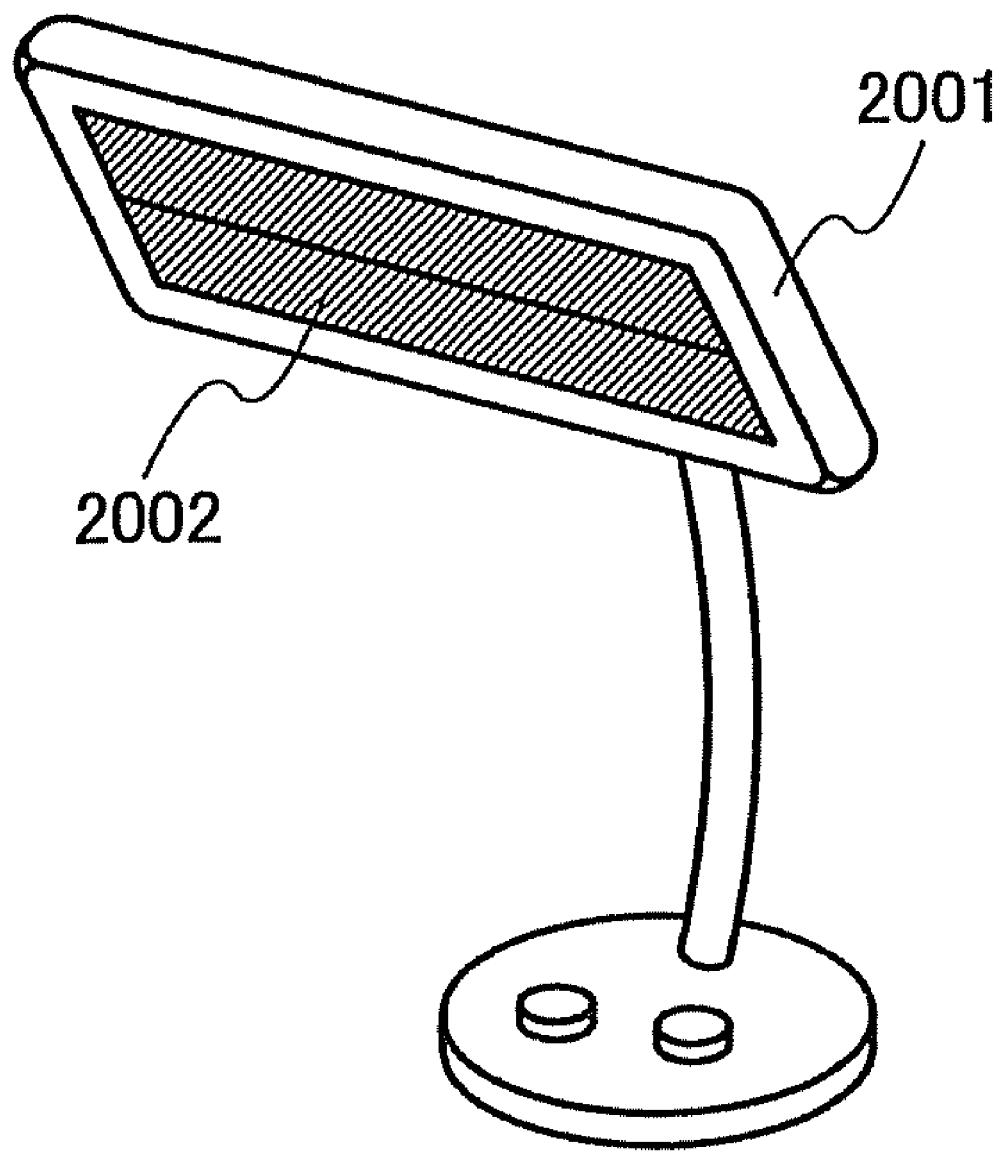
FIG. 8 illustrates an illumination device according to the present invention.

FIG. 8 illustrates an example in which the light-emitting device of the present invention is used as a desk lamp, which is an illumination device. The desk lamp illustrated in FIG. 8 includes a housing 2001 and a light source 2002. The light-emitting device of the present invention is used as the light source 2002. Since the light-emitting device of the present invention has a long lifetime, the desk lamp can also have a long lifetime.

Figure 9:
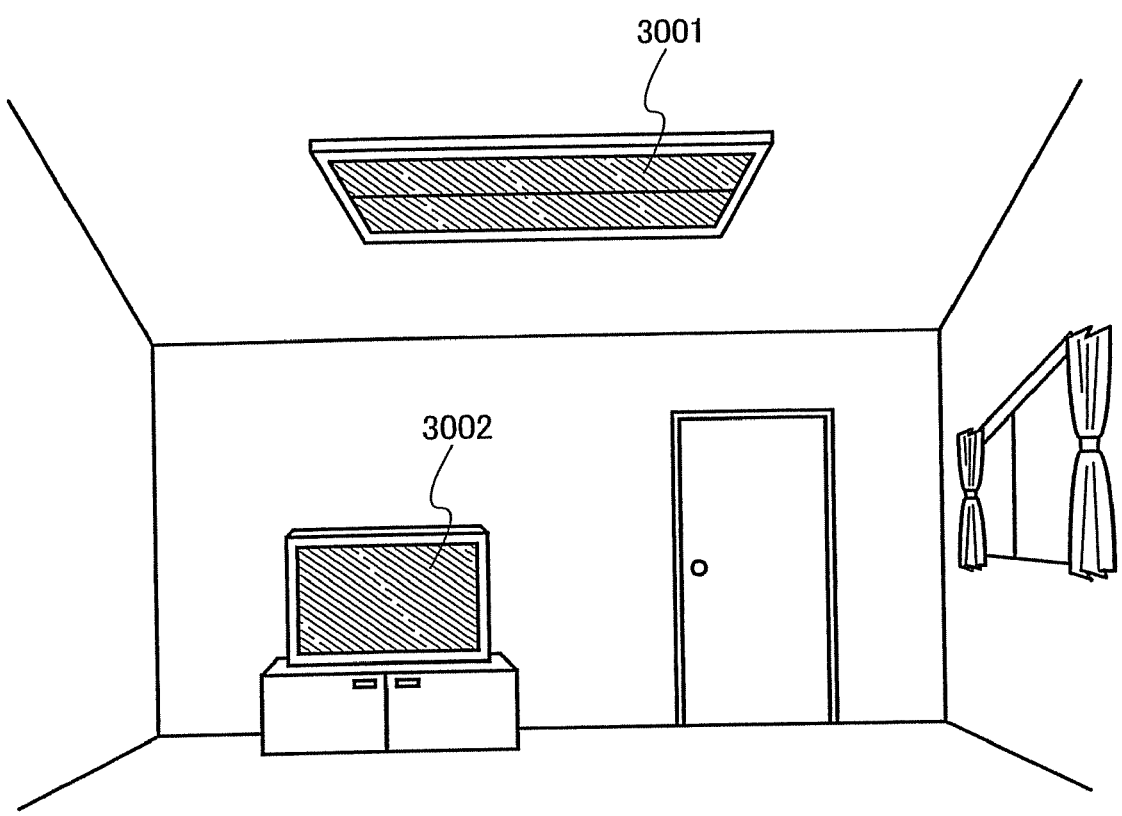
FIG. 9 illustrates an illumination device according to the present invention.

FIG. 9 illustrates an example of using the light-emitting device of the present invention as an illumination device 3001 in the room. Since the light-emitting device of the present invention can be enlarged, the light-emitting device can be used as a large-area illumination device. Moreover, since the light-emitting device of the present invention has a long lifetime, the illumination apparatus can also have a long lifetime. Thus, a television device 3002 of the present invention similar to the television device described with reference to FIG. 6A can be installed in the room using the light-emitting device of the present invention as the illumination device 3001, so that pubic broadcasting and movies can be enjoyed. In such a case, since both of the television device and the illumination device have long lifetimes, it is unnecessary to often buy new illumination device or television device (i.e., the number of replacing is small) and it is possible to reduce a load to the environment.

Example 1

Figure 10:
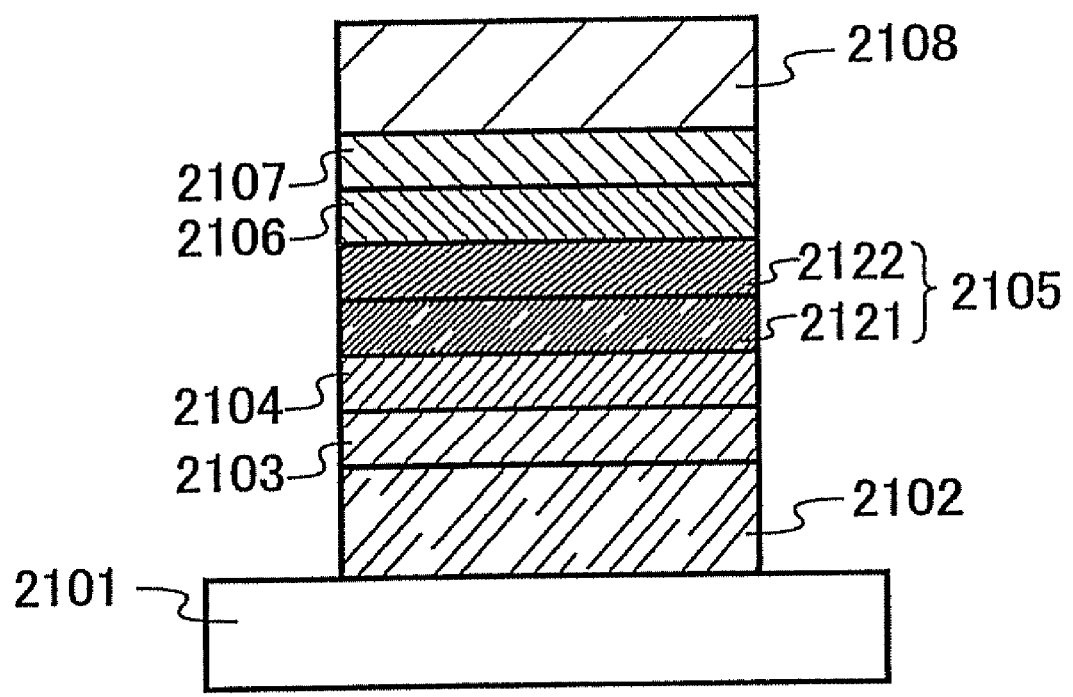
FIG. 10 illustrates a light-emitting element of Examples.

Example 1 will specifically describe a light-emitting element of the present invention with reference to FIG. 10. Structural formulas of organic compounds used in this example are shown below.

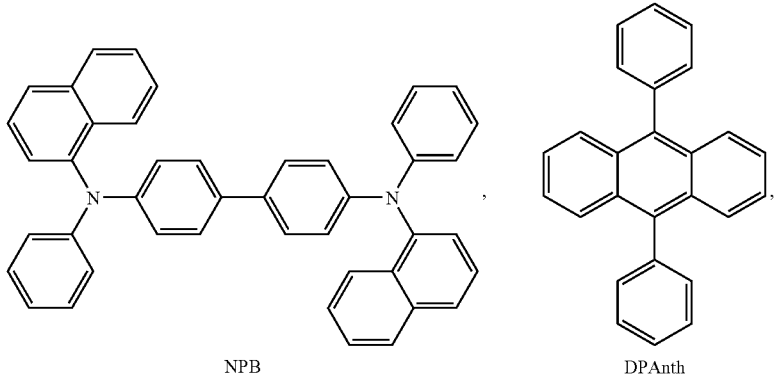

NPB                                   DPAnth

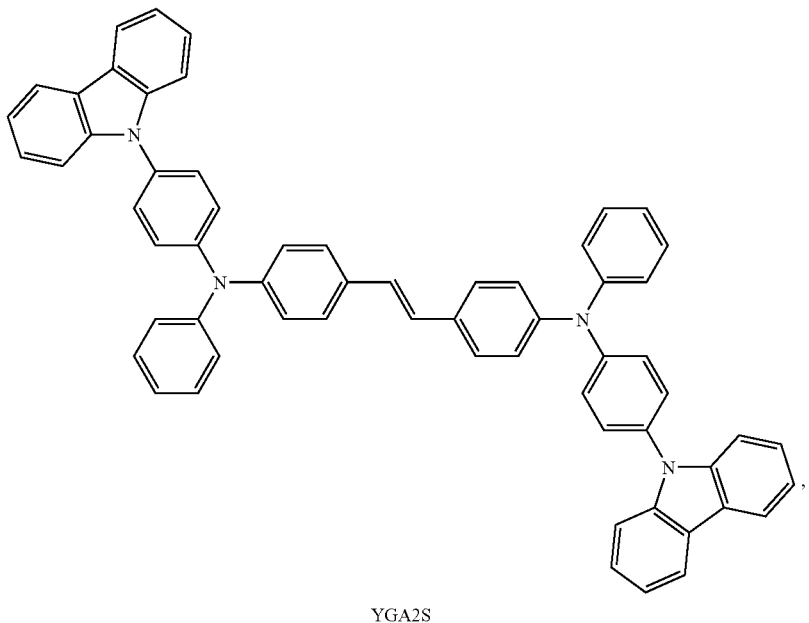

YGA2S

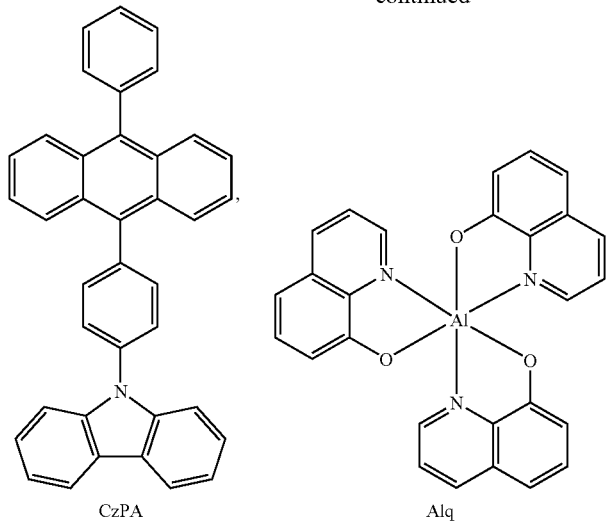

CzPA, Alq (Light-Emitting Element 1)

First, a film of indium tin oxide containing silicon oxide was formed over a glass substrate 2101 by a sputtering method, and a first electrode 2102 was formed. The thickness was 110 nm and the electrode area was 2 mm×2 mm.

Next, the substrate on which the first electrode 2102 was formed was fixed to a substrate holder that was provided in a vacuum evaporation apparatus, such that the surface on which the first electrode 2102 was formed came to the lower side. After the pressure was reduced to be approximately $10^{-4}$ Pa, 4,4'-bis[N-(1-naphtyl)-N-phenylamino]biphenyl (abbreviation: NPB) and molybdenum (VI) oxide were co-evaporated on the first electrode 2102 and thus a layer 2103 containing a composite material was formed. The thickness was 50 nm, and the weight ratio of NPB to molybdenum(VI) oxide was adjusted to 4:1 (=NPB:molybdenum oxide). It is to be noted that the co-evaporation method is an evaporation method in which evaporations from a plurality of evaporation sources are performed at the same time in one treatment chamber.

Next, a film of 4,4'-bis[N-(1-naphthyl)-N-phenylamino]biphenyl (abbreviation: NPB) having a thickness of 10 nm was formed by an evaporation method using resistance heating to form a hole-transporting layer 2104.

Furthermore, a light-emitting layer 2105 was formed over the hole-transporting layer 2104. Firstly, on the hole-transporting layer 2104, 9,10-diphenylanthracene (abbreviation: DPAnth) and N,N'-bis[4-(9H-carbazol-9-yl)phenyl]-N,N'-diphenylstilbene-4,4'-diamine (abbreviation: YGA2S) were co-evaporated to form a first light-emitting layer 2121 with a thickness of 30 nm. Here, the weight ratio of DPAnth to YGA2S was controlled to 1:0.05 (=DPAnth:YGA2S). Further, on the first light-emitting layer 2121, 9-[4-(10-phenyl-9-anthryl)phenyl]-9H-carbazole (abbreviation: CzPA) and N,N'-bis[4-(9H-carbazol-9-yl)phenyl]-N,N'-diphenylstilbene-4,4'diamine (abbreviation: YGA2S) were co-evaporated to form a second light-emitting layer 2122 with a thickness of 30 nm. Here, the weight ratio of CzPA and YGA2S was controlled to 1:0.05 (=CzPA:YGA2S).

After that, a film of tris(8-quinolinolato)aluminum (abbreviation: Alq) having a thickness of 10 nm was formed over the light-emitting layer 2105, by an evaporation method using resistance heating to form an electron-transporting layer 2106.

An electron-injecting layer 2107 having a thickness of 20 nm was formed over the electron-transporting layer 2106 by co-evaporation of Alq and lithium (Li). The weight ratio of Alq to lithium was adjusted to 1:0.01 (=Alq:lithium).

Finally, a film of aluminum having a thickness of 200 nm was formed by an evaporation method using resistance heating to form a second electrode 2108. In this manner, a light-emitting element 1 was manufactured.

(Comparative Light-Emitting Element 2)

First, a film of indium tin oxide containing silicon oxide was formed over a glass substrate by a sputtering method; whereby a first electrode was formed. The thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure was reduced to approximately $10^{-4}$ Pa, 4,4'-bis[N-(1-naphtyl)-N-phenylamino]biphenyl (abbreviation: NPB) and molybdenum(VI) oxide were co-evaporated on the first electrode, and thus, a layer containing a composite material was formed. The thickness was 50 nm, and the weight ratio of NPB to molybdenum(VI) oxide was adjusted to 4:1 (=NPB:molybdenum oxide). It is to be noted that the co-evaporation method is a method in which evaporations from a plurality of evaporation sources are performed at the same time in one treatment chamber.

Next, 4,4'-bis[N-(1-naphtyl)-N-phenylamino]biphenyl (abbreviation: NPB) having a thickness of 10 nm was formed by an evaporation method using resistance heating to form a hole-transporting layer.

Furthermore, a light-emitting layer was formed over the hole-transporting layer. 9-[4-(10-phenyl-9-anthryl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were co-evaporated to form the light-emitting layer with a thickness of 30 nm. Here, the weight ratio of CzPA to YGA2S was controlled to 1:0.05 (=CzPA:YGA2S).

After that, a film of Alq was formed to have a thickness of 10 nm on the light-emitting layer, by an evaporation method using resistance heating to form an electron-transporting layer.

An electron-injecting layer with a thickness of 20 nm was formed over the electron-transporting layer by co-evaporation of Alq and lithium (Li). The weight ratio of Alq to lithium was adjusted to 1:0.01 (=Alq:lithium).

Finally, a film of aluminum having a thickness of 200 nm was formed by an evaporation method using resistance heating, and thus, a second electrode was formed. In this manner, a comparative light-emitting element 2 was manufactured.

Figure 11:
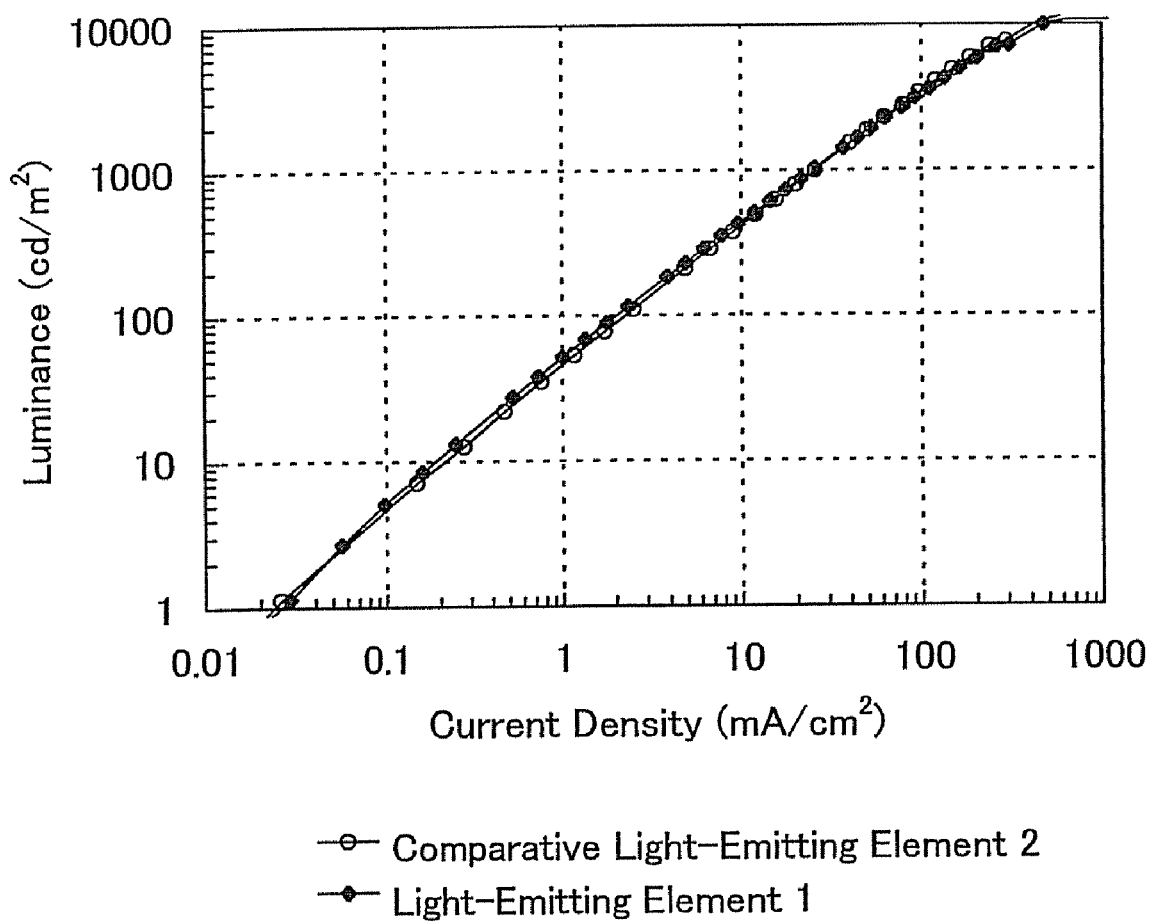
FIG. 11 is a graph showing current efficiency-luminance characteristics of the light-emitting element formed in Example 1.
Figure 12:
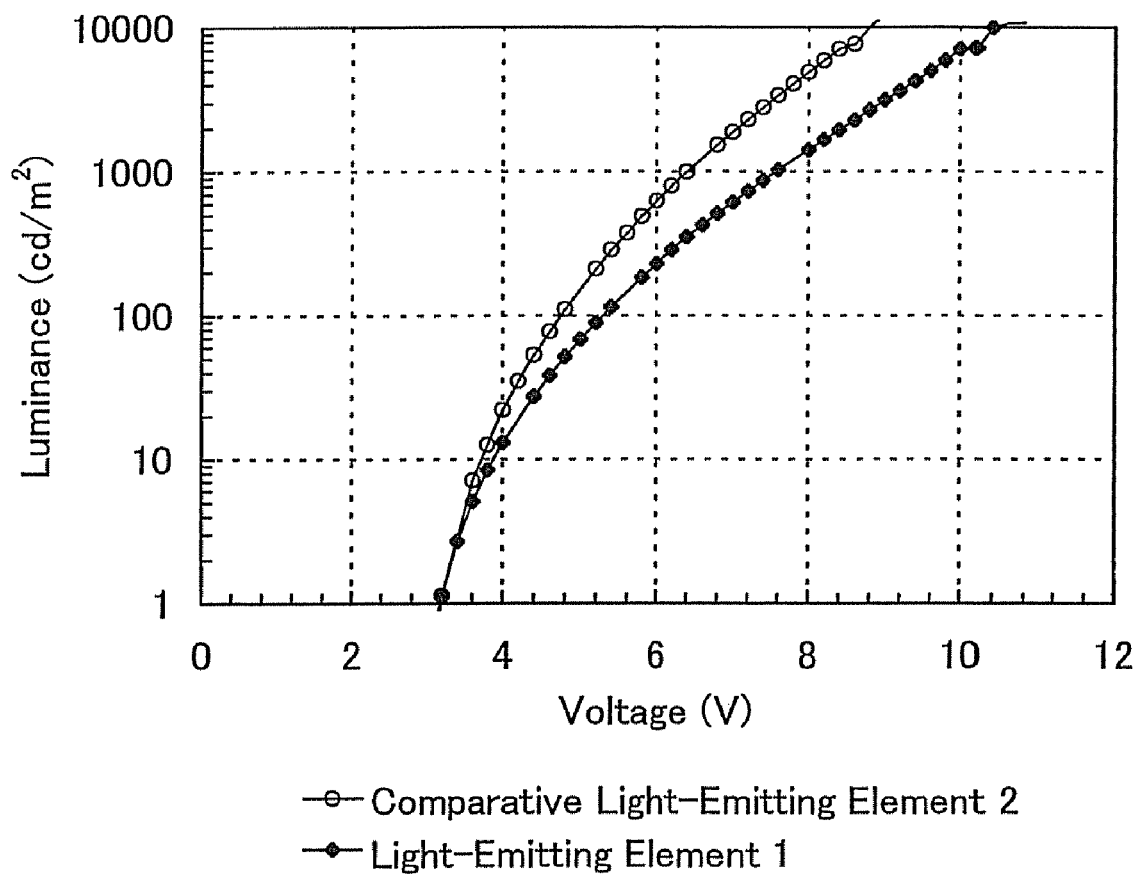
FIG. 12 is a graph showing voltage-luminance characteristics of the light-emitting element formed in Example 1.
Figure 13:
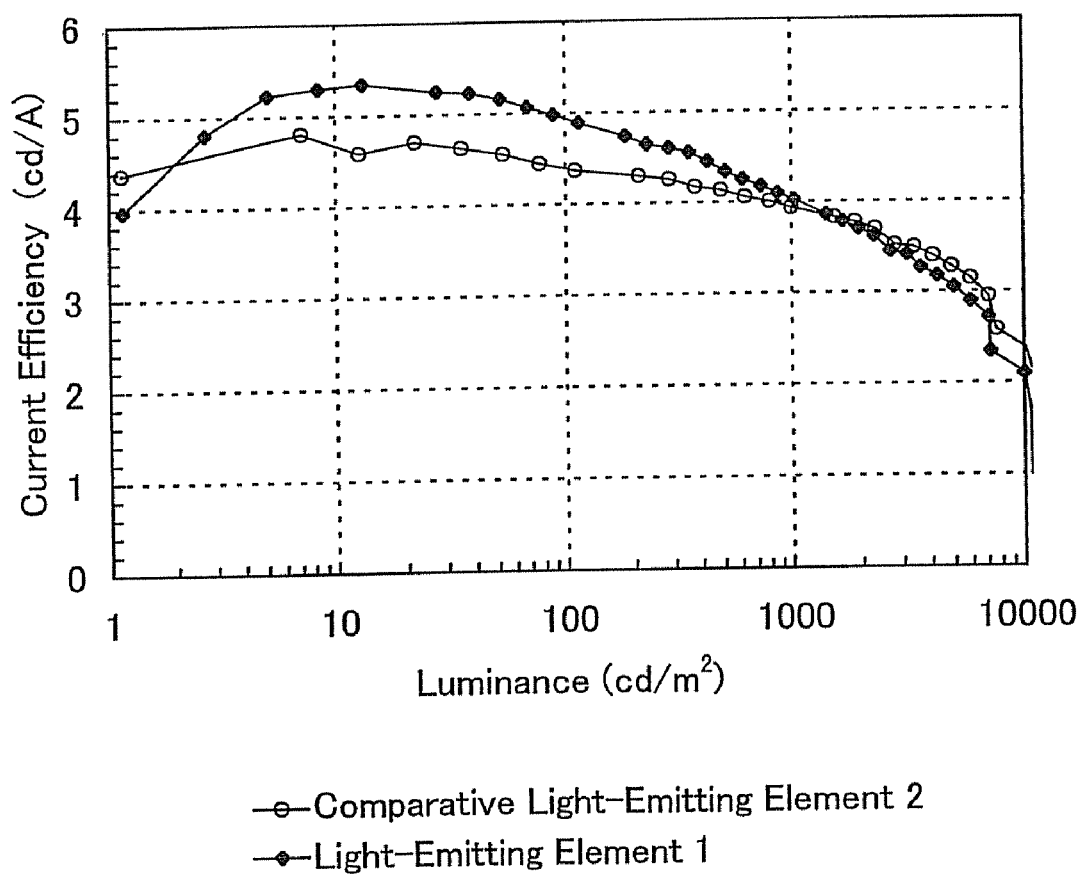
FIG. 13 is a graph showing luminance-current efficiency characteristics of the light-emitting element formed in Example 1.
Figure 14:
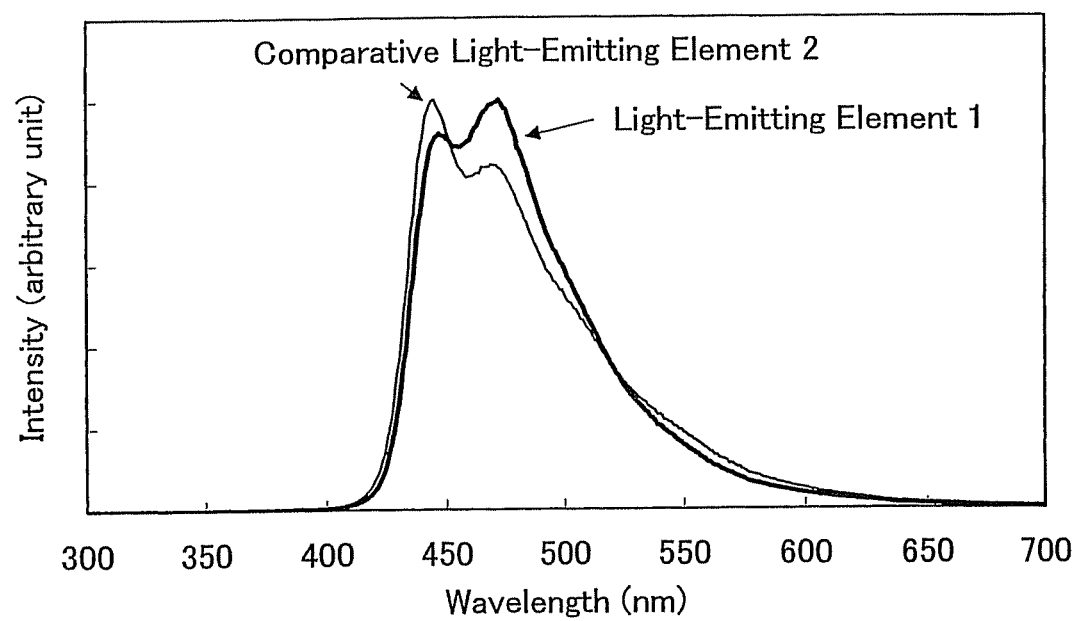
FIG. 14 is a graph showing emission spectrum of the light-emitting element formed in Example 1.
Figure 15:
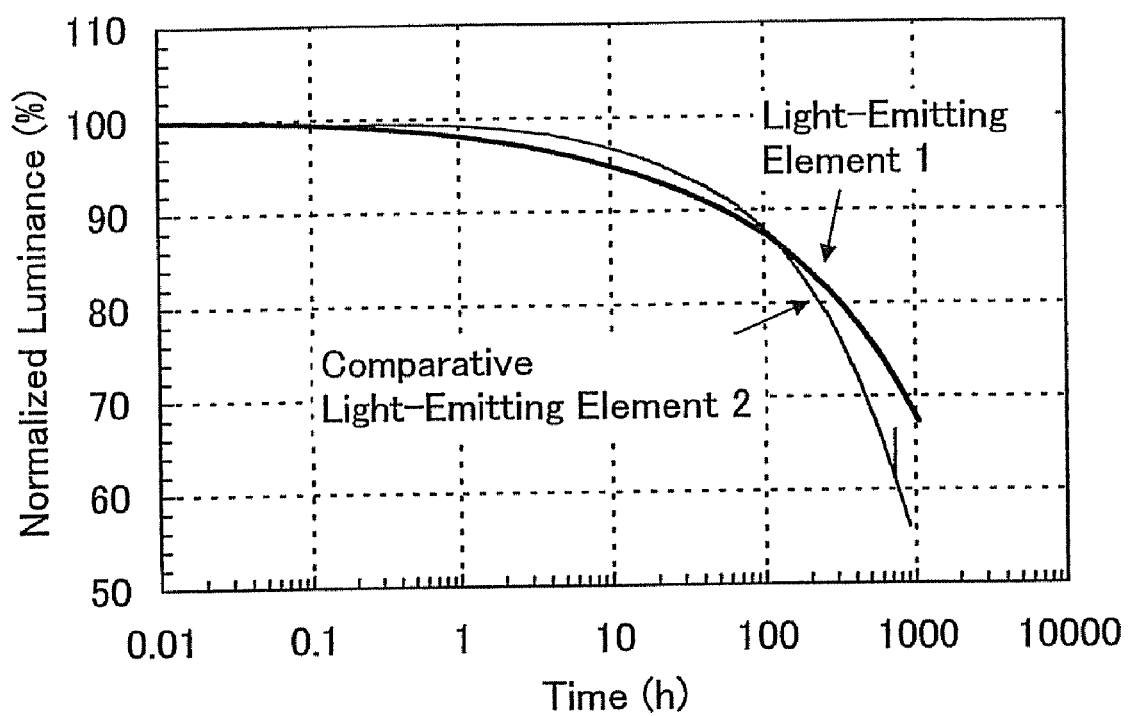
FIG. 15 is a graph showing time dependence of normalized luminance of the light-emitting element formed in Example 1.

FIG. 11 shows current density-luminance characteristics of the light-emitting element 1 and the comparative light-emitting element 2. FIG. 12 shows voltage-luminance characteristics. FIG. 13 shows luminance-current efficiency characteristics. FIG. 14 shows an emission spectrum when a current of 1 mA is fed. FIG. 15 shows time dependence of normalized luminance of the light-emitting element 1 and the comparative light-emitting element 2 when the initial luminance was 1000 cd/m$^2$.

The CIE chromaticity coordinate of the comparative light-emitting element 2 was x=0.16, y=0.17, at a luminance of 1000 cd/m$^2$ and the comparative light-emitting element 2 emitted blue light. In addition, the current efficiency, the voltage and the current density at the luminance of 1000 cd/m$^2$ were 3.9 cd/A, 6.4 V and 25.3 mA/cm$^2$ respectively. In addition, according to FIG. 15, the comparative light-emitting element 2 exhibited 56% of the initial luminance 910 hours after the start of current flow.

On the other hand, the CIE chromaticity coordinate of the light-emitting element 1 was x=0.15, y=0.17, at a luminance of 1000 cd/m$^2$ and the light-emitting element 1 emits blue light. In addition, the current efficiency, the voltage and the current density at the luminance of 1000 cd/m$^2$ were 4.0 cd/A, 7.6 V and 25.5 mA/cm$^2$ respectively. In addition, according to FIG. 15, the light-emitting element 1 exhibited 67% of the initial luminance even 1050 hours after the start of current flow, and it is apparent the light-emitting element 1 is a light-emitting element having a long lifetime.

Accordingly, application of the present invention can provide a light-emitting element having a long lifetime.

Example 2

In Example 2, the oxidative reaction characteristic and the reductive reaction characteristic of 9,10-diphenylanthracene (abbreviation: DPAnth) and 9-[4-(10-phenyl-9-anthryl)phenyl]-9H-carbazole (abbreviation: CzPA) which were used for the light-emitting layer of the light-emitting element 1 were measured by cyclic voltammetry (CV) measurement. In addition, from the measurement, the HOMO level and the LUMO level of DPAnth and CzPA were calculated. Further, an electrochemical analyzer (ALS model 600A, manufactured by BAS Inc.) was used for the measurement.

As for a solution used in the CV measurement, dehydrated dimethylformamide (DMF, manufactured by Aldrich, 99.8%, catalog number: 22705-6) was used as a solvent. Tetra-n-butylammonium perchlorate (n-Bu$_4$NClO$_4$, manufactured by Tokyo Chemical Industry Co., Ltd., catalog number: T0836), which was a supporting electrolyte, was dissolved in the solvent such that the concentration of the tetra-n-butylammonium perchlorate was 100 mmol/L. Moreover, the object to be measured was dissolved such that the concentration thereof was set to 1 mmol/L. Further, a platinum electrode (a PTE E platinum electrode, manufactured by BAS Inc.) was used as a working electrode. A platinum electrode (a VC-3 Pt counter electrode (5 cm), manufactured by BAS Inc.) was used as a counter electrode. An Ag/Ag+ electrode (an RE5 nonaqueous solvent reference electrode, manufactured by BAS Inc.) was used as a reference electrode. It is to be noted that the measurement was conducted at room temperature (20 to 25° C.).

(Calculation of Potential Energy with Respect to a Vacuum Level of a Reference Electrode)

The potential energy (eV) with respect to a vacuum level of a reference electrode (Ag/Ag$^+$ electrode) used in Example 2 was calculated first. In other words, Fermi level of the Ag/Ag+ electrode was calculated. It is known that the oxidation-reduction potential of ferrocene in methanol is +0.610 [Vvs. SHE] with respect to the normal hydrogen electrode (Reference: Christian R. Goldsmith et al., J. Am. Chem. Soc., Vol. 124, No. 1, 83-96, 2002). On the other hand, when the oxidation-reduction potential of ferrocene in methanol was calculated by using a reference electrode used in Example 2, it was +0.20 V [vs.Ag/Ag+]. Therefore, it was found that the potential energy of the reference electrode used in Example 2 was lower than that of the normal hydrogen electrode by 0.41 [eV].

Note that it is known that the potential energy of the normal hydrogen electrode from the vacuum level is −4.44 eV (Reference: Toshihiro Ohnishi and Tamami Koyama, High molecular EL material, Kyoritsu shuppan, pp. 64-67). Accordingly, the potential energy of the reference electrode used in Example 2 with respect to the vacuum level was as follows: −4.44−0.41=−4.85 [eV].

Measurement Example 1

DPAnth

In this measurement example 1, the oxidative reaction characteristic and the reductive reaction characteristic of DPAnth were measured by a cyclicvoltammetry (CV) measurement. The scan speed was 0.1 V/sec and 100 cycles of measurement was conducted.

Figure 16A:
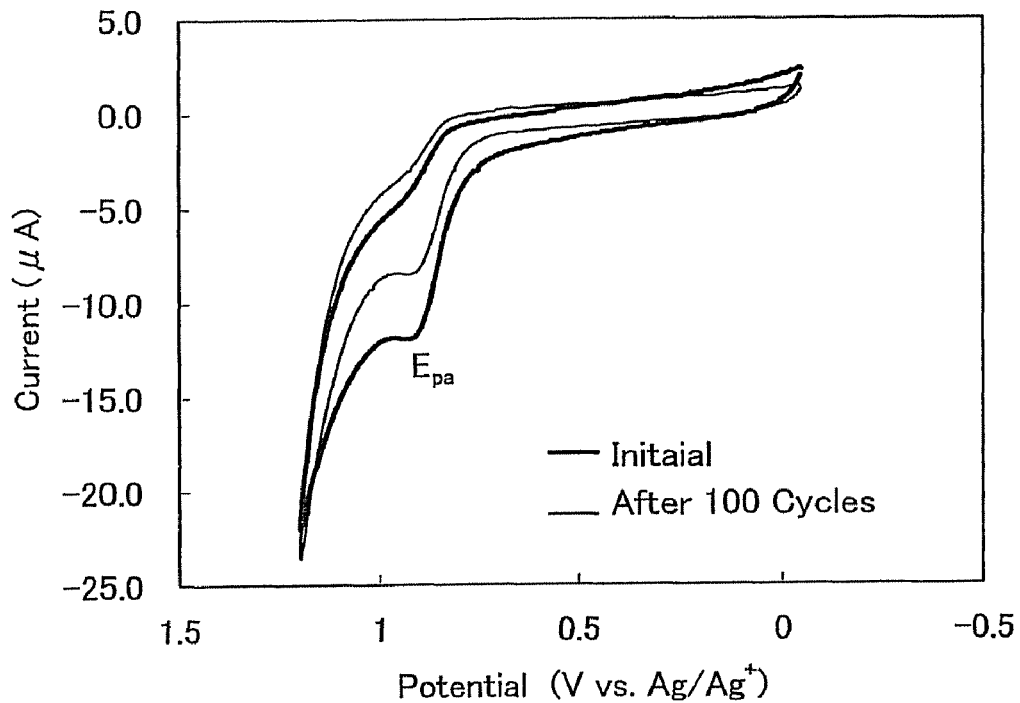
FIGS. 16A and 16B are graphs showing oxidative reaction characteristic of DPAnth.

Firstly, FIG. 16A shows a measurement result of the oxidative reaction characteristic. In the measurement of the oxidative reaction characteristic, the potential of a working electrode with respect to the reference electrode was scanned from −0.05 to 1.20 V, and then from 1.20 V to −0.05 V, which was one cycle.

As shown in FIG. 16A, the oxidation peak potential $E_{pa}$ remained at 0.93V without changing before (initial state) and after the 100 cycles. In addition, the current amount (oxidation peak current $I_{pa}$) in the oxidation peak potential was −11.9 μA in the initial state and −8.49 μA after the 100 cycles. Even after 100 cycles, 71% of that in the initial state was kept. Thus, it can be said that DPAnth is a compound stable to an oxidative reaction.

Figure 16B:
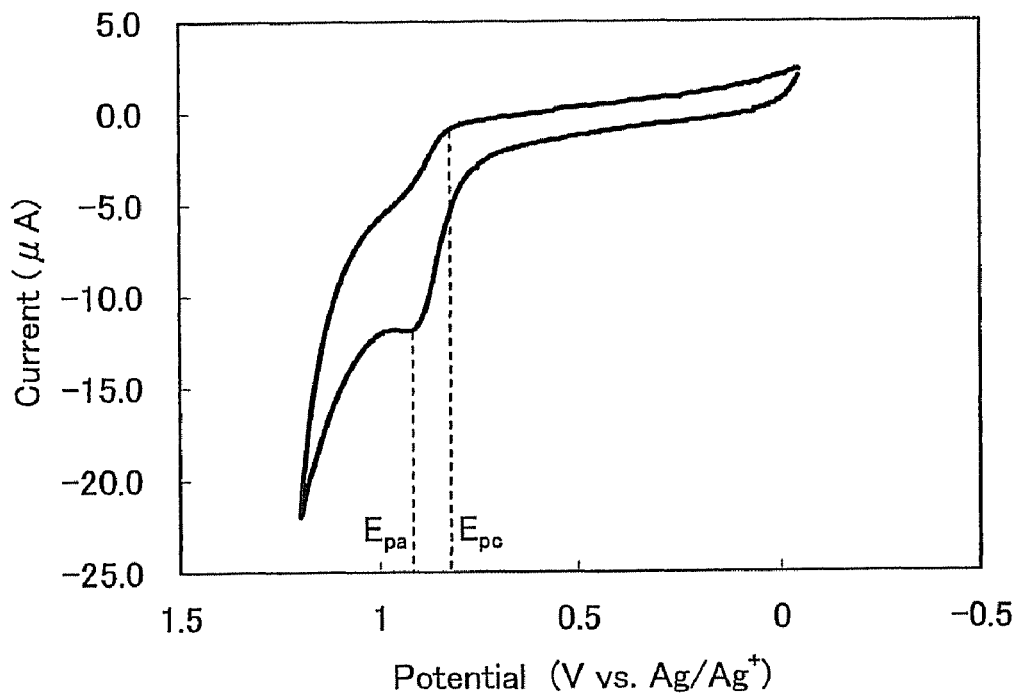

In addition, FIG. 16B shows a graph of the initial state in FIG. 16A. It can be observed that the oxidation peak potential $E_{pa}$ was 0.93 V as described above, and the reduction peak potential $E_{pc}$ was 0.81 V. Thus, the half-wave potential (the middle potential between $E_{pa}$ and $E_{pc}$) can be calculated as 0.87 V. This shows that DPAnth is oxidized by electric energy of 0.87 [Vvs. Ag/Ag+], and this energy corresponds to the HOMO level. Here, as described above, the potential energy of the reference electrode used in Example 2 with respect to the vacuum level was −4.85 [eV], and thus, it was found that the HOMO level of DPAnth was as follows: −4.85−0.87=−5.72 [eV].

Figure 17A:
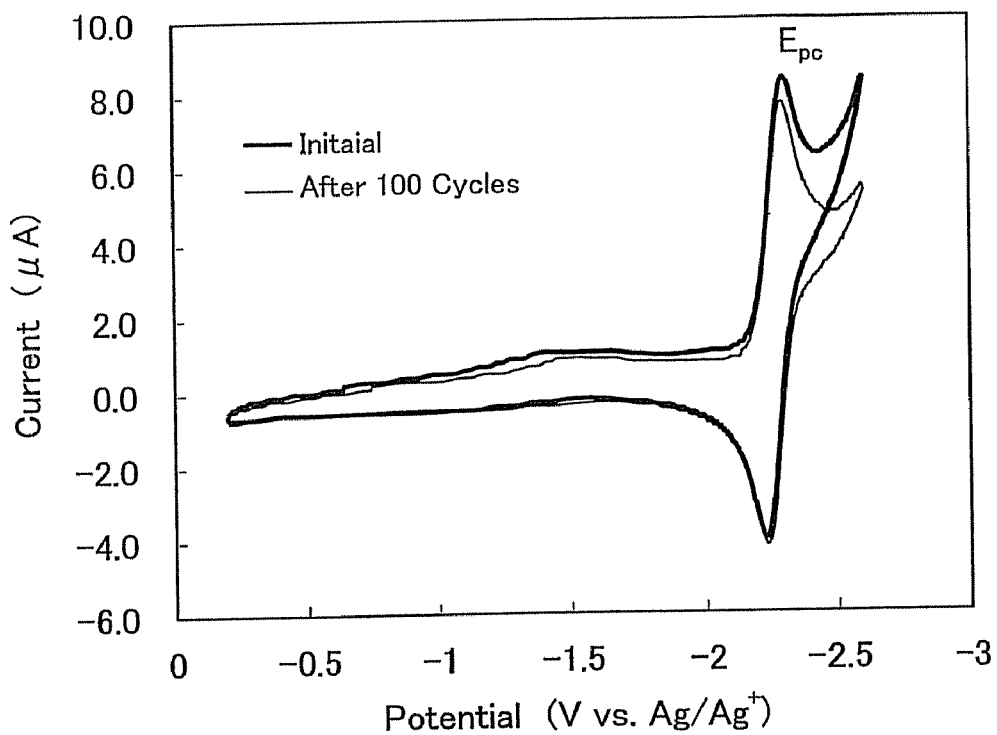
FIGS. 17A and 17B are graphs showing reductive reaction characteristic of DPAnth.

Next, FIG. 17A shows a measurement result of a reductive reaction characteristic. In the measurement of the reductive reaction characteristic, the potential of the working electrode with respect to the reference electrode was scanned from −0.20 to −2.60 V, and then from −2.60 V to −0.20 V, which was one cycle.

As shown in FIG. 17A, the reduction peak potential $E_{pc}$ remained −2.30 V without changing before (initial state) and after the 100 cycles. In addition, the current amount (reduction peak current Ipc) in the reduction peak potential was 8.37 μA in the initial state and 7.72 μA after the 100 cycles. Even after 100 cycles, 92% of that in the initial state was kept. Thus, it can be said that DPAnth is a compound stable in a reductive reaction.

Figure 17B:
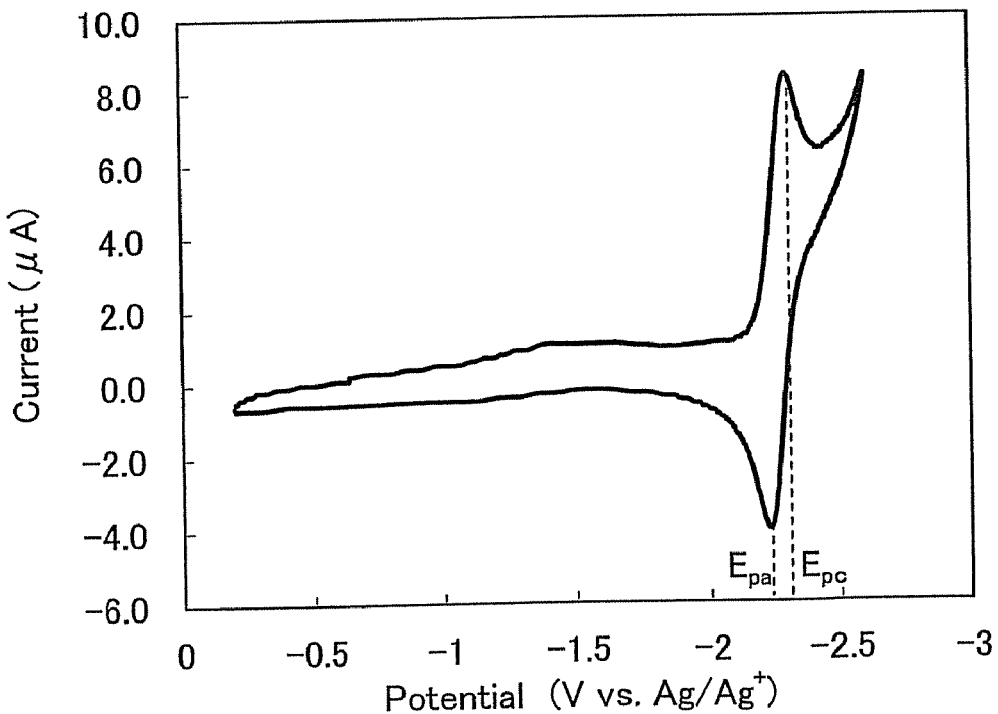

In addition, FIG. 17B shows a graph of the initial state in FIG. 17A. It can be observed that the reduction peak potential $E_{pc}$ was −2.30 V as described above, and the oxidation peak potential $E_{pa}$ was −2.23 V. Thus, the half-wave potential (the middle potential between $E_{pc}$ and $E_{pa}$) can be calculated as −2.27 V. This shows that DPAnth is reduced by electric energy of −2.27 [Vvs. Ag/Ag$^+$], and this energy corresponds to the LUMO level. Here, as described above, the potential energy of the reference electrode used in Example 2 with respect to the vacuum level was −4.85 [eV], and thus, it was found that the LUMO level of DPAnth was as follows: −4.85−(−2.27)=−2.58 [eV].

Measurement Example 2

CzPA

In Measurement Example 2, the oxidative reaction characteristic and the reductive reaction characteristic of CzPA were measured by a cyclicvoltammetry (CV) measurement. The scan speed was 0.1 V/sec and 100 cycles of measurement was conducted.

Figure 18A:
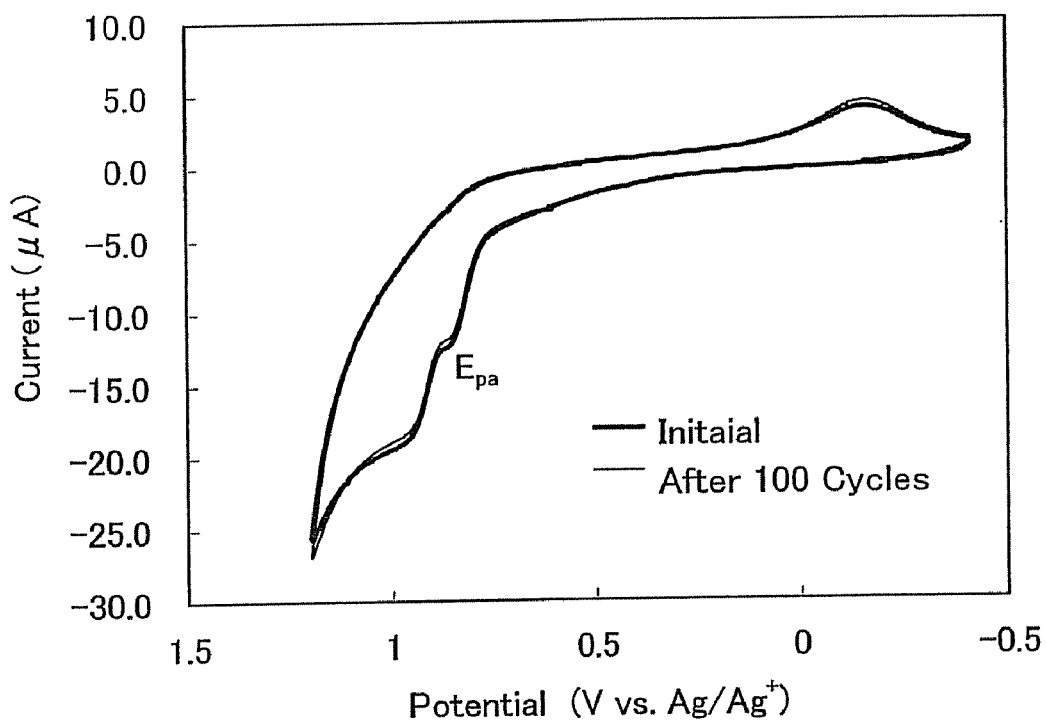
FIGS. 18A and 18B are graphs showing oxidative reaction characteristic of CzPA.

Firstly, FIG. 18A shows a measurement result of the oxidative reaction characteristic. In the measurement of the oxidative reaction characteristic, the potential of the working electrode with respect to the reference electrode was scanned from −0.41 to 1.20 V, and then, from 1.20 V to −0.41 V, which was one cycle.

As shown in FIG. 18A, the oxidation peak potential $E_{pa}$ remained at 0.87 V without changing before (initial state) and after the 100 cycles. In addition, the current amount (oxidation peak current $I_{pa}$) in the oxidation peak potential was −12.5 μA in the initial state and −12.0 μA after the 100 cycles. Even after 100 cycles, 96% of that in the initial state was kept. Thus, it can be said that CzPA is a compound stable to the oxidative reaction.

Figure 18B:
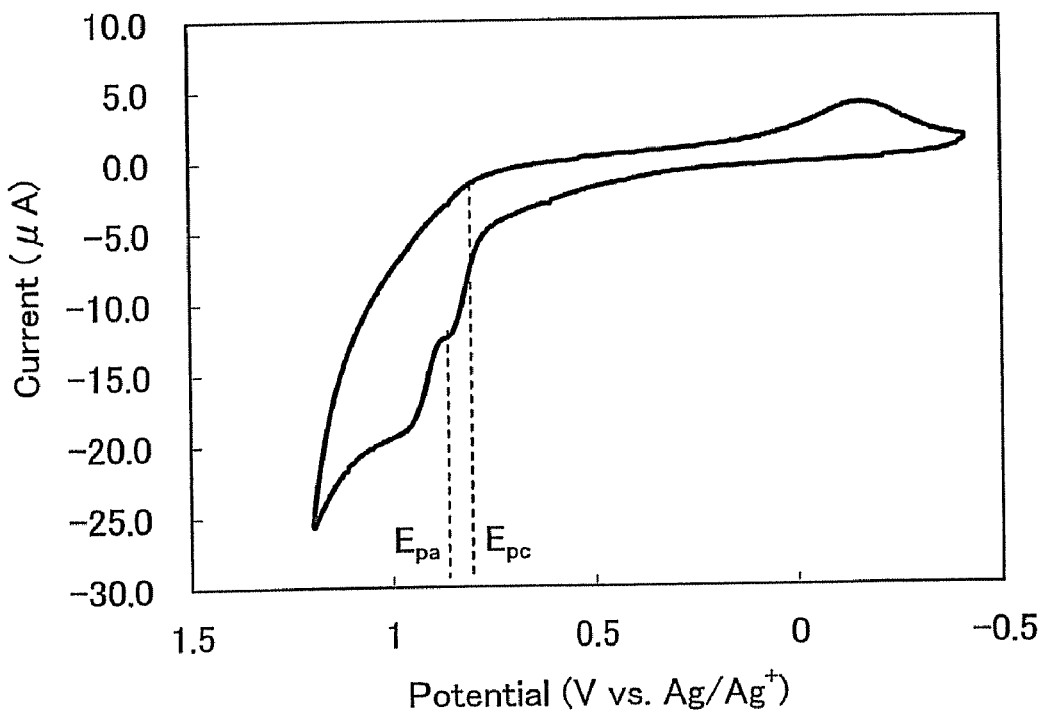

In addition, FIG. 18B shows a graph of the initial state in FIG. 18A. It can be observed that the oxidation peak potential $E_{pa}$ was 0.87 V as described above, and the reduction peak potential $E_{pc}$ was 0.79 V. Thus, the half-wave potential (the middle potential between $E_{pa}$ and $E_{pc}$) can be calculated as 83 V. This shows that CzPA was oxidized by electric energy of 0.83 [Vvs. Ag/Ag+], and this energy corresponds to the HOMO level. Here, as described above, the potential energy of the reference electrode used in Example 2 with respect to the vacuum level was −4.85 [eV], and thus, it was found that the HOMO level of CzPA was as follows: −4.85−0.83=−5.68 [eV].

Figure 19A:
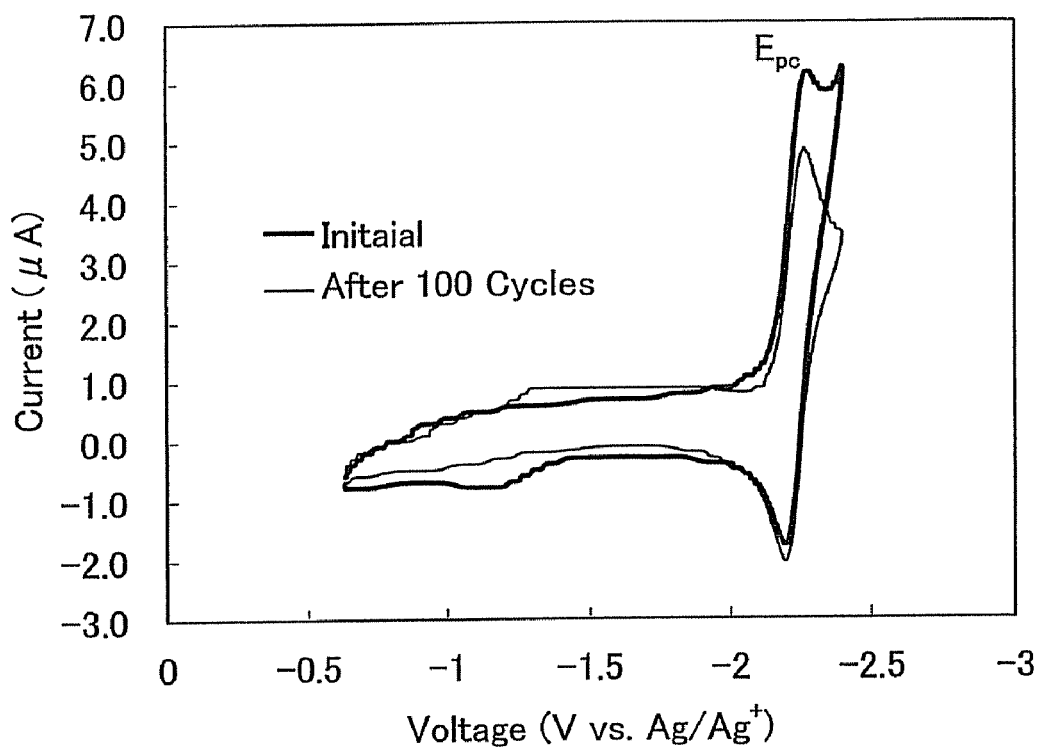
FIGS. 19A and 19B are graphs showing reductive reaction characteristic of CzPA.

Next, FIG. 19A shows a measurement result of the reductive reaction characteristic. In the measurement of the reductive reaction characteristic, the potential of the working electrode with respect to the reference electrode was scanned from −0.63 to −2.40 V, and then, from −2.40 V to −0.63 V, which was one cycle.

As shown in FIG. 19A, the reduction peak potential $E_{pc}$ remained at −2.27 V without changing before (initial state) and after the 100 cycles. In addition, the current amount (reduction peak current $I_{pc}$) in the reduction peak potential was 6.15 μA in the initial state and 4.88 μA after the 100 cycles. Even after 100 cycles, 79% of that in the initial state was kept. Thus, it can be said that CzPA is a compound stable to a reductive reaction.

Figure 19B:
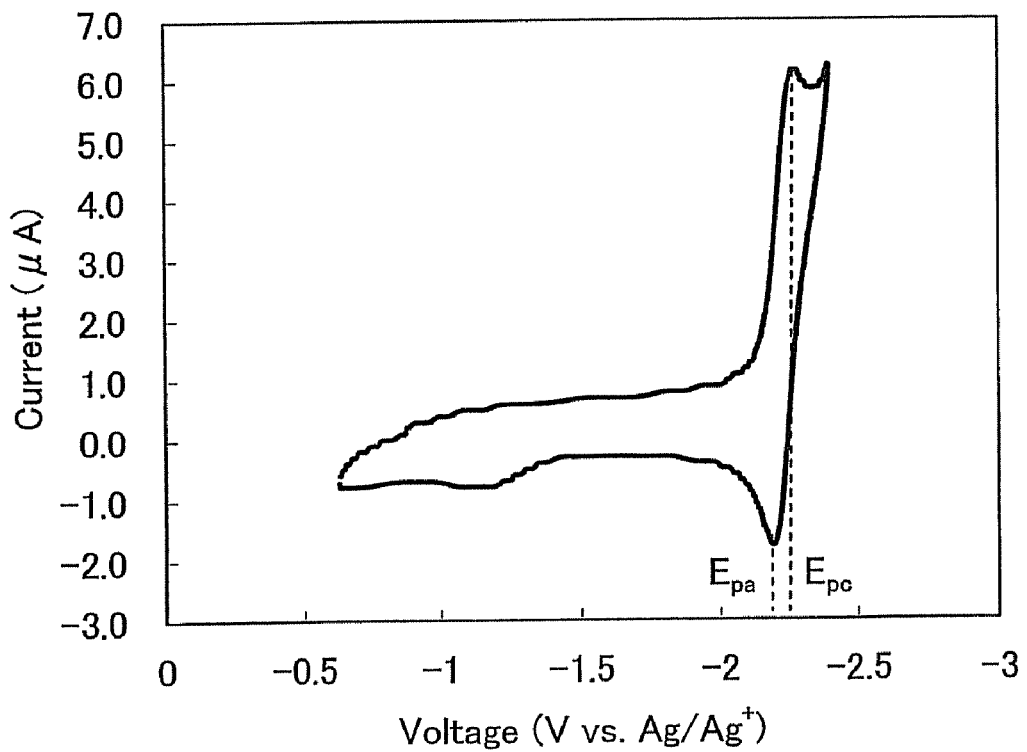

In addition, FIG. 19B shows a graph of the initial state in FIG. 19A. It can be observed that the reduction peak potential $E_{pc}$ was −2.27 V as described above, and the oxidation peak potential $E_{pa}$ was −2.19 V. Thus, the half-wave potential (the middle potential between $E_{pc}$ and $E_{pa}$) can be calculated as −2.23 V. This shows that CzPa is reduced by electric energy of −2.23 [Vvs. Ag/Ag$^+$], and this energy corresponds to the LUMO level. Here, as described above, the potential energy of the reference electrode used in Example 2 with respect to the vacuum level was −4.85 [eV], and thus, it was found that the LUMO level of CzPa was as follows: −4.85−(−2.23)=−2.62 [eV].

The HOMO levels and the LUMO levels of DPAnth and CzPA which were obtained above are shown in Table 1. As apparent from Table 1, the difference between the HOMO levels of DPAnth and CzPA was 0.04 eV and the difference between the LUMO levels thereof was 0.04 eV. In other words, the energy barrier between the HOMO levels of DPAnth and CzPA and the energy barrier between the LUMO levels of DPAnth and CzPA were both 0.1 eV or less. Therefore, the element structure shown in Example 1 in which DPAnth was used as a hole-transporting compound in the first layer and CzPA was used as an electron-transporting compound in the second layer, is preferable for the present invention.

TABLE 1

|  | HOMO levels [eV] | LUMO levels [eV] |
| --- | --- | --- |
| DPAnth | −5.72 | −2.58 |
| CzPA | −5.68 | −2.62 |

Example 3

Example 3 will specifically describe a light-emitting element of the present invention with reference to FIG. 10. Structural formulas of organic compounds used in this example are shown below.

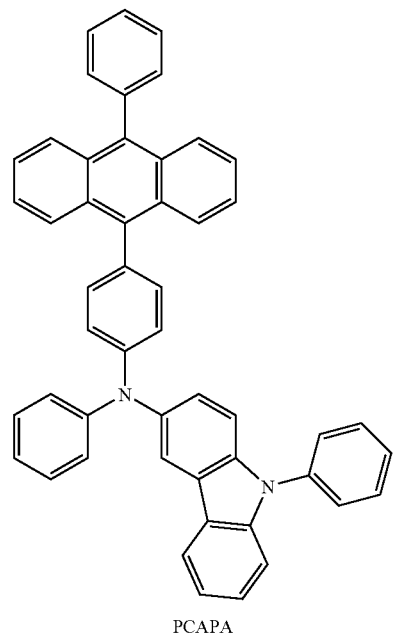

PCAPA (Light-Emitting Element 3)

First, a film of indium tin oxide containing silicon oxide was formed over a glass substrate 2101 by a sputtering method, and thus, a first electrode 2102 was formed. The thickness was 110 nm and the electrode area was 2 mm×2 mm.

Next, the substrate on which the first electrode 2102 was formed was fixed to a substrate holder that was provided in a vacuum evaporation apparatus, such that the surface on which the first electrode 2102 was formed came to the lower side. After the pressure was reduced to approximately $10^{-4}$ Pa, 4,4'-bis[N-(1-naphtyl)-N-phenylamino]biphenyl (abbreviation: NPB) and molybdenum (VI) oxide were co-evaporated on the first electrode 2102 to form a layer 2103 containing a composite material. The thickness was 50 nm, and the weight ratio of NPB to molybdenum(VI) oxide was adjusted to 4:1 (=NPB:molybdenum oxide). It is to be noted that the co-evaporation method is a method in which evaporations from a plurality of evaporation sources are performed at the same time in one treatment chamber.

Next, 4,4'-bis[N-(1-naphthyl)-N-phenylamino]biphenyl having a thickness of 10 nm (abbreviation: NPB) was formed by an evaporation method using resistance heating, and thus a hole-transporting layer 2104 was formed.

Furthermore, a light-emitting layer 2105 was formed over the hole-transporting layer 2104. Initially, on the hole-transporting layer 2104, 9,10-diphenylanthracene (abbreviation DPAnth) and N,9-diphenyl-N-[4-(10-phenyl-9-anthryl)phenyl]-9H-carbazol-3-amine (abbreviation: PCAPA) were co-evaporated to form a first light-emitting layer 2121 with a thickness of 30 nm. Here, the weight ratio of DPAnth and PCAPA was controlled to 1:0.05 (=DPAnth:PCAPA). Further, on the first light-emitting layer 2121, 9-[4-(10-phenyl-9-anthryl)phenyl]-9H-carbazole (abbreviation: CzPA) and N,9-diphenyl-N-[4-(10-phenyl-9-anthryl)phenyl]-9H-carbazol-3-amine (abbreviation: PCAPA) were co-evaporated to form a second light-emitting layer 2122 with a thickness of 30 nm. Here, the weight ratio of CzPA to PCAPA was controlled to 1:0.05 (=CzPA:PCAPA).

After that, a film of Alq was formed to have a thickness of 20 nm on the light-emitting layer 2105, by an evaporation method using resistance heating to form an electron-transporting layer 2106.

An electron-injecting layer 2107 with a thickness of 10 nm was formed over the electron-transporting layer 2106 by co-evaporation of Alq and lithium (Li). The weight ratio of Alq to lithium was adjusted to 1:0.01 (=Alq:lithium).

Finally, a film of aluminum was formed to have a thickness of 200 nm by an evaporation method using resistance heating to form a second electrode 2108. In this manner, a light-emitting element 3 was manufactured.

(Comparative Light-Emitting Element 4)

First, a film of indium tin oxide containing silicon oxide was formed over a glass substrate by a sputtering method to form a first electrode. The thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure was reduced to approximately $10^{-4}$ Pa, 4,4'-bis[N-(1-naphtyl)-N-phenylamino]biphenyl (abbreviation: NPB) and molybdenum(VI) oxide were co-evaporated on the first electrode to form a layer containing a composite material. The thickness was 50 nm, and the weight ratio of NPB to molybdenum(VI) oxide was adjusted to 4:1 (=NPB:molybdenum oxide). It is to be noted that the co-evaporation method is a method in which evaporations from a plurality of evaporation sources are performed at the same time in one treatment chamber.

Next, 4,4'-bis[N-(1-naphthyl)-N-phenylamino]biphenyl (abbreviation: NPB) was formed to have a thickness of 10 nm by an evaporation method using resistance heating to form a hole-transporting layer.

Furthermore, a light-emitting layer was formed over the hole-transporting layer. 9-[4-(10-phenyl-9-anthryl)phenyl]-9H-carbazole (abbreviation: CzPA) and N,9-diphenyl-N-[4-(10-phenyl-9-anthryl)phenyl]-9H-carbazol-3-amine (abbreviation: PCAPA) were co-evaporated to form the light-emitting layer with a thickness of 30 nm. Here, the weight ratio of CzPA and PCAPA was controlled to 1:0.05 (=CzPA:PCAPA).

After that, a film of Alq was formed to have a thickness of 10 nm on the light-emitting layer, by an evaporation method using resistance heating to form an electron-transporting layer.

An electron-injecting layer with a thickness of 20 nm was formed over the electron-transporting layer by co-evaporation of Alq and lithium (Li). The weight ratio of Alq to lithium was adjusted to 1:0.01 (=Alq:lithium).

Finally, a film of aluminum was formed to have a thickness of 200 nm by an evaporation method using resistance heating; whereby a second electrode was formed. In this manner, a comparative light-emitting element 4 was manufactured.

Figure 21:
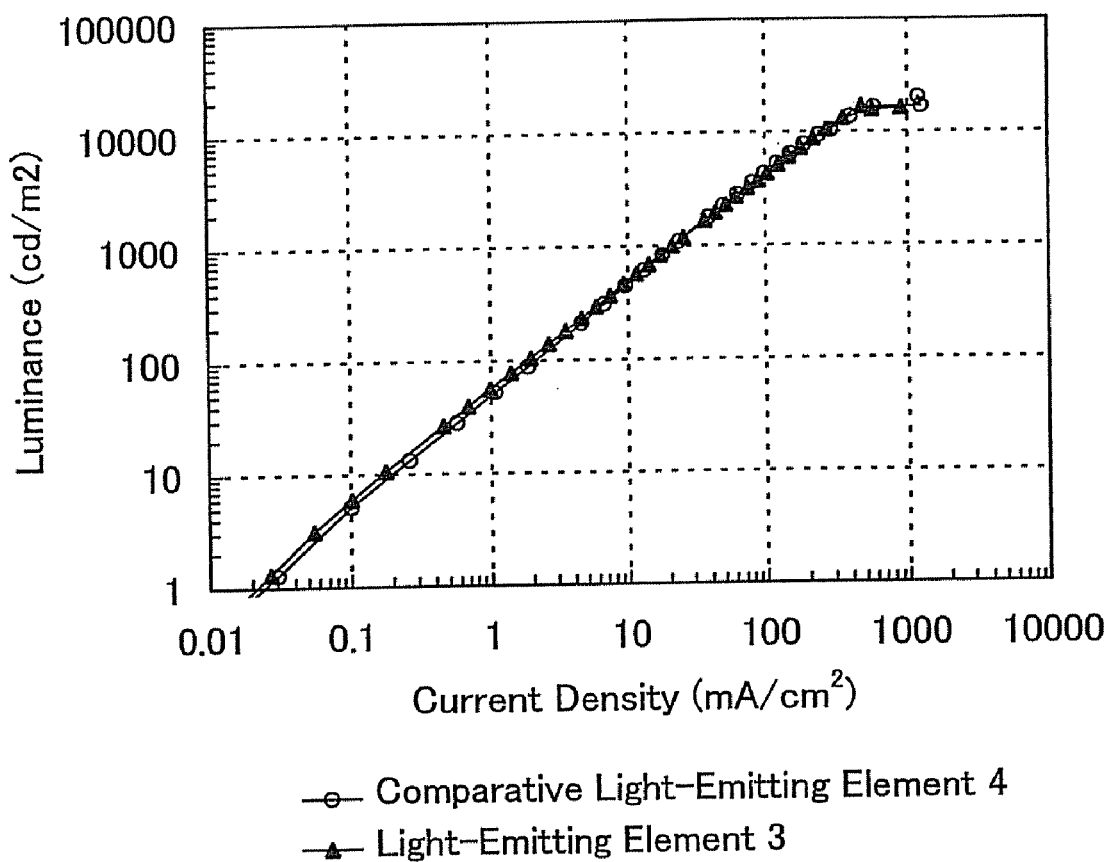
FIG. 21 is a graph showing current efficiency-luminance characteristics of the light-emitting element formed in Example 3.
Figure 22:
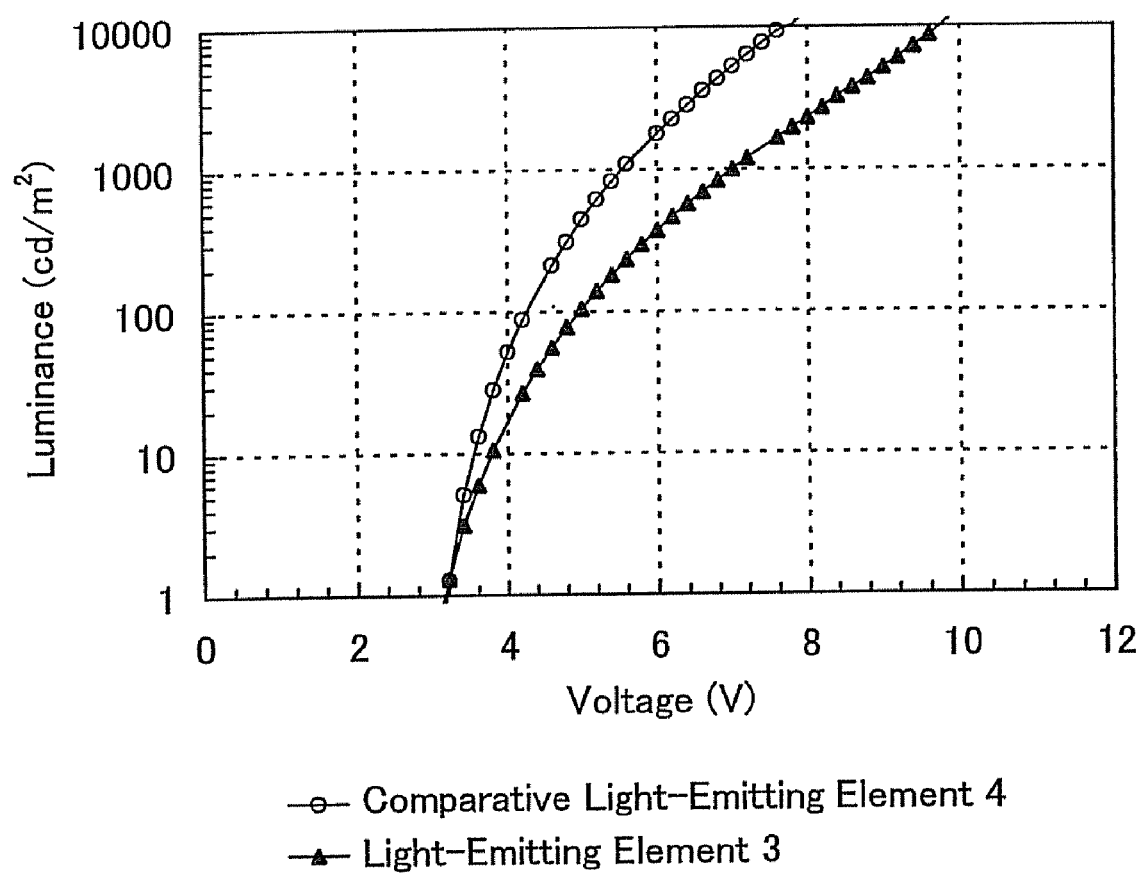
FIG. 22 is a graph showing voltage-luminance characteristics of the light-emitting element formed in Example 3.
Figure 23:
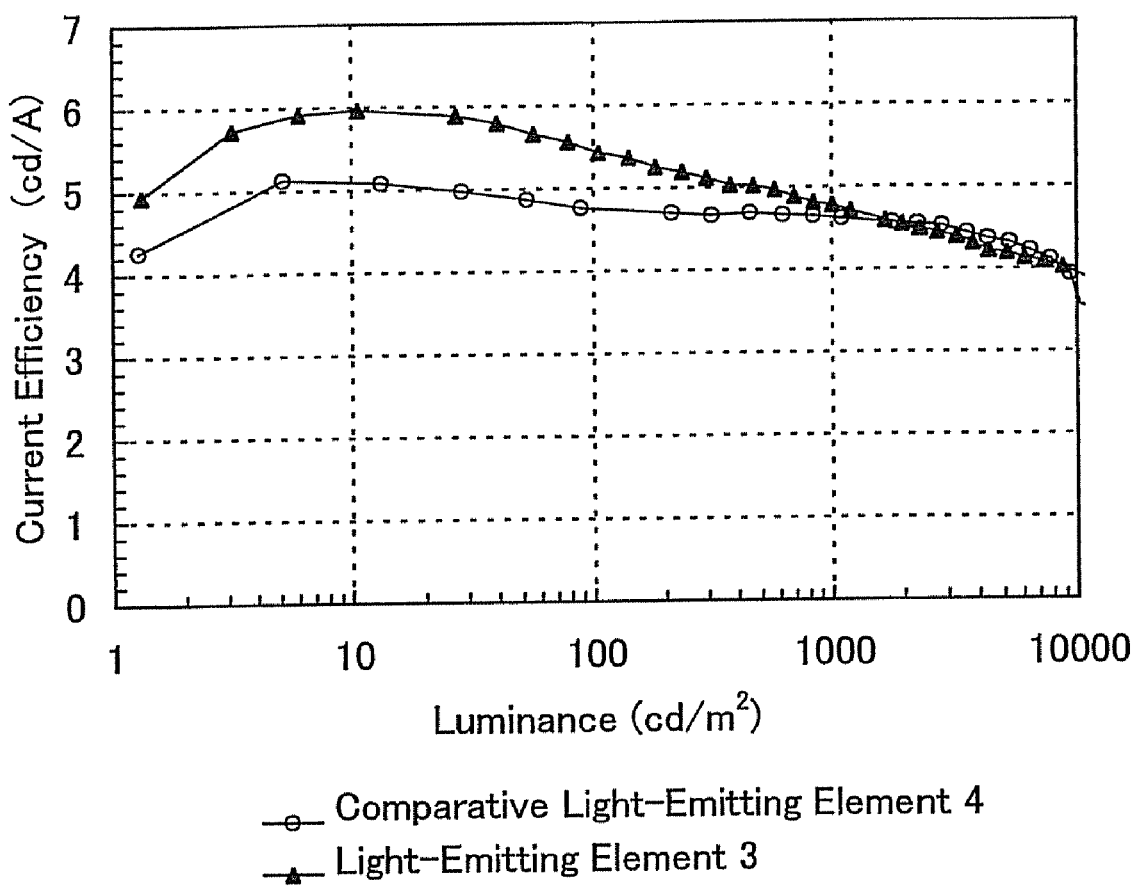
FIG. 23 is a graph showing luminance-current efficiency characteristics of the light-emitting element formed in Example 3.
Figure 24:
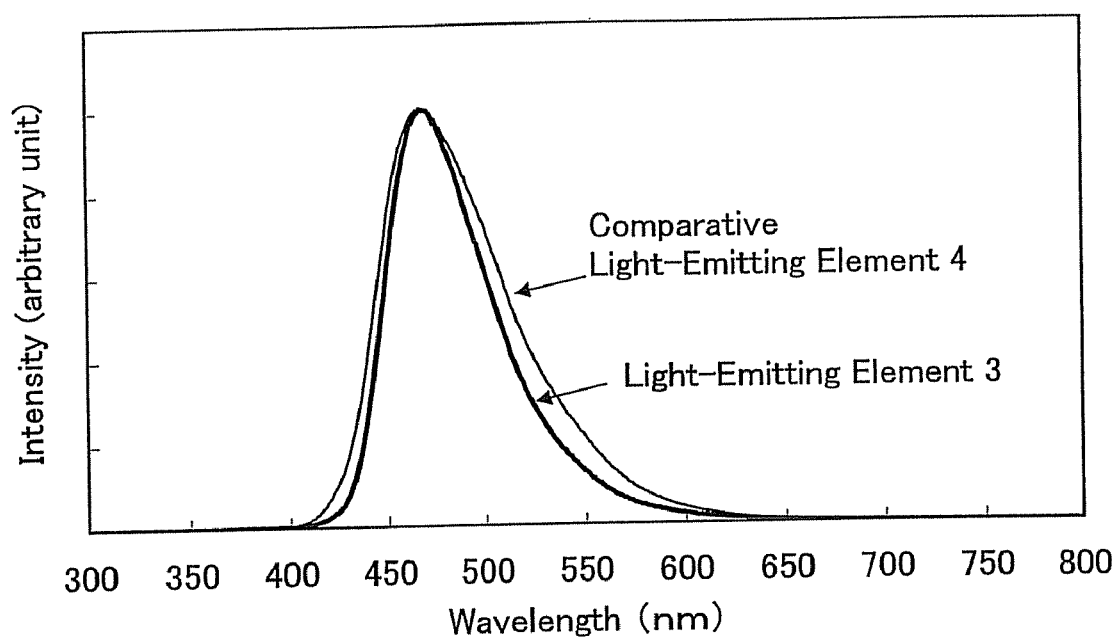
FIG. 24 is a graph showing emission spectrum of the light-emitting element formed in Example 3.
Figure 25:
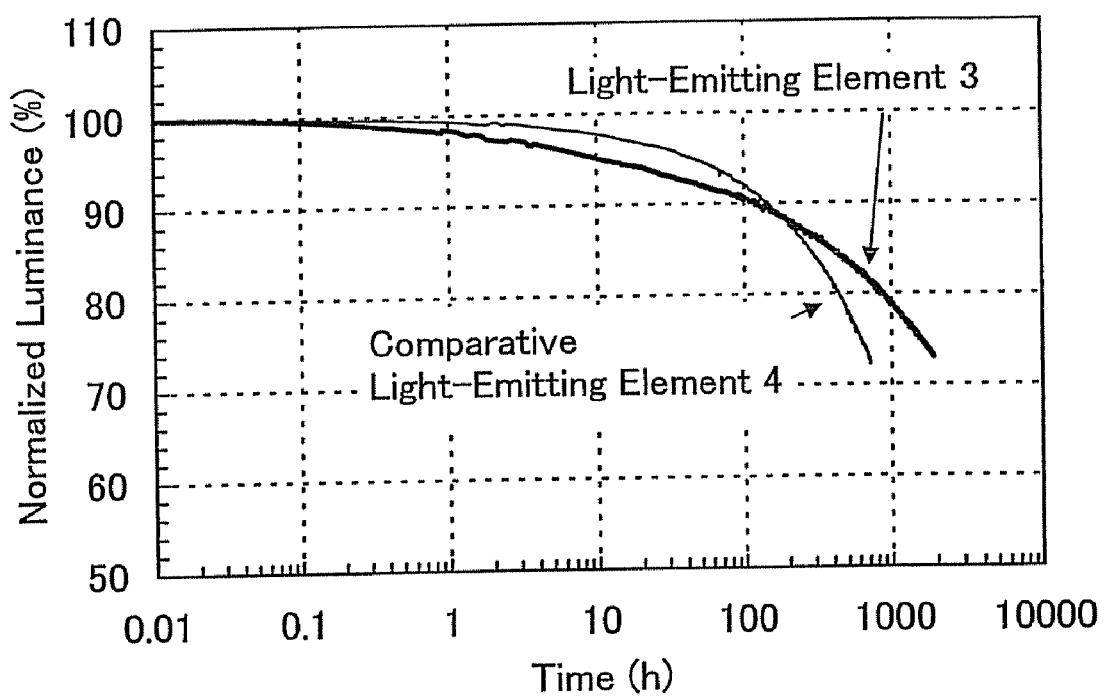
FIG. 25 is a graph showing time dependence of normalized luminance of the light-emitting element formed in Example 3.

FIG. 21 shows current density-luminance characteristics of the light-emitting element 3 and the comparative light-emitting element 4. FIG. 22 shows voltage-luminance characteristics. FIG. 23 shows luminance-current efficiency characteristics. FIG. 24 shows an emission spectrum when a current of 1 mA is fed. FIG. 25 shows time dependence of normalized luminance of the light-emitting element 3 and the comparative light-emitting element 4 when the initial luminance was 1000 cd/m$^2$.

The CIE chromaticity coordinate of the comparative light-emitting element 4 was x=0.16, y=0.22, at a luminance of 1100 cd/m$^2$ and the comparative light-emitting element 4 emits blue light. In addition, the current efficiency and the external quantum efficiency at the luminance of 1100 cd/m$^2$ were 4.6 cd/A, and 3.0% respectively. The voltage and the current density at the luminance of 1100 cd/m$^2$ were 5.6 V and 23.7 mA/cm$^2$. In addition, according to FIG. 25, the comparative light-emitting element 4 exhibited 72% of the initial luminance 710 hours after the start of current flow.

On the other hand, the CIE chromaticity coordinate of the light-emitting element 3 was x=0.15, y=0.20, at a luminance of 1000 cd/m$^2$ and the light-emitting element 3 emits blue light. In addition, the current efficiency and the external quantum efficiency at the luminance of 1000 cd/m$^2$ were 4.8 cd/A, and 3.4% respectively. The voltage and the current density at the luminance of 1000 cd/m$^2$ were 7.0 V and 21.0 mA/cm$^2$. In addition, according to FIG. 25, the light-emitting element 3 exhibited 73% of the initial luminance 1900 hours after the start of current flow. The half-life period in which the luminance is 50% of the initial luminance was estimated to be 13000 hours by calculation and the light-emitting element 3 is a light-emitting element having an extremely long lifetime.

Accordingly, application of the present invention can provide a light-emitting element having a long lifetime.

Example 4

Example 4 will describe materials used in other examples.

Synthesis Example of PCAPA

A synthesis method of N,9-diphenyl-N-[4-(10-phenyl-9-anthryl)phenyl]-9H-carbazol-3-amine (abbreviation: PCAPA) represented in a structural formula (101) is described.

(101)

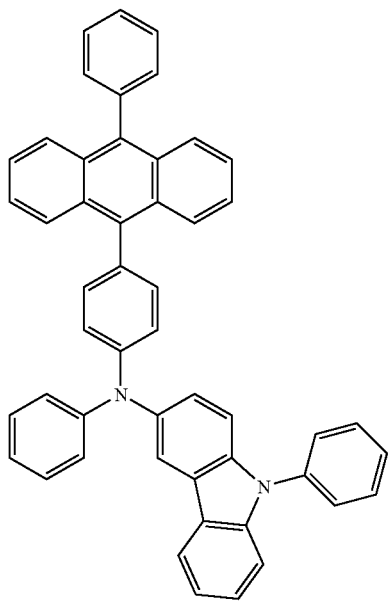

Step 1: Synthesis method of 9-(4-bromophenyl)-10-phenylanthracene (Abbreviation: PA)

(1) Synthesis of 9-phenylanthracene 5.4 g (21.1 mmol) of 9-bromoanthracene, 2.6 g (21.1 mmol) of phenylboronic acid, 60 mg (0.21 mmol) of palladium(II) acetate (abbreviation: Pd(OAc)$_2$), 10 mL (20 mmol) of a potassium carbonate aqueous solution (2 mol/L), 263 mg (0.84 mmol) of tris(ortho-tolyl)phosphine (abbreviation: P(o-tolyl)$_3$), and 20 mL of 1,2-dimethoxyethane (abbreviation: DME) were put in a 200 mL three neck flask, and then stirred for nine hours at 80° C. in nitrogen stream. After reaction, a precipitated solid was collected by suction filtration. Subsequently, the solid was dissolved in toluene and then filtered through florisil, celite, and alumina. After a filtrate was washed with water and saturated saline, it was dried with magnesium sulfate. After the mixture was subjected to natural filtration, when the filtrate was concentrated, 21.5 g of 9-phenylanthracene which was a target substance was obtained as a light brown solid at a yield of 85% (Synthesis scheme (b-1)).

(b-1)

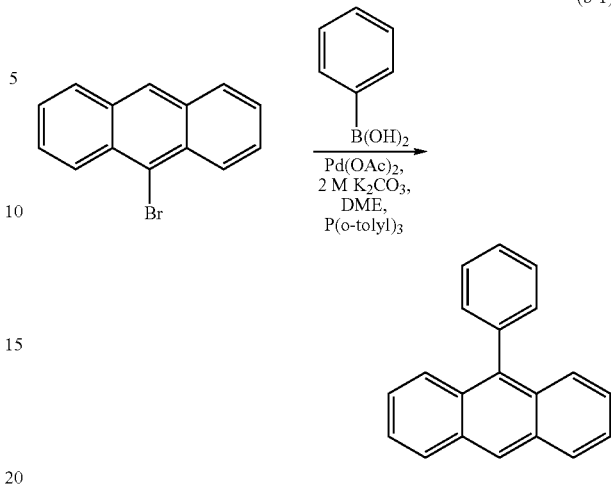

(2) Synthesis of 9-bromo-10-phenylanthracene 6.0 g (23.7 mmol) of 9-phenylanthracene was dissolved in 80 mL of carbon tetrachloride, and then, in the reaction solution thereof, a solution in which 3.80 g (21.1 mmol) of bromine was dissolved in 10 mL of carbon tetrachloride was dropped by a dropping funnel. After dropping, it was stirred for one hour at room temperature. After reaction, a sodium thiosulfate aqueous solution was added thereto and stirred. An organic layer was washed with a sodium hydroxide aqueous solution and saturated saline, and then dried with magnesium sulfate. After the mixture was subjected to natural filtration, the filtrate was concentrated and dissolved in toluene, and then filtration was carried out using florisil, celite, and alumina. When the filtrate was concentrated and then recrystallized with a mixed solution of dichloromethane and hexane, 7.0 g of 9-bromo-10-phenylanthracene that was a target substance was obtained as a light yellow solid at a yield of 89% (Synthesis scheme (b-2)).

(b-2)

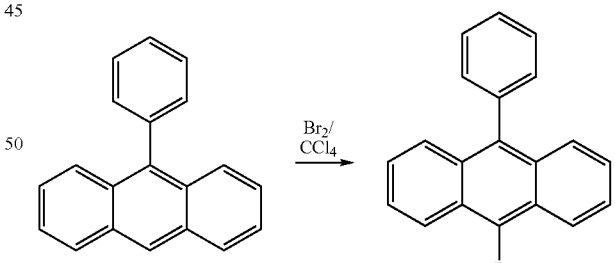

(3) Synthesis of 9-iodo-10-phenylanthracene 3.33 g (10 mmol) of 9-bromo-10-phenylanthracene was dissolved in 80 mL of tetrahydrofuran (abbreviation: THF), and cooled to −78° C. Then, in a reaction solution thereof, 7.5 mL (12.0 mmol) of n-butyllithium (abbreviation: n-BuLi) (1.6 mol/L hexane solution) was dropped by a dropping funnel and then stirred for one hour. A solution in which 5 g (20.0 mmol) of iodine dissolved in 20 mL of THF was dropped therein, and the further stirred for 2 hours at −78° C. After reaction, a sodium thiosulfate aqueous solution was added therein and stirred. An organic layer was washed with a sodium thiosulfate aqueous solution and saturated saline, and then dried with magnesium sulfate. The mixture was filtrated naturally, then the filtrate was concentrated, and then recrystallized with ethanol, 3.1 g of 9-iodo-10-phenylanthracene that was a target substance was obtained as a light yellow solid at a yield of 83% (Synthesis scheme (b-3)).

(b-3)

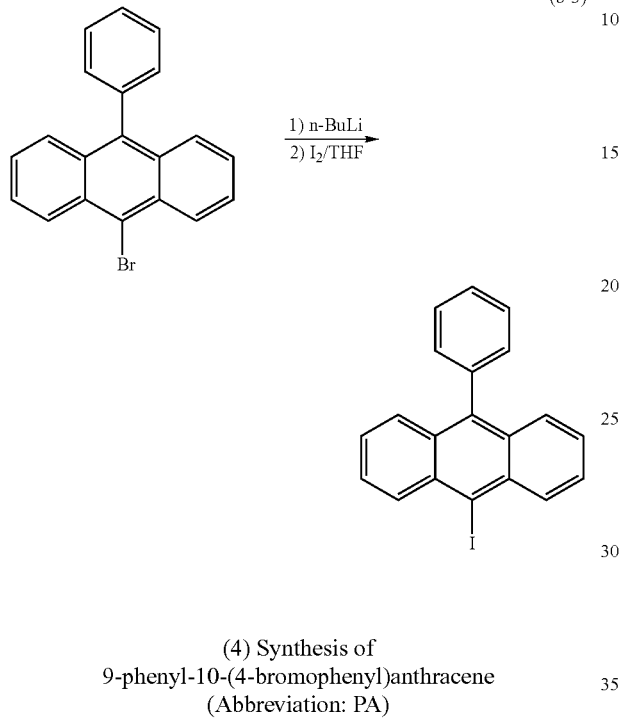

(4) Synthesis of 9-phenyl-10-(4-bromophenyl)anthracene (Abbreviation: PA)

A mixture of 1.0 g (2.63 mmol) of 9-iodo-10-phenylanthracene, 542 mg (2.70 mmol) of p-bromo phenylboronic acid, 46 mg (0.03 mmol) of tetrakis(triphenylphosphine)palladium(0) (abbreviation: Pd(PPh$_3$)$_4$), 3 mL (6 mmol) of potassium carbonate aqueous solution (2 mol/L), and 10 mL of toluene was stirred for nine hours at 80° C. After reaction, toluene was added and filtration was carried out using florisil, celite, and alumina. A filtrate was washed with water and saturated saline, and then dried with magnesium sulfate. After the mixture was subjected to natural filtration, the filtrate was concentrated, and when it was recrystallized with chloroform and hexane, 562 mg of 9-phenyl-10-(4-bromophenyl)anthracene that was a target substance is obtained as a light brown solid at a yield of 45% (Synthesis scheme (b-4)).

(b-4)

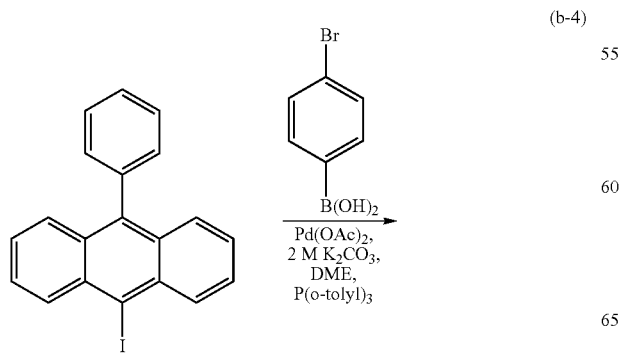

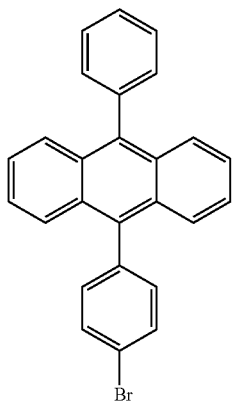

Step 2: Synthesis method of N,9-diphenyl-9H-carbazol-3-amine (Abbreviation: PCA)

(1) Synthesis of 3-bromo-9-phenylcarbazole

Firstly, 24.3 g (100 mmol) of N-phenylcarbazole was dissolved in 600 ml of glacial acetic acid, and 17.8 g (100 mmol) of N-bromo succinic acid imide was slowly added thereto. The mixture was stirred for about 12 hours at a room temperature. This glacial acetic acid solution was dropped in one litter of ice water while stirring them. A precipitated white solid was washed three times with water. This solid was dissolved in 150 ml of diethyl ether, and washed with a saturated sodium hydrogencarbonate solution and water. This organic layer was dried with magnesium sulfate, and filtered. The obtained filtrate was concentrated. The thus obtained residue was recrystallized with methanol to obtain 28.4 g (the yield: 88%) of 3-bromo-9-phenylcarbazole, which was a white powder (Synthesis scheme (c-1)).

(c-1)

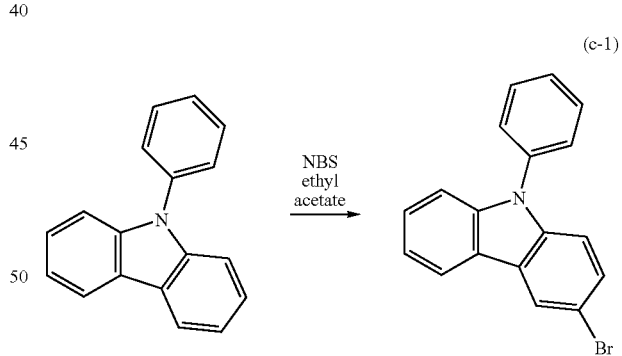

(2) N,9-diphenyl-9H-carbazol-3-amine (Abbreviation: PCA)

19 g (60 mmol) of 3-bromo-9-phenylcarbazole, 340 mg (0.6 mmol) of bis(dibenzylideneacetone)palladium(0) (abbreviation: Pd(dba)$_2$), 1.6 g (3.0 mmol) of 1,1-bis(diphenylphosphino)ferrocene (abbreviation: dppf), and 13 g (180 mmol) of tert-butoxysodium (abbreviation: t-BuONa) were put in a 500 mL three neck flask. After nitrogen was substituted for air in the flask, 110 mL of dehydrated xylene and 7.0 g (75 mmol) of aniline were added. This was stirred while being heated for 7.5 hours at 90° C. After the termination of the reaction, about 500 mL of hot toluene which was heated to 50° C. was added to a reaction solution and this reaction solution was filtered through florisil, alumina, and celite. The filtrate was concentrated. When the obtained solid was recrystallized with a mixture solution of hexane and ethyl acetate, 15 g of N,9-diphenyl-9H-carbazol-3-amine (abbreviation: PCA) that was a target substance and was cream-colored powder was obtained in a yield of 75% (Synthesis Scheme (c-2)).

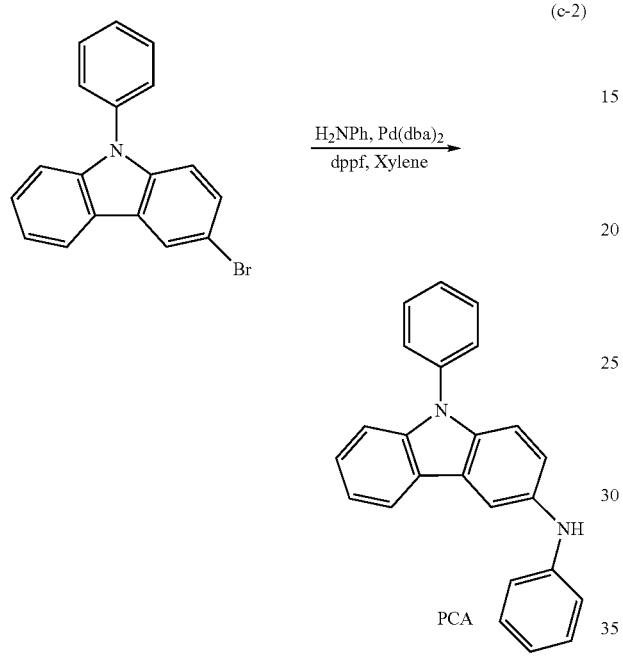

Figure 26A:
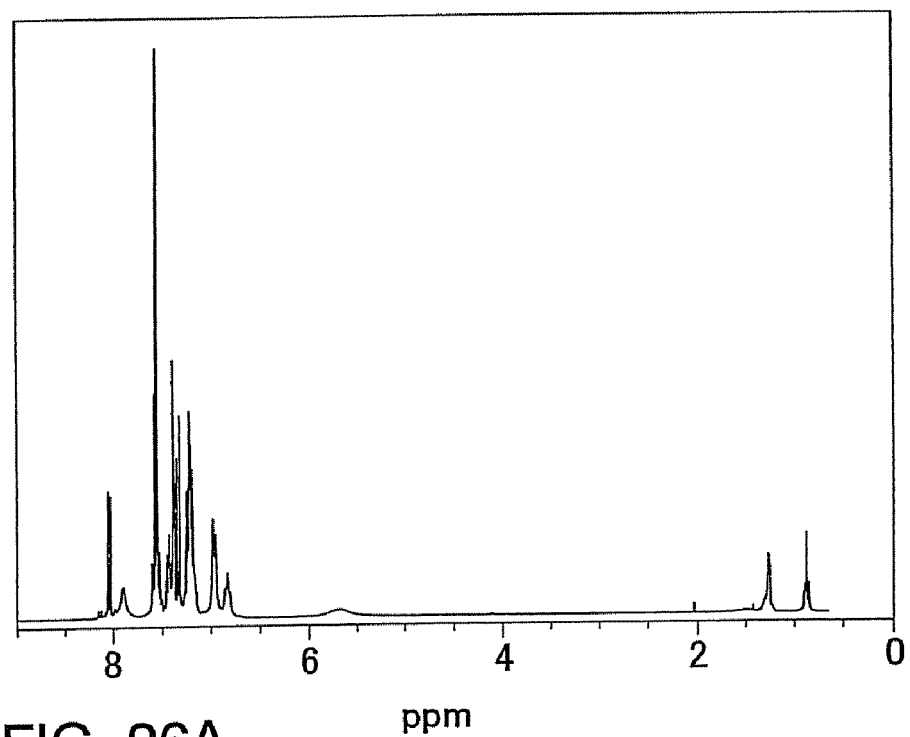
FIGS. 26A and 26B are graphs showing $^1$H-NMR chart of N,9-diphenyl-9H-carbazol-3-amine (abbreviation: PCA)
Figure 26B:
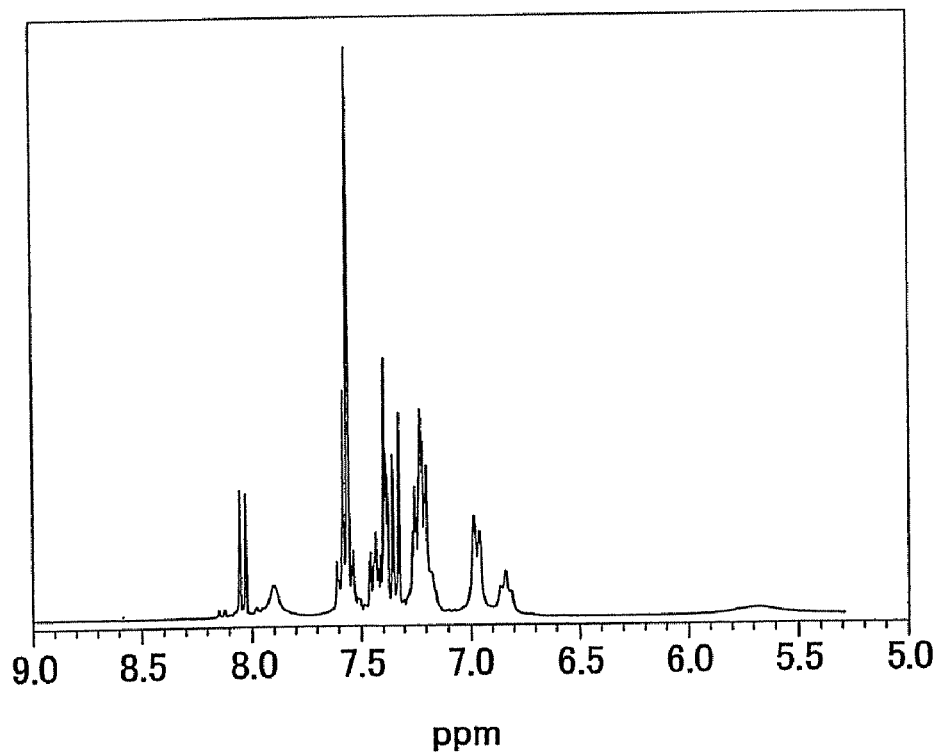

$^1$H-NMR in the case of using CDCl$_3$ for a heavy solvent of the obtained PCA is shown below. A $^1$H-NMR chart is shown in FIG. 26A, and FIG. 26B shows an enlarged chart of a portion of 5.0 to 9.0 ppm in FIG. 26A. $^1$H-NMR (300 MHz, CDCl$_3$): δ=6.84 (t, j=6.9, 1H), 6.97 (d, j=7.8, 2H), 7.20-7.61 (m, 13H), 7.90 (s, 1H), 8.04 (d, j=7.8, 1H).

Figure 27A:
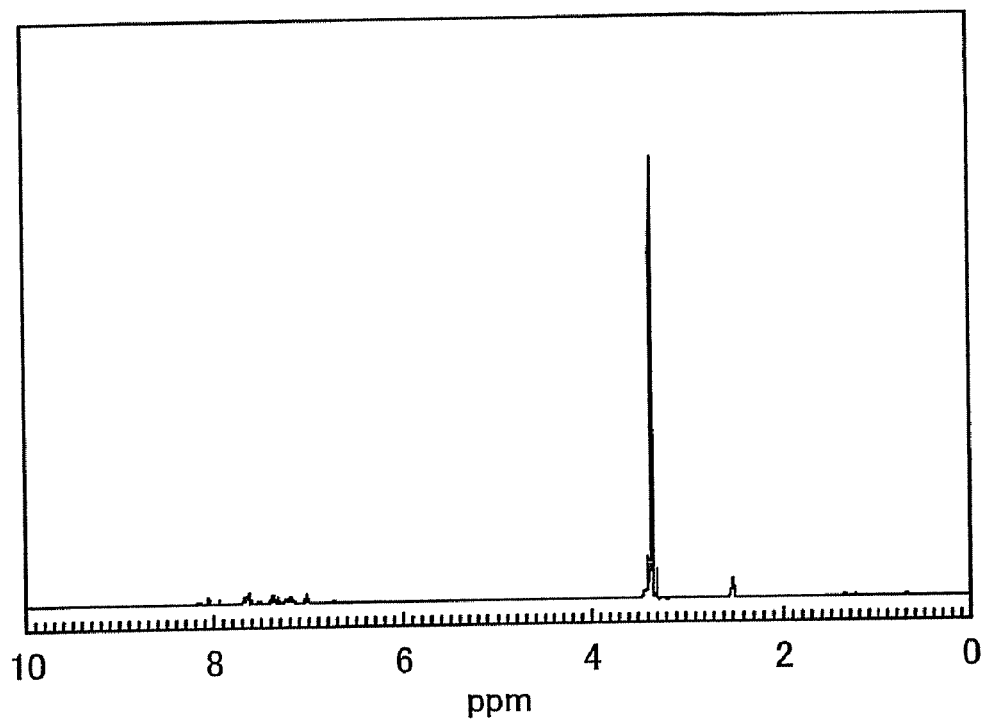
FIGS. 27A and 27B are graphs showing $^1$H-NMR chart of N,9-diphenyl-9H-carbazol-3-amine (abbreviation: PCA)
Figure 27B:
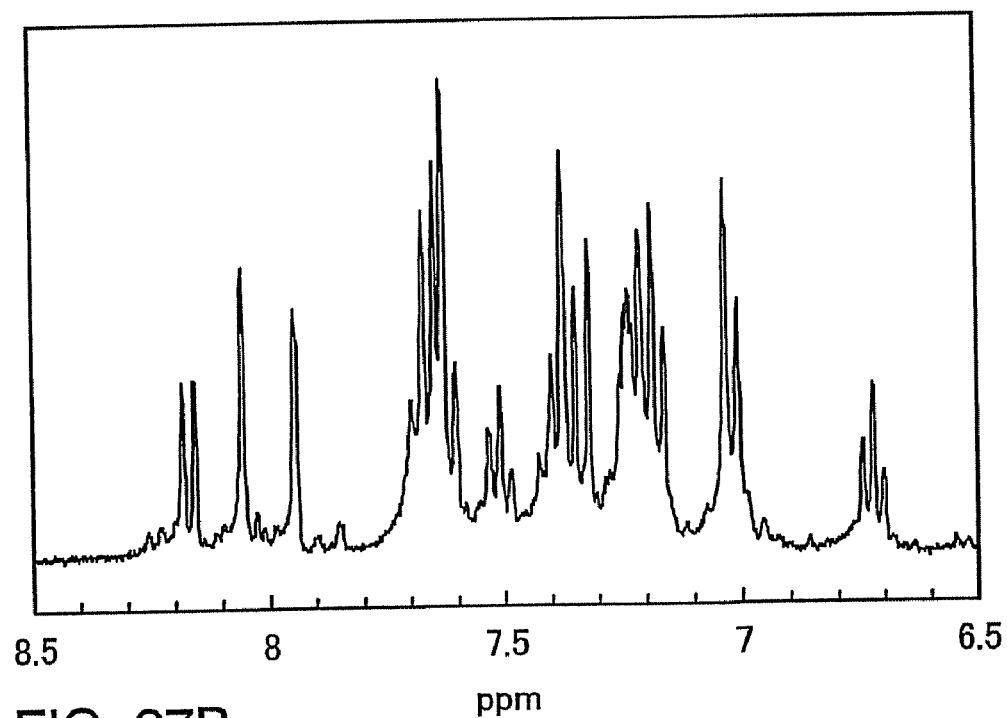

Next, $^1$H-NMR in the case of using DMSO for a heavy solvent of the obtained PCA is shown below. A $^1$H-NMR chart is shown in FIG. 27A and FIG. 27B shows an enlarged chart of a portion of 6.5 ppm to 8.5 ppm in FIG. 27A.

$^1$H-NMR (300 MHz, DMSO-d$_6$): δ=6.73 (t, j=7.5, 1H), 7.02 (d, j=8.1, 2H), 7.16-7.70 (m, 12H), 7.95 (s, 1H), 8.06 (s, 1H), 8.17 (d, J=7.8, 1H).

Figure 28A:
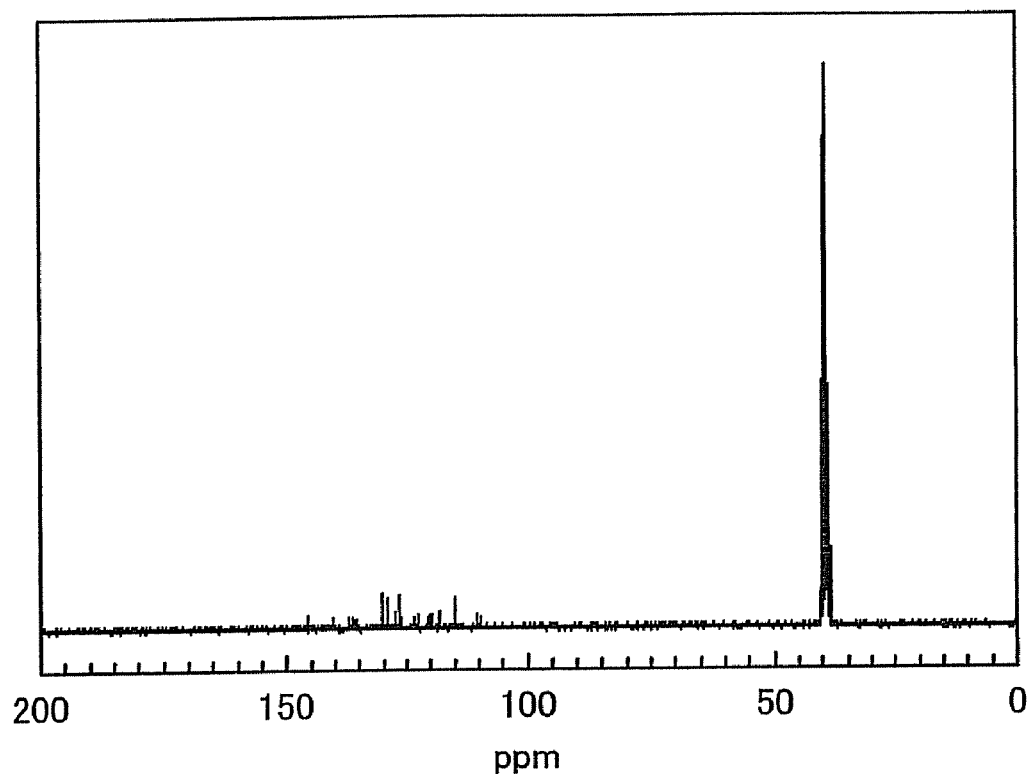
FIGS. 28A and 28B are graphs showing $^{13}$C-NMR chart of N,9-diphenyl-9H-carbazol-3-amine (abbreviation: PCA)
Figure 28B:
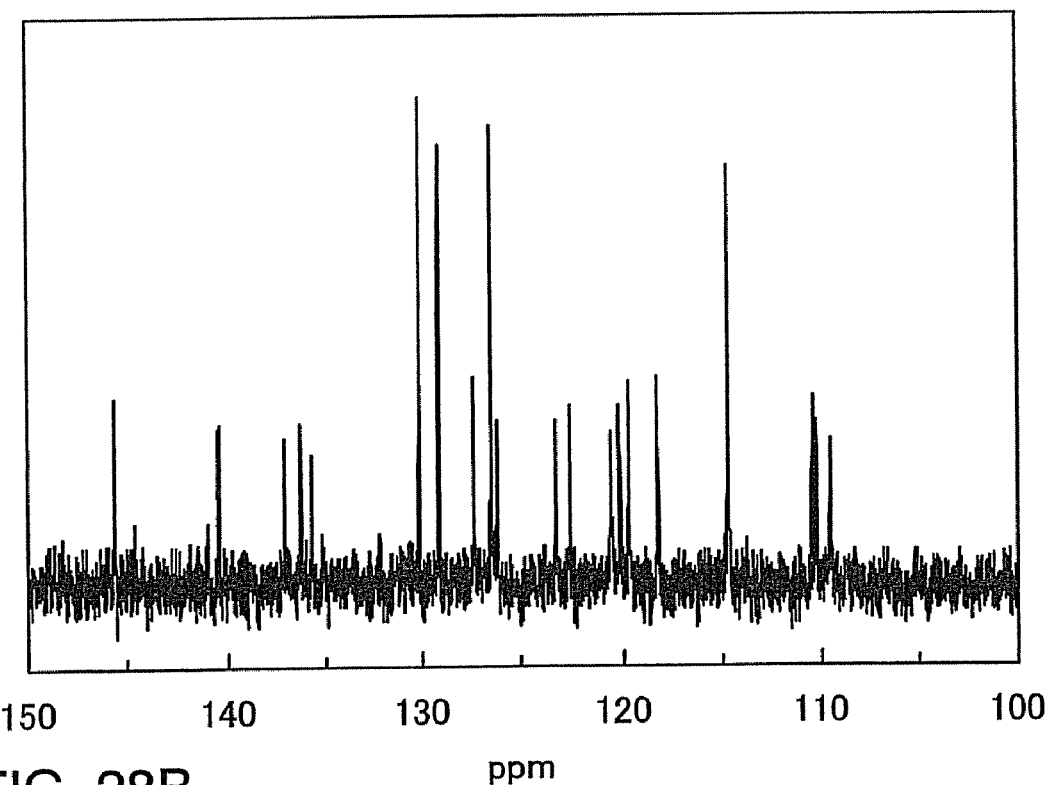

Next, $^{13}$C-NMR in the case of using DMSO for a heavy solvent of the obtained PCA is shown below. A $^{13}$C-NMR chart is shown in FIG. 28A and an enlarged chart of a portion of 100 to 150 ppm in FIG. 28A is shown in FIG. 28B.

$^{13}$C-NMR (75.5 MHz, DMSO-d$_6$): δ=109.55, 110.30, 110.49, 114.71, 118.22, 119.70, 120.14, 120.61, 122.58, 123.35, 126.18, 126.48, 127.37, 129.15, 130.14, 135.71, 136.27, 137.11, 140.41, 145.61

Step 3: Synthesis Method of N,9-diphenyl-N-[4-(10-phenyl-9-anthryl)phenyl]-9H-carbazol-3-amine (Abbreviation: PCAPA)

409 mg (1.0 mmol) of 9-phenyl-10-(4-bromophenyl)anthracene (PA), 339 mg (1.0 mmol) of N,9-diphenyl-9H-carbazol-3-amine (abbreviation: PCA), 6 mg (0.01 mmol) of Pd(dba)$_2$, 500 mg (5.2 mol) of tert-butoxysodium (abbreviation: t-BuONa), 0.1 mL of tri(tert-butyl)phosphine (10 wt % hexane solution) (abbreviation: P(tBu)$_3$), and 10 mL of toluene were put in a 100 mL three neck flask and stirred for four hours at 80° C. After reaction, a solution was washed with water, an aqueous layer was extracted with toluene, and it was washed together with the organic layer using saturated saline, and then dried with magnesium sulfate. An oily product obtained by filtering a mixture naturally and concentrating the filtrate was purified with silica gel column chromatography (hexane:toluene=7:3), and recrystallized using a mixture solution of dichloromethane and hexane to obtain 534 mg of a yellow powder-like solid that was a target substance in a yield of 81% (Synthesis Scheme (d-1)). When this compound was measured by a nuclear magnetic resonance (NMR) method, it was confirmed that the compound was N,9-diphenyl-N-[4-(10-phenyl-9-anthryl)phenyl]-9H-carbazol-3-amine (abbreviation: PCAPA).

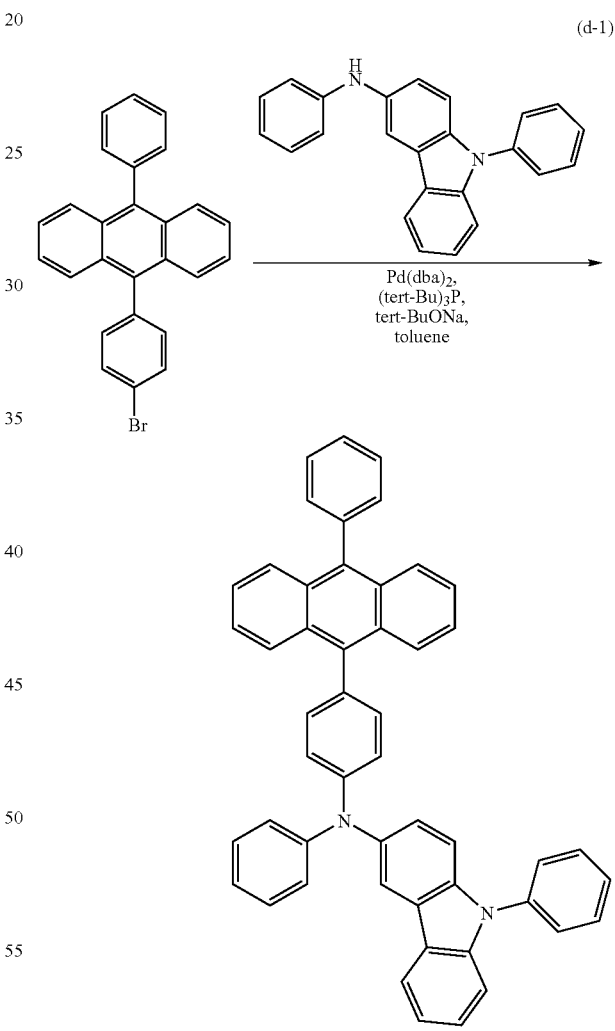

Figure 29A:
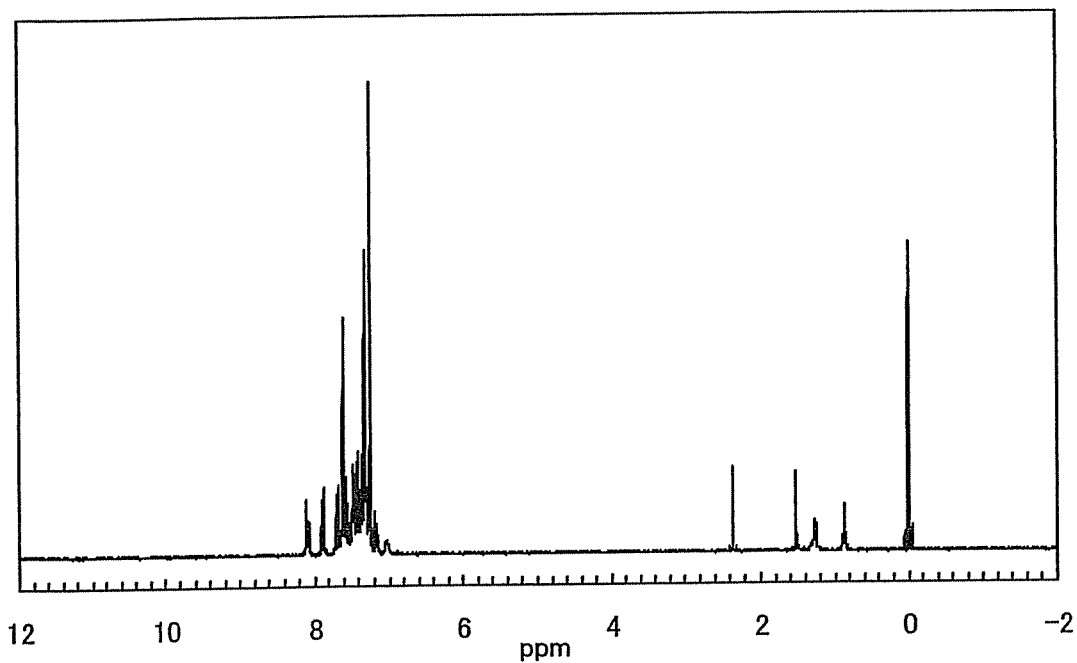
FIGS. 29A and 29B are graphs showing $^1$H-NMR chart of N,9-diphenyl-N-[4-(10-phenyl-9-anthryl)phenyl]-9H-carbazol-3-amine (abbreviation: PCAPA)
Figure 29B:
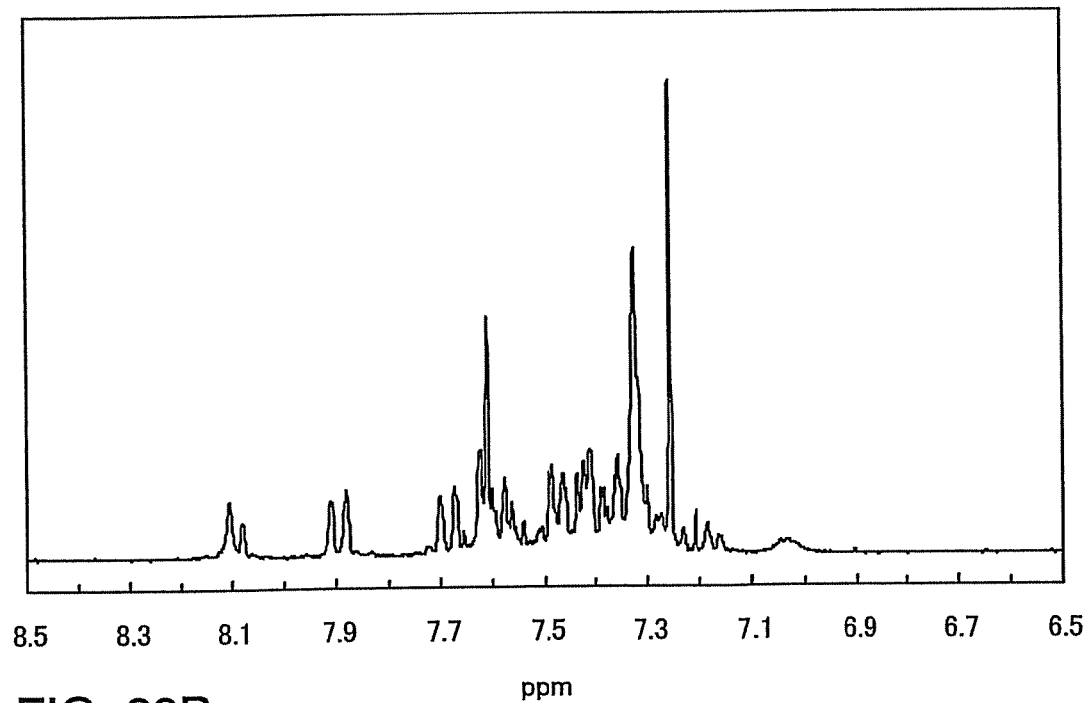

$^1$H-NMR of this compound is shown below. In addition, $^1$H-NMR charts are shown in FIGS. 29A and 29B. FIG. 29B is an enlarged chart of a portion of 6.5 to 8.5 ppm of FIG. 29A.
$^1$H-NMR (300 MHz, CDCl$^3$): δ=8.11-8.08 (m, 2H), 7.91-7.88 (m, 2H), 7.70-7.67 (m, 2H), 7.63-7.30 (m, 28H).

Figure 30:
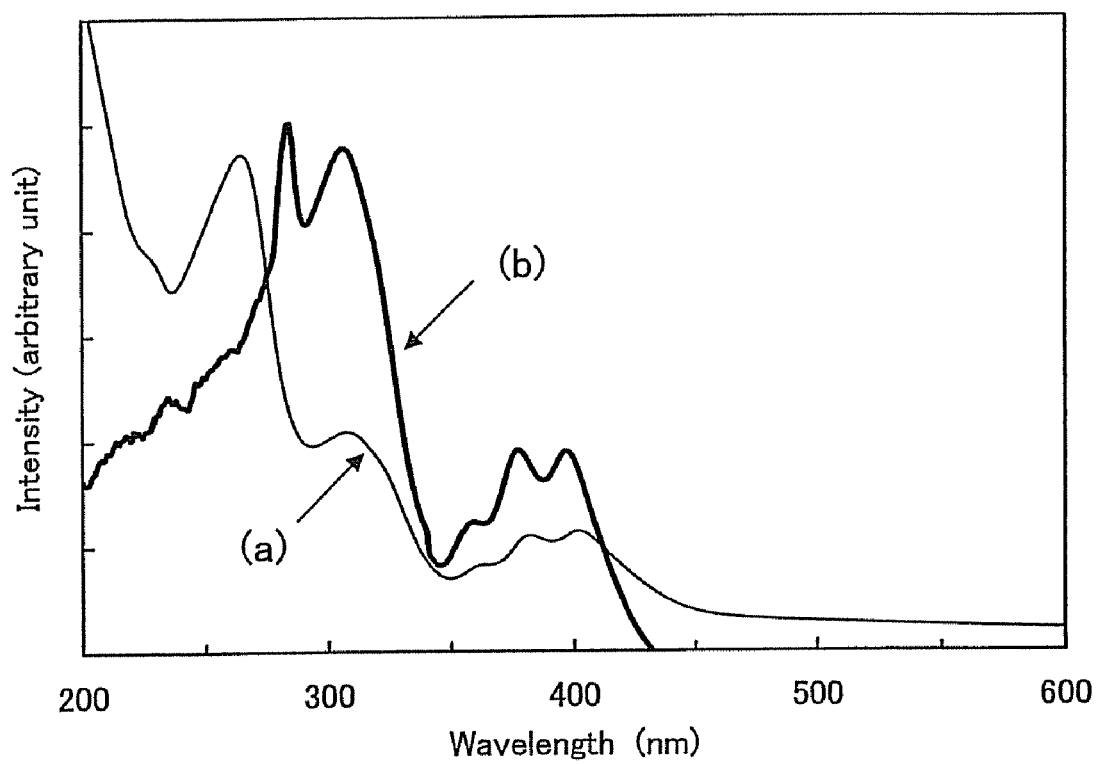
FIG. 30 is a graph showing absorption spectrum of N,9-diphenyl-N-[4-(10-phenyl-9-anthryl)phenyl]-9H-carbazol-3-amine (abbreviation PCAPA)

The absorption spectra of the PCAPA are shown in FIG. 30. The ultraviolet-visible spectrophotometer (V-550, manufactured by JASCO Corporation) was used for the measurement.

Figure 31:
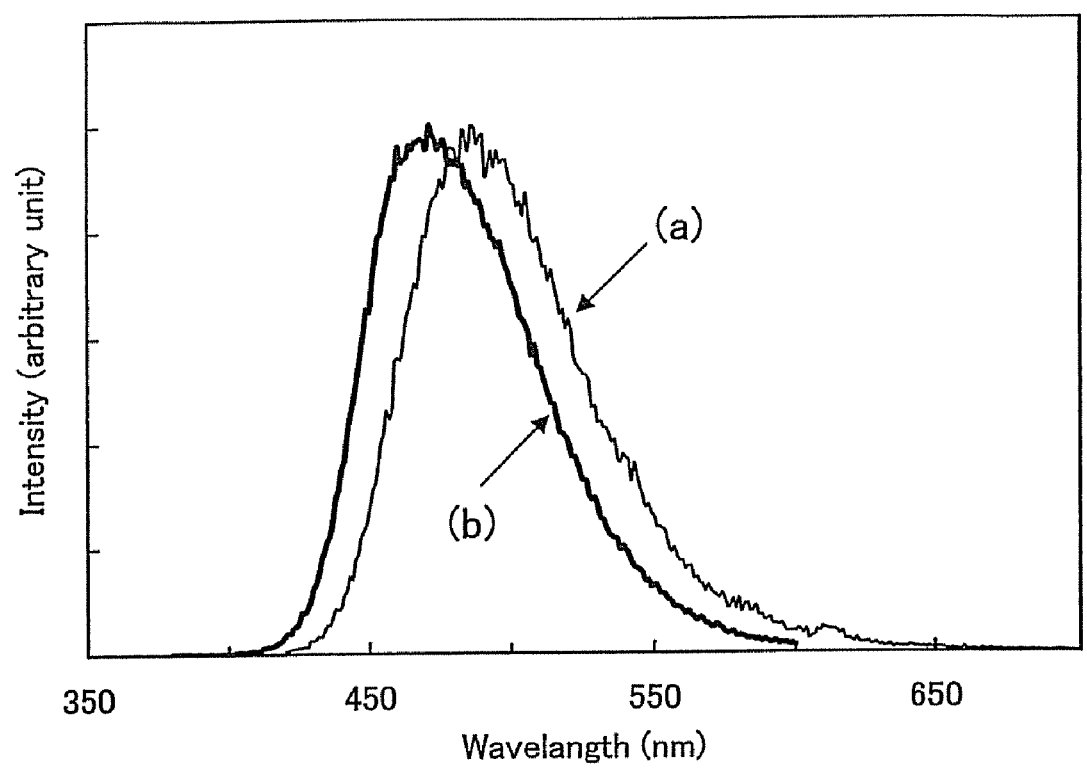
FIG. 31 is a graph showing emission spectrum of N,9-diphenyl-N-[4-(10-phenyl-9-anthryl)phenyl]-9H-carbazol-3-amine (abbreviation PCAPA)

In FIG. 30, the horizontal axis represents a wavelength (nm) and the vertical axis represents intensity (arbitrary unit). Further, in FIG. 30, the line (a) indicates the absorption spectrum in a state where the PCAPA is in a single film whereas the line (b) indicates the absorption spectrum in a state where the PCAPA is dissolved in a toluene solution. The light emission spectra of the PCAPA are shown in FIG. 31. In FIG. 31, the horizontal axis represents a wavelength (nm) and the vertical axis represents intensity (arbitrary unit). The line (a) indicates the light emission spectrum (an excited wavelength: 402 nm) in a state where the PCAPA is in a single film and the line (b) indicates the light emission spectrum (an excited wavelength: 370 nm) in a state where the PCAPA is dissolved in a toluene solution. It is found from FIG. 12 that light emission from the PCAPA has a peak at 486 nm in the single film state and has a peak at 471 nm in the dissolved state in the toluene solution. Moreover, the light emission was recognized as blue light. Thus, it is found that the PCAPA is suitable as a light-emitting substance exhibiting blue light particularly.

When a film was formed with the obtained PCAPA by an evaporation method and the ionization potential of the PCAPA in the thin film state was measured by using a photoelectron spectrometer (AC-2, manufactured by RIKEN KEIKI CO., LTD.), the ionization potential was 5.29 eV. This result showed that the HOMO level was −5.29 eV. The absorption spectrum of the PCAPA in the thin film state was measured by using an ultraviolet-visible spectrophotometer (V-550, manufactured by JASCO Corporation), and a wavelength of an absorption edge at a longer wavelength side of the absorption spectrum (the line (a) in FIG. 30) was set to be an energy gap (2.74 eV). Under these conditions, when the LUMO level was measured, it was −2.55 eV.

Further, when a decomposition temperature $T_d$ of the obtained PCAPA was measured by a thermo-gravimetric/differential thermal analyzer (TG/DTA 320, manufactured by Seiko Instruments Inc.), the $T_d$ was 402° C. or higher. Therefore, it was found that the PCAPA had a favorable heat resistant property.

In addition, an oxidation reductive reaction characteristic of the PCAPA was measured by cyclic voltammetry (CV) measurement. Further, an electrochemical analyzer (ALS model 600A, manufactured by BAS Inc.) was used for the measurement.

As for a solution used in the CV measurement, dehydrated dimethylformamide (DMF) (99.8%, catalogue number: 22705-6, manufactured by Sigma-Aldrich Corp.) was used as a solvent. Tetra-n-butylammonium perchlorate (n-Bu$_4$NClO$_4$) (Catalogue number: T0836, manufactured by Tokyo Chemical Industry Co., Ltd.), which was a supporting electrolyte, was dissolved in the solvent such that the concentration of the tetra-n-butylammonium perchlorate became 100 mmol/L. Moreover, the PCAPA, which was a target to be measured, was dissolved such that the concentration thereof was set to 1 mmol/L. Further, a platinum electrode (a PTE platinum electrode, manufactured by BAS Inc.) was used as a working electrode. A platinum electrode (a VC-3 Pt counter electrode (5 cm), manufactured by BAS Inc.) was used as a counter electrode. An Ag/Ag+ electrode (an RE5 nonaqueous solvent reference electrode, manufactured by BAS Inc.) was used as a reference electrode. The measurement was conducted at room temperature (20 to 25° C.).

The oxidative reaction characteristic was measured as follows. The scan in which the electric potential of the working electrode with respect to the reference electrode was changed from −0.27 V to 0.70 V, and then changed from 0.70 V to −0.27 V, which was one cycle. The oxidative reaction characteristic for 100 cycles was measured. Note that the scanning speed of the CV measurement was set to be 0.1 V/s.

The reductive reaction characteristic was measured as follows. The scan in which the electric potential of the working electrode with respect to the reference electrode was changed from −0.36 V to −2.60 V, and then changed from −2.60 V to −0.36 V, which was one cycle. The reductive reaction characteristic for 100 cycles was measured. Note that, the scanning speed of the CV measurement was set to be 0.1 V/s.

Figure 32A:
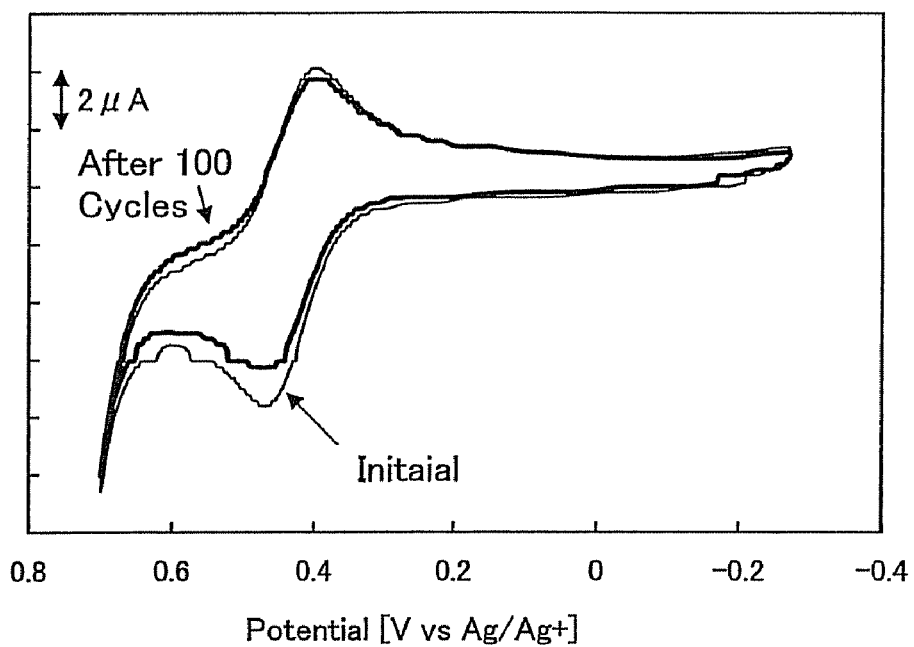
FIGS. 32A and 32B are graphs showing CV measurement result of N,9-diphenyl-N-[4-(10-phenyl-9-anthryl)phenyl]-9H-carbazol-3-amine (abbreviation PCAPA).
Figure 32B:
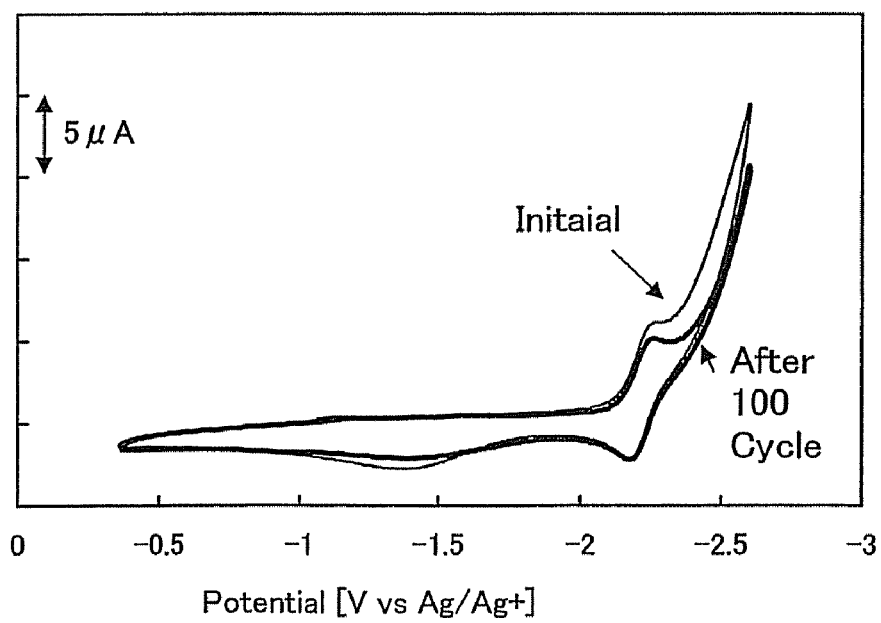

Results of measuring the oxidative reaction characteristic of the PCAPA are shown in FIG. 32A. Moreover, results of measuring the reductive reaction characteristic of the PCAPA are shown in FIG. 32B. In FIGS. 32A and 32B, the horizontal axis represents an electric potential (V) of the working electrode with respect to the reference electrode, while the vertical axis represents the amount of current flowing between the working electrode and the counter electrode ($1\times10^{-5}$ A).

It was found from FIG. 32A that an oxidation potential was 0.47 V (vs. Ag/Ag+ electrode). It was found from FIG. 32B that a reduction potential was −2.26 V (vs. Ag/Ag+ electrode). Although the scan was repeated for 100 cycles, a peak of a CV curve was clearly observed in each of the oxidative reaction and the reductive reaction. Thus, it is found that the anthracene derivative is a substance showing favorable reversibility with respect to an oxidation reductive reaction, and particularly shows excellent reversibility with respect to an oxidative reaction.

This application is based on Japanese Patent Application serial No. 2006-154077 filed on Jun. 1, 2006, and Japanese Patent Application serial No. 2007-012700 filed on Jan. 23, 2007 in Japan Patent Office, the entire contents of which are hereby incorporated by reference.

REFERENCE NUMERALS

101: substrate, 102: first electrode, 103: EL layer, 104: second electrode, 111: light-emitting layer, 112: hole-transporting layer, 113: electron-transporting layer, 121: first layer, 122: second layer, 131: region in the vicinity of an interface, 301: substrate, 302: first electrode, 303: EL layer, 304: second electrode, 311: light-emitting layer, 312: hole-transporting layer, 313: electron-transporting layer, 321: first layer, 322: second layer, 501: first electrode, 502: second electrode, 511: first light-emitting unit, 512: second light-emitting unit, 513: charge generation layer, 601: sources side driver circuit, 602: pixel portion, 603: gate side driver circuit, 604: sealing substrate, 605: sealing material, 607: space, 608: wire, 609: FPC (Flexible Printed Circuit), 610: element substrate, 611: switching TFT, 612: current control TFT, 613: first electrode, 614: insulator, 616: EL layer, 617: second electrode, 618: light-emitting element, 623: n-channel TFT, 624: p-channel TFT, 901: housing, 902: liquid crystal layer, 903: backlight, 904: housing, 905: driver IC, 906: terminal, 951: substrate, 952: electrode, 953: insulating layer, 954: partition layer, 955: EL layer, 956: electrode, 2001: housing, 2002: light source, 2101: glass substrate, 2102: first electrode, 2103: layer containing a composite material, 2104: hole-transporting layer, 2105: light-emitting layer, 2106: electron-transporting layer, 2107: electron-injecting layer, 2108: second electrode, 2121: first light-emitting layer, 2122: second light-emitting layer, 3001: illumination device, 3002: television device, 9101: housing, 9102: support, 9103: display portion, 9104: speaker portion, 9105: video input terminal, 9201: main body, 9202: housing, 9203: display portion, 9204: keyboard, 9205: external connection port, 9206: pointing device, 9401: main body, 9402: housing, 9403: display portion, 9404: audio input portion, 9405: audio output portion, 9406: operation key, 9407:

external connection port, 9408: antenna, 9501: main body, 9502: display portion, 9503: housing, 9504: external connection port, 9505: remote control receiving portion, 9506: image receiving portion, 9507: battery, 9508: audio input portion, 9509: operation key, 9510: eye piece portions.

The invention claimed is:

1. A light emitting element comprising:
a first electrode;
a first layer over the first electrode;
a second layer over and in contact with the first layer;
a first charge generation layer over the second layer;
a third layer over the first charge generation layer;
a fourth layer over and in contact with the third layer; and
a second electrode over the fourth layer,
wherein the first layer includes a first light-emitting organic compound and a first organic compound having a hole-transporting property,
wherein the second layer includes the first light-emitting organic compound and a second organic compound having an electron-transporting property,
wherein the third layer includes a second light-emitting organic compound and a third organic compound having a hole-transporting property,
wherein the fourth layer includes the second light-emitting organic compound and a fourth organic compound having an electron-transporting property,
wherein a difference between a highest occupied molecular orbital level of the first organic compound and a highest occupied molecular orbital level of the second organic compound is 0.3 eV or less,
wherein a difference between a lowest unoccupied molecular orbital level of the first organic compound and a lowest unoccupied molecular orbital level of the second organic compound is 0.3 eV or less,
wherein a difference between a highest occupied molecular orbital level of the third organic compound and a highest occupied molecular orbital level of the fourth organic compound is 0.3 eV or less, and
wherein a difference between a lowest unoccupied molecular orbital level of the third organic compound and a lowest unoccupied molecular orbital level of the fourth organic compound is 0.3 eV or less.

2. A light emitting element according to claim 1, wherein the light emitting element emits white light.

3. An illumination device comprising the light emitting element according to claim 1.

4. An illumination device according to claim 3, wherein the illumination device is one of a desk lamp, an illumination device in the room, and a backlight of a liquid crystal display device.

5. A light emitting element according to claim 1, further comprising:
a second charge generation layer over the fourth layer;
a fifth layer over the second charge generation layer; and
a sixth layer over and in contact with the fifth layer,
wherein the second electrode is over the sixth layer, and
wherein the fifth layer includes a third light-emitting organic compound and a fifth organic compound having a hole-transporting property, and
wherein the sixth layer includes the third light-emitting organic compound and a sixth organic compound having an electron-transporting property.

6. A light emitting element according to claim 5, wherein the light emitting element emits white light.

7. A light emitting element according to claim 5, wherein the light emitting element is applied to an illumination device.

8. A light emitting element according to claim 5, wherein the light emitting element is applied to one of a desk lamp, an illumination device in the room, and a backlight of a liquid crystal display device.

9. The light-emitting element according to claim 1,
wherein the first light-emitting organic compound and the first organic compound are mixed in the first layer,
wherein the first light-emitting organic compound and the second organic compound are mixed in the second layer,
wherein the second light-emitting organic compound and the third organic compound are mixed in the third layer, and
wherein the second light-emitting organic compound and the fourth organic compound are mixed in the fourth layer.

10. The light-emitting element according to claim 1, wherein the first organic compound, the second organic compound, the third organic compound, and the fourth organic compound comprise at least one of a tricyclic condensed aromatic compound, a tetracyclic condensed aromatic compound, a pentacyclic condensed aromatic compound, and a hexacyclic condensed aromatic compound.

11. The light-emitting element according to claim 1, wherein the first organic compound, the second organic compound, the third organic compound, and the fourth organic compound are anthracene derivatives.

12. A light emitting element comprising:
a glass substrate;
a first electrode over the glass substrate;
a first layer over the first electrode;
a second layer over and in contact with the first layer;
a first charge generation layer over the second layer;
a third layer over the first charge generation layer;
a fourth layer over and in contact with the third layer; and
a second electrode over the fourth layer,
wherein the first layer includes a first light-emitting organic compound and a first organic compound having a hole-transporting property,
wherein the second layer includes the first light-emitting organic compound and a second organic compound having an electron-transporting property,
wherein the third layer includes a second light-emitting organic compound and a third organic compound having a hole-transporting property,
wherein the fourth layer includes the second light-emitting organic compound and a fourth organic compound having an electron-transporting property,
wherein a difference between a highest occupied molecular orbital level of the first organic compound and a highest occupied molecular orbital level of the second organic compound is 0.3 eV or less,
wherein a difference between a lowest unoccupied molecular orbital level of the first organic compound and a lowest unoccupied molecular orbital level of the second organic compound is 0.3 eV or less,
wherein a difference between a highest occupied molecular orbital level of the third organic compound and a highest occupied molecular orbital level of the fourth organic compound is 0.3 eV or less, and
wherein a difference between a lowest unoccupied molecular orbital level of the third organic compound and a lowest unoccupied molecular orbital level of the fourth organic compound is 0.3 eV or less.

13. A light emitting element according to claim 12, wherein the light emitting element emits white light.

14. An illumination device comprising the light emitting element according to claim 12.

15. An illumination device according to claim 14, wherein the illumination device is one of a desk lamp, an illumination device in the room, and a backlight of a liquid crystal display device.

16. A light emitting element according to claim 12, further comprising:
a second charge generation layer over the fourth layer;
a fifth layer over the second charge generation layer; and
a sixth layer over and in contact with the fifth layer,
wherein the second electrode is over the sixth layer, and
wherein the fifth layer includes a third light-emitting organic compound and a fifth organic compound having a hole-transporting property, and
wherein the sixth layer includes the third light-emitting organic compound and a sixth organic compound having an electron-transporting property.

17. A light emitting element according to claim 16, wherein the light emitting element emits white light.

18. A light emitting element according to claim 16, wherein the light emitting element is applied to an illumination device.

19. A light emitting element according to claim 16, wherein the light emitting element is applied to one of a desk lamp, an illumination device in the room, and a backlight of a liquid crystal display device.

20. The light-emitting element according to claim 12,
wherein the first light-emitting organic compound and the first organic compound are mixed in the first layer,
wherein the first light-emitting organic compound and the second organic compound are mixed in the second layer,
wherein the second light-emitting organic compound and the third organic compound are mixed in the third layer, and
wherein the second light-emitting organic compound and the fourth organic compound are mixed in the fourth layer.

21. The light-emitting element according to claim 12, wherein the first organic compound, the second organic compound, the third organic compound, and the fourth organic compound comprise at least one of a tricyclic condensed aromatic compound, a tetracyclic condensed aromatic compound, a pentacyclic condensed aromatic compound, and a hexacyclic condensed aromatic compound.

22. The light-emitting element according to claim 12, wherein the first organic compound, the second organic compound, the third organic compound, and the fourth organic compound are anthracene derivatives.

* * * * *

UNITED STATES PATENT AND TRADEMARK OFFICE
CERTIFICATE OF CORRECTION

PATENT NO.        : 8,076,676 B2
APPLICATION NO.   : 12/686612
DATED             : December 13, 2011
INVENTOR(S)       : Nobuharu Ohsawa Page 1 of 1

It is certified that error appears in the above-identified patent and that said Letters Patent is hereby corrected as shown below:

Column 11, Lines 57–58; Change "(2-tent-butylanthracen-9,10-diyl)" to --(2-tert-butylanthracen-9,10-diyl)--.

Column 11, Lines 62–63; Change "[N,N',N'-triphenyl-1,4-phen ylenediamine]" to --[N,N',N'-triphenyl-1,4-phenylenediamine]--.

Column 15, Line 58–59; Change "(4-biphenyl)-l)" to --(4-biphenylyl)--.

Column 19, Line 37; Change "and, a driver circuit" to --and 603, a driver circuit--.

Claim 22, Column 44, Line 22; Change "comp ound" to --compound--.

Signed and Sealed this
Fifteenth Day of May, 2012

David J. Kappos
*Director of the United States Patent and Trademark Office*